(12) United States Patent
Iwai et al.

(10) Patent No.: US 8,299,664 B2
(45) Date of Patent: Oct. 30, 2012

(54) DRIVE APPARATUS AND SEMICONDUCTOR MODULE

(75) Inventors: Ayako Iwai, Chiryu (JP); Masashi Yamasaki, Obu (JP); Hideki Kabune, Nagoya (JP); Atsushi Furumoto, Nukata-gun (JP); Yoshimasa Kinpara, Toyohashi (JP)

(73) Assignees: Denso Corporation, Kariya (JP); Asmo Co., Ltd., Kosai (JP)

( * ) Notice: Subject to any disclaimer, the term of this patent is extended or adjusted under 35 U.S.C. 154(b) by 150 days.

(21) Appl. No.: 12/822,381

(22) Filed: Jun. 24, 2010

(65) Prior Publication Data
US 2010/0327677 A1 Dec. 30, 2010

(30) Foreign Application Priority Data

Jun. 24, 2009 (JP) ................................. 2009-149644
Jun. 24, 2009 (JP) ................................. 2009-149646

(51) Int. Cl.
*H02K 9/00* (2006.01)
*H02K 11/00* (2006.01)
(52) U.S. Cl. ............................. 310/64; 310/71; 310/68 D
(58) Field of Classification Search ................. 310/68 D, 310/68 R, 68 A, 71, DIG. 6; *H02K 11/00, H02K 11/02, 11/04*
See application file for complete search history.

(56) References Cited

U.S. PATENT DOCUMENTS

| | | | | |
|---|---|---|---|---|
| 5,729,063 A | * | 3/1998 | Adachi et al. | 310/68 D |
| 5,939,807 A | * | 8/1999 | Patyk et al. | 310/89 |
| 6,081,056 A | * | 6/2000 | Takagi et al. | 310/89 |
| 6,577,030 B2 | * | 6/2003 | Tominaga et al. | 310/68 B |
| 6,707,185 B2 | * | 3/2004 | Akutsu et al. | 310/71 |
| 7,021,418 B2 | * | 4/2006 | Tominaga et al. | 180/444 |
| 7,109,687 B2 | * | 9/2006 | Kashihara | 322/24 |
| 7,207,187 B2 | * | 4/2007 | Funahashi et al. | 62/228.4 |
| 2008/0007916 A1 | * | 1/2008 | Hogg et al. | 361/704 |
| 2008/0106160 A1 | * | 5/2008 | Yoshinari et al. | 310/68 D |

FOREIGN PATENT DOCUMENTS

| JP | 2005073373 A | * | 3/2005 |
| JP | 2007174874 A | * | 7/2007 |

OTHER PUBLICATIONS

JPO Machine Translation, JP 2007174874, Method of Manufacturing Motor Controller and Method of Manufacturing Motor, Jan. 27, 2012, http://dossier.ipdl.inpit.go.jp/text_trans.html.*
JPO Machine Translation, JP 2005073373, Power Conversion Apparatus, Jan. 27, 2012, http://dossier.ipdl.inpit.go.jp/text_trans.html.*
Dictionary.com, Definition of term "Embed", Jan. 26, 2012, http://dictionary.reference.com/.*

* cited by examiner

*Primary Examiner* — Quyen Leung
*Assistant Examiner* — Thomas Truong
(74) *Attorney, Agent, or Firm* — Nixon & Vanderhye, P.C.

(57) ABSTRACT

A special terminal may project from an encapsulation body of a semiconductor module and may be engaged with an engaging portion of a motor case to limit a positional deviation of the semiconductor module relative to the motor case. Additionally or alternatively, a module side engaging portion may be formed in the encapsulation body and may be engaged with a case side engaging portion to position the semiconductor module relative to the motor case.

51 Claims, 33 Drawing Sheets

DRIVE APPARATUS AND SEMICONDUCTOR MODULE

CROSS REFERENCE TO RELATED APPLICATION

This application is based on and incorporates herein by reference Japanese Patent Application No. 2009-149644 filed on Jun. 24, 2009 and Japanese Patent Application No. 2009-149646 filed on Jun. 24, 2009.

BACKGROUND OF THE INVENTION

1. Field of the Invention

The present invention relates to a drive apparatus and a semiconductor module.

2. Description of Related Art

A drive apparatus, which includes an electric motor to generate a torque, is known as a mechanism that assists a steering operation of a steering wheel of a vehicle. A brushless motor, which is rotated upon application of a three-phase alternating current, is often used as a drive power source of the drive apparatus. In the case where the brushless motor is used as the drive power source of the drive apparatus, it is necessary to generate alternating currents of different phases from a direct current output of a predetermined voltage (e.g., 12 V) to provide winding wire currents (i.e., electric currents) of different phases to winding wires of multiple phases (e.g., three phases), respectively. Therefore, in order to execute switching of the winding wire currents, an electronic circuit is required. In this instance, the electronic circuit includes semiconductor modules and a control circuit (e.g., a microcomputer). The semiconductor modules include semiconductor chips, respectively, which implement the switching function, and the control circuit controls operations of the semiconductor modules. For instance, Japanese Unexamined Patent Publication No. H10-234158A, Japanese Unexamined Patent Publication No. 10-322973A and Japanese Unexamined Patent Publication No. 2004-159454 (corresponding to US 2004/0090130A1) teach such a drive apparatus, in which the semiconductor modules are placed adjacent to the motor.

In the above drive apparatus, when the semiconductor modules are placed at predetermined locations, respectively, relative to a motor case, which receives the motor, the positions of the semiconductor modules may possibly be deviated at the time of manufacturing or after the manufacturing. Particularly, in a case where each of the semiconductor modules is placed upright (i.e., in its upright position) relative to the motor case, the semiconductor module may possibly be tilted or tumbled at the time of the manufacturing, thereby hindering a smooth workflow in subsequent manufacturing steps. In order to limit the positional deviation of the semiconductor module, a jig, which supports the semiconductor module, i.e., which positions the semiconductor module in place, may be used. However, in such a case manufacturing costs may possibly be disadvantageously increased.

SUMMARY OF THE INVENTION

The present invention addresses the above disadvantages.

According to the present invention, there is provided a drive apparatus, which includes an electric motor and at least one semiconductor module. The electric motor includes a motor case, a stator, a rotor, a shaft and at least one semiconductor module. The motor case is configured into a tubular form. The stator is placed radially inward of the motor case and has a plurality of winding wires wound at the stator to form a plurality of phases. The rotor is placed radially inward of the stator. The shaft is rotatable integrally with the rotor. Each semiconductor module includes a semiconductor chip, an encapsulation body and at least one special terminal. The semiconductor chip is adapted to switch an electric current, which flows through each corresponding one of the plurality of winding wires. The encapsulation body covers the semiconductor chip. The at least one special terminal is embedded in the encapsulation body. The motor case includes at least one engaging portion that corresponds to the at least one special terminal. The at least one special terminal projects from the encapsulation body and is engaged with the at least one engaging portion to limit a positional deviation of the semiconductor module relative to the motor case.

According to the present invention, there is provided a drive apparatus, which includes an electric motor and an electric circuit. The electric motor is rotated upon supplying an electric current to the electric motor and includes a motor case, a stator, a rotor, a shaft and at least one case side engaging portion. The motor case has a tubular body and a partition wall. The partition wall radially inwardly extends from one end part of the tubular body. The stator is placed radially inward of the tubular body and has a plurality of winding wires wound at the stator to form a plurality of phases. The rotor is placed radially inward of the stator. The shaft is rotatable integrally with the rotor. The at least one case side engaging portion is formed in the motor case The electronic circuit includes at least one semiconductor module, which controls the electric current supplied to the electric motor. Each semiconductor module includes a semiconductor chip, an encapsulation body and at least one module side engaging portion. The semiconductor chip is adapted to switch the electric current, which flows through each corresponding one of the plurality of winding wires. The encapsulation body covers the semiconductor chip. The at least one module side engaging portion is formed in the encapsulation body and is engaged with the at least one case side engaging portion to position the semiconductor module relative to the motor case. The at least one module side engaging portion may include at least one special terminal engaged with the at least one case side engaging portion. The at least one module side engaging portion may be formed integrally with the encapsulation body from, for example, a resin material or may be formed separately from the encapsulation body and may be joined to or fixed to the encapsulation body.

According to the present invention, there is provided a semiconductor module adapted to be installed to an electric motor. The electric motor includes a motor case, a stator, a rotor and a shaft. The motor case is configured into a tubular form. The stator is placed radially inward of the motor case and has a plurality of winding wires wound at the stator to form a plurality of phases. The rotor is placed radially inward of the stator. The shaft is rotatable integrally with the rotor. The semiconductor module includes a semiconductor chip, an encapsulation body and at least one special terminal. The semiconductor chip is adapted to switch an electric current, which flows through each corresponding one of the plurality of winding wires. The encapsulation body covers the semiconductor chip. The at least one special terminal is embedded in the encapsulation body. The at least one special terminal projects from the encapsulation body and is engageable with at least one engaging portion of the motor case to limit a positional deviation of the semiconductor module relative to the motor case.

According to the present invention, there is provided a semiconductor module adapted to be installed to an electronic circuit for driving an electric motor. The electric motor includes a motor case, a stator, a rotor, a shaft and at least one case side engaging portion. The motor case has a tubular body and a partition wall. The partition wall radially inwardly extends from one end part of the tubular body. The stator is placed radially inward of the tubular body and has a plurality of winding wires wound at the stator to form a plurality of phases. The rotor is placed radially inward of the stator. The shaft is rotatable integrally with the rotor. The at least one case side engaging portion is formed in the motor case. The semiconductor module controls the electric current supplied to the electric motor and includes a semiconductor chip, an encapsulation body and at least one module side engaging portion. The semiconductor chip is adapted to switch the electric current, which flows through each corresponding one of the plurality of winding wires. The encapsulation body covers the semiconductor chip. The at least one module side engaging portion is formed in the encapsulation body and is adapted to be engaged with the at least one case side engaging portion to position the semiconductor module relative to the motor case. The at least one module side engaging portion may include at least one special terminal engaged with the at least one case side engaging portion. The at least one module side engaging portion may be formed integrally with the encapsulation body from, for example, a resin material or may be formed separately from the encapsulation body and may be joined to or fixed to the encapsulation body.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

Figure 1:
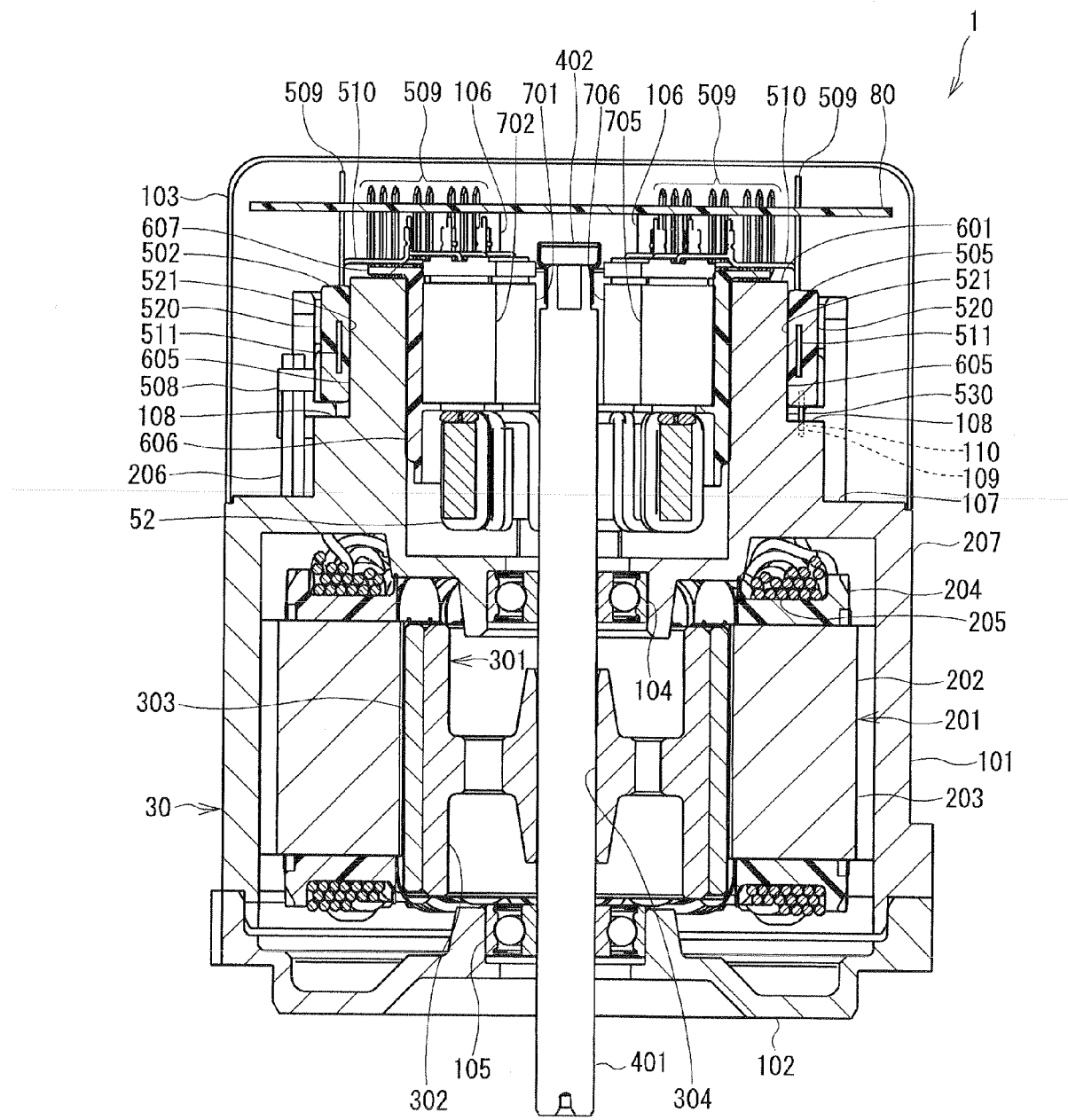
FIG. 1 is a cross-sectional view of a drive apparatus according to a first embodiment of the present invention.

Various embodiments of the present invention will be described with reference to the accompanying drawings. In the following embodiments, similar components will be indicated by the same reference numerals and will not be described redundantly for the sake of simplicity.

(First Embodiment)

A drive apparatus according to a first embodiment of the present invention is implemented as a drive apparatus for an electric power steering (EPS) system.

An electrical structure of the EPS system will be described with reference to FIG. 2.

The drive apparatus 1 includes an electric motor 30, a power unit 50 and a control unit 70. The drive apparatus 1 generates a rotational torque in a column shaft (serving as a rotatable shaft) 92 of a steering wheel 91 of a vehicle through a gear 93 installed to the column shaft 92 to assist a steering operation of a driver of the vehicle for steering the steering wheel 91. Specifically, when the steering wheel 91 is operated by the driver of the vehicle, a steering torque, which is generated on the column shaft 92 by this steering operation, is sensed with a torque sensor 94. Also, at the same time, vehicle speed information, which indicates a traveling speed of the vehicle, is obtained from an undepicted controller area network (CAN). The steering operation of the driver for steering the steering wheel 91 is assisted based on the obtained steering torque and the vehicle speed information. It should be understood that the above-described mechanism can assist not only the steering operation for steering the steering wheel 91 but can also assist an automatic control operation of the steering wheel 91 in various operations, such as a road lane maintaining operation for maintaining the vehicle on a predetermined road lane on a highway or a parking lot guiding operation for guiding the vehicle to a predetermined parking space in a parking lot.

The motor 30 is a brushless motor, which rotates the gear 93 in a forward rotational direction or a reverse rotational direction. The power unit 50 supplies the electric power (electric current) to the motor 30. The power unit 50 includes a choke coil 52, a shunt resistor 53 and an inverter 60, which are placed in an electric power line extending from an electric power source 51.

The inverter 60 includes seven metal-oxide-semiconductor field-effect transistors (MOSFETs) 61-67. The MOSFETs 61-67 serve as switching devices. Specifically, a flow of an electric current between a source and a drain of each MOSFET 61-67 is enabled (ON) or disabled (OFF) depending on an electric potential at a gate of the MOSFET 61-67.

Hereinafter, the MOSFETs 61-67 will be simply referred to as FETs 61-67 for the sake of simplicity. The FET 67, which is closest to the shunt resistor 53 among the FETs 61-67, is provided for reverse current flow protection. Specifically, when terminals of the electric power source are erroneously reversely connected by, for example, a human error, the FET 67 limits the reverse flow of the electric current.

Now, connections of the remaining six FETs 61-66 will be described.

The drains of the three FETs 61-63 are connected to the electric power line. The sources of the FETs 61-63 are connected to the drains of the remaining three FETs 64-66. The sources of these FETs 64-66 are grounded. Furthermore, the gates of the six FETs 61-66 are connected to six output terminals of a pre-driver 71, which will be described later in detail. With reference to FIG. 2, each of a connection between the upper FET 61 and the lower FET 64, a connection between the upper FET 62 and the lower FET 65 and a connection between the upper FET 63 and the lower FET 66 is connected to a corresponding one of a U-phase coil, a V-phase coil and a W-phase coil of the motor 30.

When it is necessary to distinguish the individual FETs 61-66, these FETs 61-66 will be indicated by an FET (Su+) 61, an FET (Sv+) 62, an FET (Sw+) 63, an FET (Su−) 64, an FET (Sv−) 65 and an FET (SW−) 66, respectively.

An aluminum electrolytic capacitor 54 is connected in parallel between the electric power source line of the FET (Su+) 61 and the ground line of the FET (Su−) 64. Similarly, an aluminum electrolytic capacitor 55 is connected in parallel between the electric power source line of the FET (Sv+) 62 and the ground line of the FET (Sv−) 65. Also, an aluminum electrolytic capacitor 56 is connected in parallel between the electric power source line of the FET (Sw+) 63 and the ground line of the FET (Sw−) 66. Hereinafter, the aluminum electrolytic capacitor will be simply referred to as a capacitor.

The control unit 70 includes the pre-driver 71, a custom integrated circuit (IC) 72, a position sensor 73 and a microcomputer 74. The custom IC 72 includes a regulator 75, a position sensor signal amplifier 76 and a sensed voltage amplifier 77 as functional blocks.

The regulator 75 is a stabilizing circuit, which stabilizes the electric power supply from the electric power source. This regulator 75 stabilizes the electric power supply that is supplied to each corresponding component. For instance, the electric power supply to the microcomputer 74 is stabilized by the regulator 75, so that the microcomputer 74 is operated with a stable predetermined power source voltage (e.g., 5V).

A signal, which is outputted from the position sensor 73, is supplied to the position sensor signal amplifier 76. As described below in detail, the position sensor 73 is provided in the motor 30 and outputs a rotational position signal indicating a rotational position of the rotor 30. The position sensor signal amplifier 76 amplifies this rotational position signal and outputs it to the microcomputer 74.

The sensed voltage amplifier 77 senses the voltage between ends of the shunt resistor 53 provided in the power unit 50. Then, the sensed voltage amplifier 77 amplifies the sensed voltage and outputs it to the microcomputer 74.

Therefore, the microcomputer 74 receives the rotational position signal of the motor 30 and the voltage between the ends of the shunt resistor 53. The microcomputer 74 also receives a steering torque signal from the torque sensor 94, which is installed to the column shaft 92. Furthermore, the microcomputer 74 receives the vehicle speed information through the CAN.

In this way, when the microcomputer 74 receives the steering torque signal and the vehicle speed information, the microcomputer 74 drives the inverter 60 through the pre-driver 71 according to the rotational position signal to assist the steering operation for steering the steering wheel 91. The inverter 60 is controlled by turning on or off of each corresponding one of the FETs 61-55 through the pre-driver 71. Specifically, the gates of the six FETs 61-66 are connected to the six output terminals of the pre-driver 71, as discussed above. Therefore, the pre-driver 71 changes the electrical potential of each corresponding one of the gates of the FETs 61-66.

Furthermore, the microcomputer 74 controls the inverter 60 based on the end-to-end voltage of the shunt resistor 53 (i.e., the voltage across the shunt resistor 53) received from the sensed voltage amplifier 77 such that the electric current supplied to the motor 30 exhibits a sine wave.

At the time of controlling the inverter 60, the choke coil 52 reduces noises of the electric power source 51. Furthermore, the capacitors 54-56 are adapted to store an electric charge to assist the electric power supply to the FETs 61-66 and/or to limit the noise components of, for example, surge voltage. Since the FET 67 is provided for the purpose of the reverse current flow protection, the capacitors 54-56 are not damaged even when the electric power source is erroneously connected.

As discussed above, the power unit 50 and the control unit 70 are required for the drive control operation of the motor 30. In the present embodiment, the power unit 50 and the control unit 70 are constructed as an electronic control unit (ECU).

The output of the motor 30 of the EPS is in a range of about 200 W to 500 W. A physical volume, which is occupied by the power unit 50 and the control unit 70 in the drive apparatus 1, is in a range of about 20% to 40% of the entire volume of the drive apparatus 1. Furthermore, since the output of the motor 30 is large, the size of the power unit 50 tends to be increased. Therefore, the power unit 50 occupies 70% or more of the physical volume, which is occupied by the power unit 50 and the control unit 70.

The choke coil 52, the capacitors 54-56 and semiconductor modules of the FETs 61-67 are relatively large components of the power unit 50.

In the present embodiment, the FET 67 for the reverse current flow protection, the FET (Su+) 61 and the FET (Su−) 64 are formed as a semiconductor chip, which is resin molded together to form one semiconductor module.

The FET (Sv+) 62 and the FET (Sv−) 65 are formed as a semiconductor chip, which is resin molded together to form one semiconductor module. The FET (Sw+) 63 and the FET (Sw−) 66 are formed as a semiconductor chip, which is resin molded together to form one semiconductor module.

Figure 2:
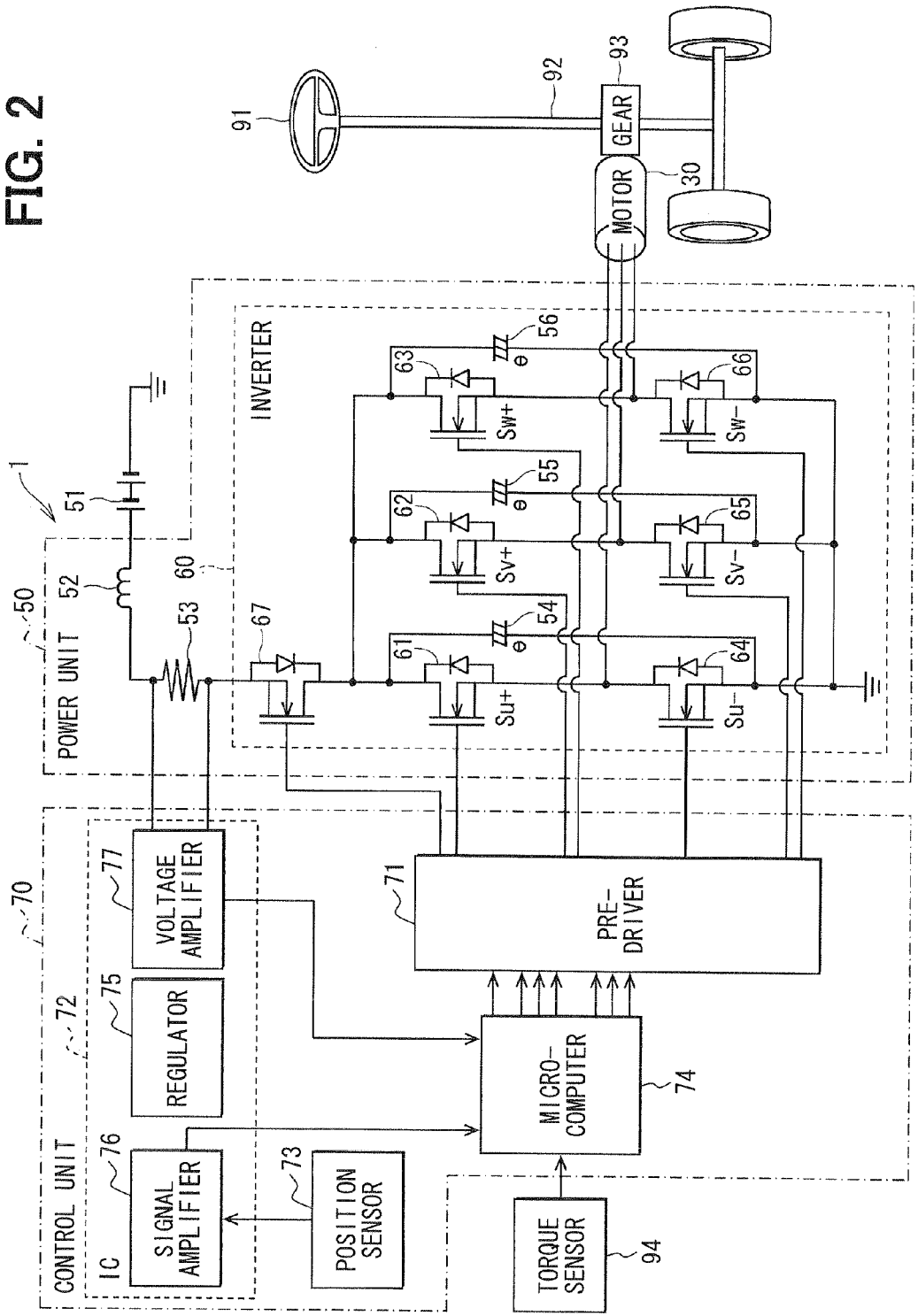
FIG. 2 is a schematic diagram showing a structure of an electric power steering system of the first embodiment.

That is, the inverter 60 of FIG. 2 includes the three semiconductor modules. In the present embodiment, the inverter 60 of FIG. 2 is one of two sets of the inverters 60 provided in the power unit 50 of the drive apparatus 1. By providing the two sets of the inverters 60, the electric current, which flows in each inverter 60, is reduced to one half. Since the two sets of the inverters 60 are provided in the power unit 50, the power unit 50 includes the total of six semiconductor modules and six capacitors.

Figure 3:
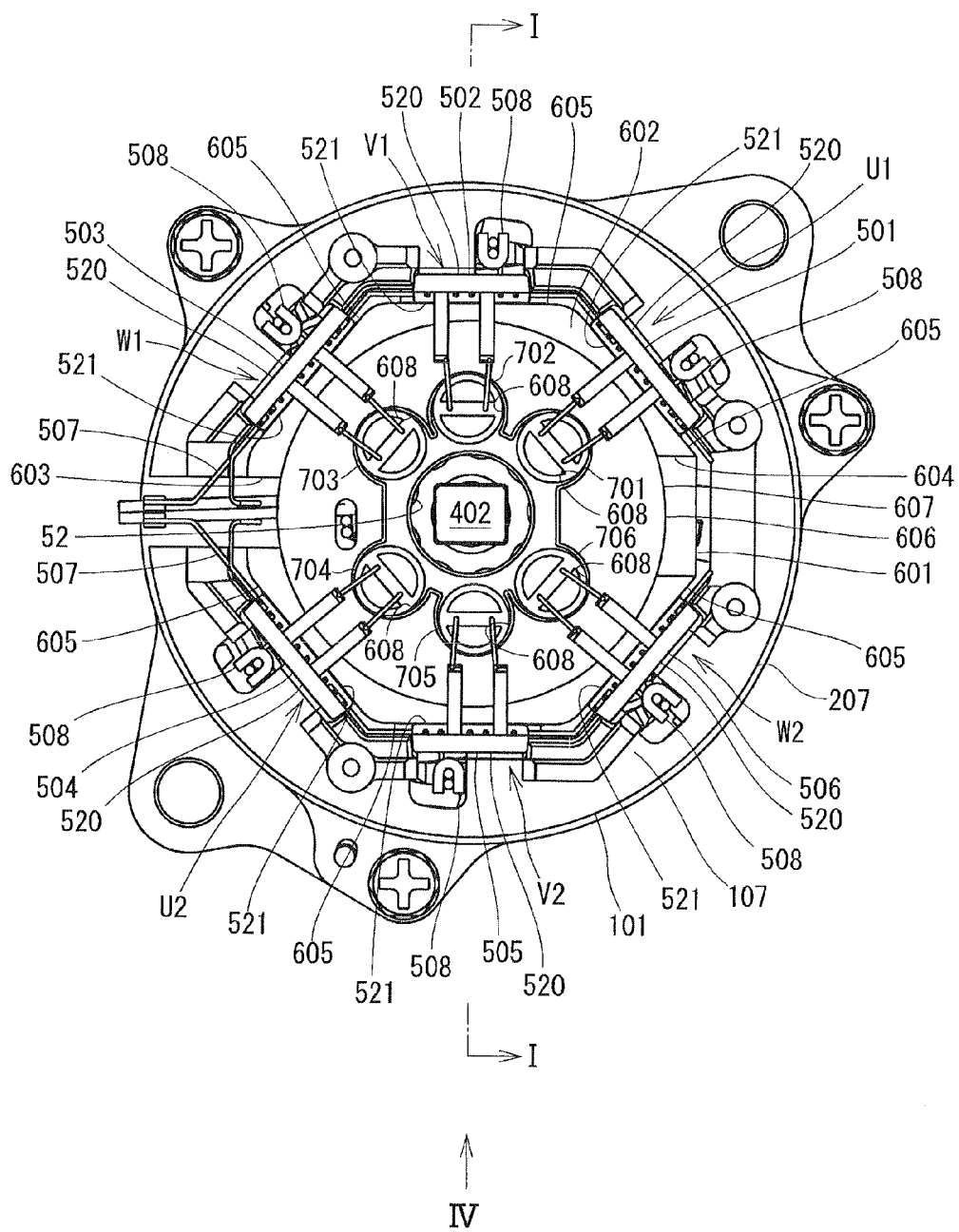
FIG. 3 is a plan view of the drive apparatus according to the first embodiment.
Figure 4:
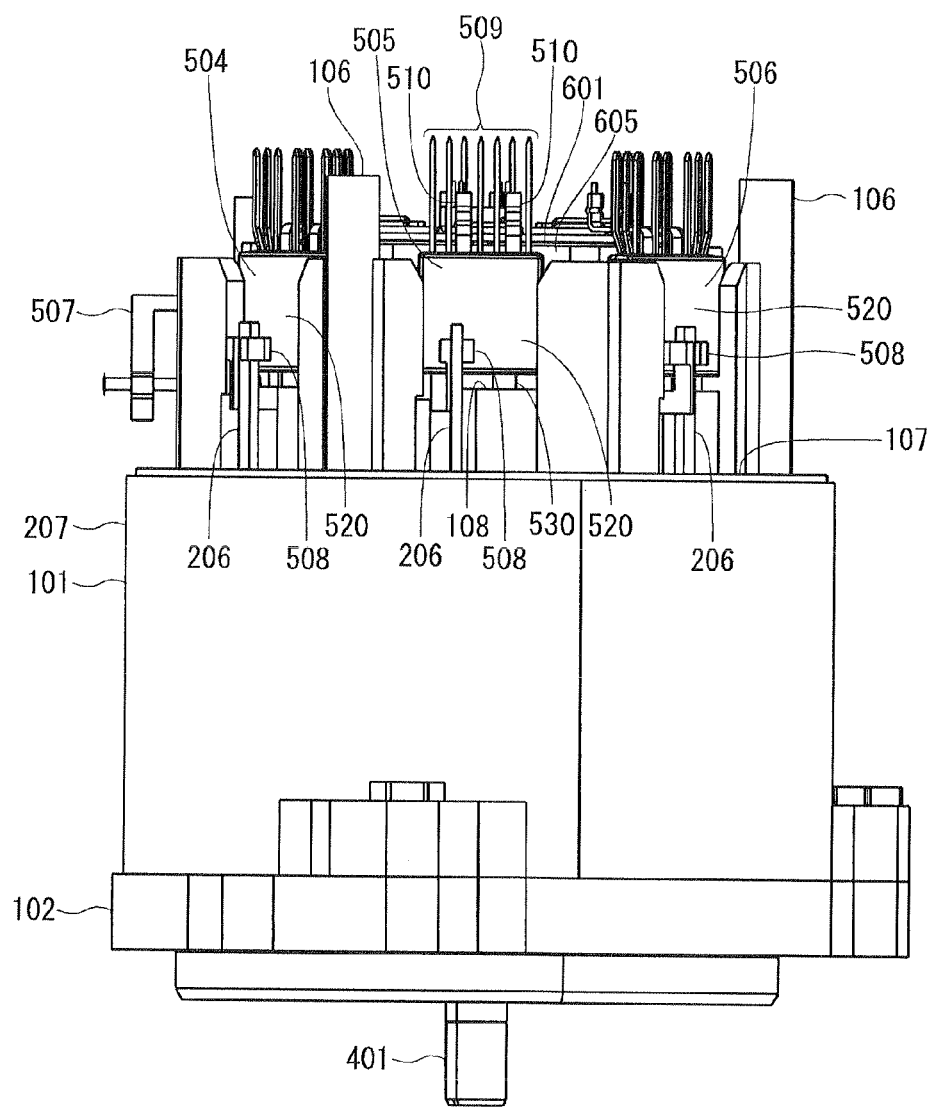
FIG. 4 is a side view of the drive apparatus according to the first embodiment.
Figure 5:
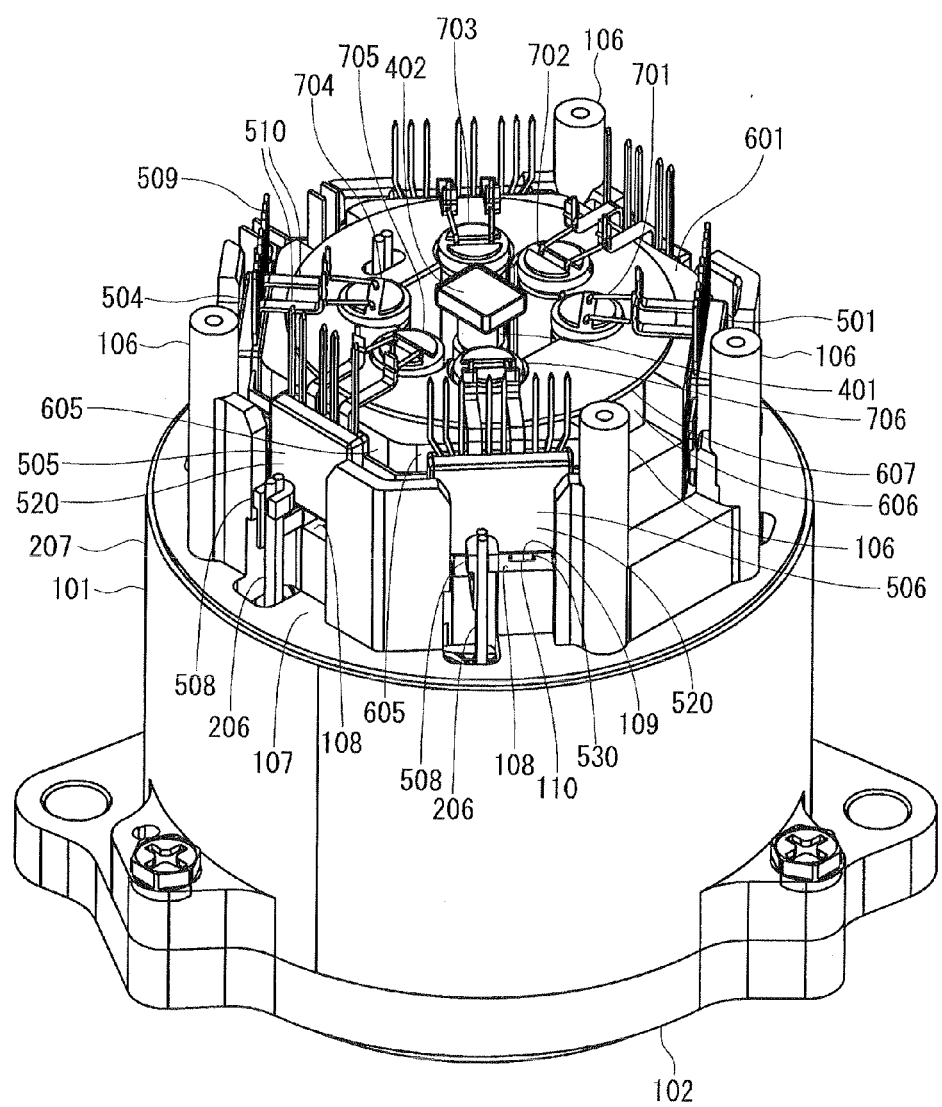
FIG. 5 is a perspective view of the drive apparatus according to the first embodiment.

Next, the physical structure of the drive apparatus 1 of the present embodiment will be described with reference to FIGS. 1 and 3 to 6. Here, FIG. 1 is a cross-sectional view taken along line I-I in FIG. 3, and FIG. 4 is a side view taken from a direction of IV in FIG. 3.

First of all, the structure of the drive apparatus 1 will be described with reference to FIG. 1.

The drive apparatus 1 includes a motor case 101, a frame end 102 and a cover 103. The motor case 101 is configured into a generally cylindrical form, and one end of motor case 101 is closed with a partition wall 107. The frame end 102 closes an opposite end of the motor case 101, which is opposite from the partition wall 107. In the present embodiment, the electronic circuit (specifically, the power unit 50 and the control unit 70) are provided on one axial side of the partition wall 107, which is opposite from the frame end 102. The cover 103 is installed to the motor case 101 such that the cover 103 covers this electronic circuit.

The motor 30 includes the motor case 101, a stator 201, a rotor 301 and a shaft 401. The stator 201 is placed radially inward of the motor case 101. The rotor 301 is placed radially inward of the stator 201. The shaft 401 is rotatable together with the rotor 301. Here, the partition wall 107 partitions between a driving area and a controlling area. In the driving area, the components, such as the rotor 301, are placed. In the controlling area, the components, such as the electronic circuit, for the motor control operation are placed.

The stator 201 (more specifically, a core of the stator 201) includes twelve salient poles 202, which radially inwardly project in the radial direction of the motor case 101. The salient poles 202 are arranged one after another at predetermined intervals in the circumferential direction of the motor case 101. The salient pole 202 includes a laminated core 203 and an insulator 204. The laminated core 203 is made by stacking thin magnetic plates one after another in the axial direction. The insulator 204 is axially fitted to the laminated core 203. Each of a plurality of coil wires (serving as winding wires) 205 is wound around each corresponding one of the salient poles 202 around the insulator 204. The coil wires 205 form the winding wires of three phases, i.e., the U-phase, the V-phase and the W-phase. Terminal lines 206 of the coil wires 205, through which the electric current is supplied to the coil wires 205, are pulled out at six locations and are guided to the electronic circuit side through six holes provided in an axial end portion of the motor case 101.

The rotor 301 is configured into a cylindrical form and is made from a magnetic material, such as iron. The rotor 301 includes a rotor core 302 and permanent magnets 303. The permanent magnets 303 are fixed to an outer peripheral surface of the rotor core 302 and are arranged one after another in the circumferential direction. The permanent magnets 303 form N-poles and S-poles, which are alternately arranged in the circumferential direction.

The shaft 401 is inserted into and fixed to a shaft hole 304 of the rotor core 302, which extends along a central axis of the rotor core 302. The shaft 401 is rotatably supported by a bearing 104, which is secured to the partition wall 107 of the motor case 101, and a bearing 105, which is secured to the frame end 102. In this way, the shaft 401 is rotatable together with the rotor 301 relative to the stator 201. Furthermore, the shaft 401 extends toward the electronic circuit (the controlling area side). A permanent magnet 402 is fixed to an electronic circuit side distal end part of the shaft 401 and is used to sense the rotational position of the shaft 401. A printed circuit board 80, which is made of resin, is placed at a location adjacent to the electronic circuit side end part of the shaft 401. The printed circuit board 80 has the position sensor 73 (not shown in FIG. 1) at a center area of the printed circuit board 80 around the magnet 402. In this way, the rotational position of the magnet 402, i.e., the rotational position of the shaft 401 is sensed with the position sensor 73.

Next, the physical structure of the electronic circuit will be described with reference to FIGS. 3 to 6. In FIGS. 3 to 6, the cover 103 and the printed circuit board 80 shown in FIG. 1 are eliminated for ease of understanding.

Here, the structure of the power unit 50 will be described first, and then the structure of the control unit 70 will be described.

As discussed above, the seven FETs 61-67, which form the inverter 60 of the power unit 50, are manufactured as the three semiconductor modules. Also, as discussed above, since the drive apparatus 1 includes the two sets of the inverters 60, there are provided the six semiconductor modules.

Specifically, as shown in FIG. 3, the drive apparatus 1 includes the six semiconductor modules 501-506. When it is necessary to distinguish the individual semiconductor modules 501-506, these semiconductor modules 501-506 will be indicated as a U1 semiconductor module 501, a V1 semiconductor module 502, a W1 semiconductor module 503, a U2 semiconductor module 504, a V2 semiconductor module 505 and a W2 semiconductor module 506, respectively.

With respect to the structure of FIG. 2, the U1 semiconductor module 501 includes the FETS 61, 64 of the U-phase and the FET 67 for the reverse current flow protection. Furthermore, the V1 semiconductor module 502 includes the FETs 62, 65 of the V-phase. The W1 semiconductor module includes the FETs 63, 66 of the W-phase. Similarly, the U2 semiconductor module 504 includes the FETs 61, 64 of the U-phase and the FET 67 for the reverse current flow protection. The V2 semiconductor module 505 includes the FETs 62, 65 of the V-phase. The W2 semiconductor module 506 includes the FETs 63, 66 of the W-phase. Specifically, the three semiconductor modules 501-503 of U1, V1 and W1 form the one set of inverter 60, and the other three semiconductor modules 504-506 of U2, V2 and W2 form the other set of inverter 60.

The three semiconductor modules 501-503 of U1 to W1, which form the one inverter 60, and the three semiconductor modules 504-506 of U2 to W2, which form the other inverter 60, are connected through bus bars 507 to form a module unit. Each bus bar 507 serves as both a connecting element (implementing a mechanical connecting function) and an electric power source line element. That is, the electric power is supplied to the semiconductor modules 501-506 through the bus bars 507.

FIGS. 3 to 6 show an assembling structure of the semiconductor modules 501-506 without showing an electric power supplying structure of the semiconductor modules 501-506. In reality, connectors are installed to the cover 103, and the electric power is supplied to the bus bars 507 through these connectors.

Next, the placement of the semiconductor modules 501-506 will be described.

The semiconductor modules 501-506 are installed to a heat sink 601, which extends from the partition wall 107 of the motor case 101 in the direction of the central axis of the shaft 40.

Now, the heat sink 601, which serves as a heat releasing portion, will be described.

Figure 6:
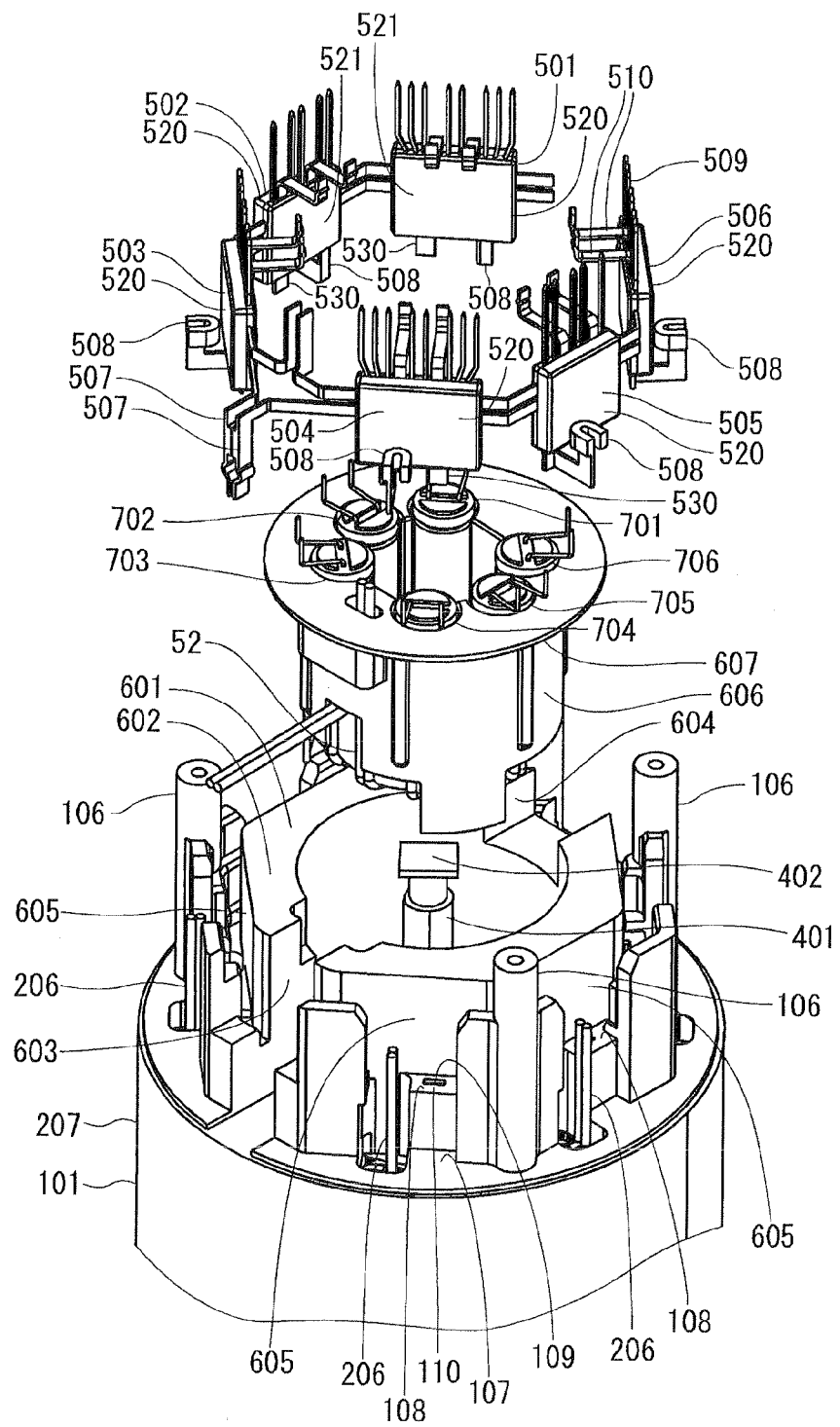
FIG. 6 is an exploded perspective view of the drive apparatus according to the first embodiment.

As shown in FIGS. 3 and 6, the heat sink 601 defines a generally cylindrical space at the center side (interior side) of the heat sink 601. The shaft 401 is placed generally at the center of this cylindrical space. The heat sink 601 can be considered as a cylindrical body having a relatively large wall thickness. The heat sink 601 has a side wall (peripheral wall) 602, which circumferentially extends about the central axis of the shaft 401. The side wall 602 has two notches (axial recesses) 603, 604, which form discontinuous portions, respectively, in the side wall 602.

The side wall 602 of the heat sink 601 has side wall surfaces (outer peripheral surfaces) 605, which are located at a radially outer side of the side wall 602. The number of the side wall surfaces 605 is six.

The semiconductor modules 501-506 are installed to the heat sink 601 such that the semiconductor modules 501-506 are placed to the side wall surfaces 605, respectively. Each semiconductor module 501-506 is formed as a planar body (a plate shaped body, i.e., a flat body) that has a plane generally parallel to a chip surface (one of two opposed largest generally planar surfaces) of the semiconductor chip molded in the semiconductor module 501-506. One of two opposed largest generally planar surfaces of the semiconductor module 501-506, each of which has the largest surface area in comparison to the other remaining surfaces of the semiconductor module 501-506, serves as a heat releasing surface. The semiconductor module 501-506 is installed such that the heat releasing surface of the semiconductor module 501-506 contacts the corresponding side wall surface 605. In this instance, each side wall surface 605 is planar, and thereby the heat releasing surface of the semiconductor module 501-506 is also planar.

As discussed above, the semiconductor module 501-506 is installed to the corresponding side wall surface 605 of the heat sink 601, so that an imaginary perpendicular line, which is perpendicular to the planar chip surface of the semiconductor chip of the semiconductor module 501-506, extends generally perpendicular to the central axis of the shaft 401. That is, in the present embodiment, the semiconductor module 501-506 is placed upright (i.e., in its upright position).

The semiconductor module 501-506 has a winding wire terminal 508 at a motor case 101 side end part of the semiconductor module 501-506 (see FIG. 3). As discussed above, the terminal lines 206 of the coil wires 205 are guided to the electronic circuit side through the six holes formed in the axial end portion of the motor case 101. These terminal lines 206 are clamped by and electrically connected to the winding wire terminals 508 of the semiconductor modules 501-506.

Furthermore, the semiconductor module 501-506 has a plurality of control terminals 509 and two capacitor terminals 510 at the opposite end part of the semiconductor module 501-506, which is opposite from the motor case 101. The control terminals 509 are soldered to corresponding predetermined parts of the printed circuit board 80 (see FIG. 1), as will be discussed in greater detail below. In this way, the semiconductor modules 501-506 are electrically connected to the control unit 70 (see FIG. 2). The capacitor terminals 510 are connected to the electric power source line and the ground in the interior of the semiconductor module 501-506. The capacitor terminals 510 of the semiconductor module 501-506 are bent to radially inwardly extend in the radial direction of the motor case 101.

The semiconductor module 501-506 has a special terminal 530 at the motor case 101 side end part of the semiconductor module 501-506 (see FIGS. 1 and 4 to 6). The semiconductor module 501-506 is installed to the motor case 101 such that the special terminal 530 of the semiconductor module 501-506 is received in a groove 109, which is formed in a wall, surface 108 of the motor case 101. The special terminal 530 and the groove 109 will be described later in detail.

As shown in FIG. 3, six capacitors 701-706 are placed on the radially inner side of the semiconductor modules 501-506 where the heat sink 601 is placed. These capacitors 701-706 will be denoted as a U1 capacitor 701, a V1 capacitor 702, a W1 capacitor 703, a U2 capacitor 704, a V2 capacitor 705 and a W2 capacitor 706, respectively, by using reference signs indicated in FIG. 3 in order to clearly distinguish the individual capacitors 701-706.

In view of the relationship to the structure of FIG. 2, the U1 capacitor 701 corresponds to the capacitor 54. The V1 capacitor 702 corresponds to the capacitor 55. Furthermore, the W1 capacitor 703 corresponds to the capacitor 56. Similarly, the U2 capacitor 704, the V2 capacitor 705 and the W2 capacitor 706 correspond to the capacitor 54, the capacitor 55 and the capacitor 56, respectively.

A holder 606 is placed on the radially inner side of the heat sink 601. The holder 606 is configured into a generally cylindrical tubular form and has a flange 607 at one axial end part of the holder 606 (see FIG. 6). An outer diameter of the holder 606 is slightly smaller than an inner diameter of the heat sink 601. The holder 606 is placed in the inner space located radially inward of the heat sink 601 such that the flange 607 contacts an axial end wall surface of the heat sink 601, which is located on an axial side opposite from the frame end 102 (see FIG. 5). Six receiving portions 608 are formed at a radially inner side part of the holder 606.

The capacitors 701-706 are received in the receiving portions 608 of the holder 606 such that the capacitors 701-706 are provided to the semiconductor modules 501-506, respectively, on the shaft 401 side of the semiconductor modules 501-506 (see FIG. 3). Each of the capacitors 701-706 is configured into a solid cylindrical form having a central axis extending generally parallel to the central axis of the shaft 401. As discussed above, the capacitor terminals 510 of each semiconductor module 501-506 are bent to radially inwardly extend, and terminals of the corresponding capacitor 701-706 are directly connected to the capacitor terminals 510 of the semiconductor module 501-506.

As shown in FIGS. 1 and 6, the choke coil 52 is received in the radially inner side of the holder 606 on the axial side of the capacitors 701-706, which is opposite from the flange 607. The choke coil 52 is formed by winding a coil wire around an annular (doughnut shaped) iron core, and terminal ends of the coil wire are radially outwardly pulled out through the notch 603 of the heat sink 601. Furthermore, as discussed above, the shaft 401 extends to the electronic circuit side. The choke coil 52 is received in the holder 606 such that the shaft 401 extends through the center hole of the choke coil 52.

Although the terminal ends of the choke coil 52 are connected to the electric power source line in series (see FIG. 2), an electric power supply arrangement thereof is not depicted in FIGS. 3 to 6.

Next, the control unit 70 will be described. The control unit 70 is provided in the above-discussed control area. The control unit 70 is formed on the printed circuit board 80 shown in FIG. 1. A conductive line pattern is formed on the printed circuit board 80 by, for example, an etching process, and electronic components, such as integrated circuits (ICs), which form the control unit 70, are installed to the conductive line pattern on the printed circuit board 80 (not shown in FIG. 1). The printed circuit board 80, on which the electronic components are installed, is secured to a plurality of columns 106, which project from the motor case 101, with screws (not shown) such that the control terminals 509 of the semiconductor modules 501-506 are received through terminal holes formed in predetermined locations, respectively, in the printed circuit board 80. The control terminals 509 of the semiconductor modules 501-506 are connected to the conductive line pattern of the printed circuit board 80 by soldering.

In the drive apparatus 1 of the present embodiment, the semiconductor modules 501-506 are arranged such that the plane of each semiconductor module 501-506 is parallel to the central axis of the shaft 401. In this way, the radial size of the drive apparatus 1 can be reduced or minimized. Furthermore, the semiconductor modules 501-506 are placed upright (i.e., in its upright position) to provide a sufficient accommodation space, so that the choke coil 52 and the capacitors 701-706 are arranged in the radial direction in this accommodation space. Specifically, the capacitors 701-706 are placed radially inward of the semiconductor modules 501-506. In this way, particularly, the radial size of the drive apparatus 1 can be minimized.

Next, the special terminals 530 of the semiconductor modules 501-506 and the peripheral structure thereof will be described in detail.

Figure 7:
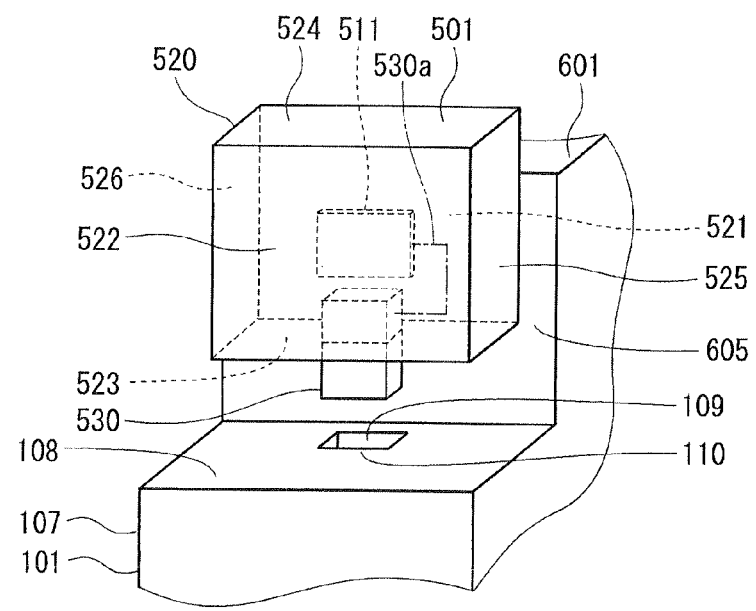
FIG. 7 is a schematic diagram showing a semiconductor module and a motor case of the drive apparatus of the first embodiment.

FIG. 7 schematically shows the semiconductor module 501 and a portion of the partition wall 107 of the motor case 101 before the installation of the semiconductor module 501 to the motor case 101. Since the semiconductor modules 501-506 have basically the same structure, only the semiconductor module 501 among the semiconductor modules 501-506 is shown in FIG. 7. Furthermore, in FIG. 7, the winding wire terminals 508, the control terminals 509 and the capacitor terminals 510 are not shown for the sake of simplicity.

The semiconductor module 501 includes the semiconductor chip 511, an encapsulation body 520 and the special terminal 530.

As discussed above with reference to FIG. 2, the semiconductor chip 511 includes the FET 67 for the reverse current flow protection, the FET (Su+) 61 and the FET (Su−) 64. Specifically, the semiconductor chip 511 is provided to switch (more specifically, to turn on and off) the coil current, which flows through the corresponding one of the coil wires 205 of the multiple phases.

The semiconductor chip 511 is encapsulated in the encapsulation body 520. In the present embodiment, the encapsulation body 520 is made of resin and entirely coves the semiconductor chip 511. The material of the encapsulation body 520 is not limited to the resin. For instance, ceramic or metal may be used as the material of the encapsulation body 520. The encapsulation body 520 defines an outer shape (outer contour) of the semiconductor module 501 and has the function of protecting the semiconductor chip 511 encapsulated in the encapsulation body 520 from external influences, such as an external shock, heat and/or humidity.

The encapsulation body 520 is configured into a generally parallelepiped form. Here, the generally parallelepiped form is defined as a form that is generally parallelepiped in shape and encompasses a form, in which each adjacent two planes (i.e., each adjacent two surfaces) thereof do not intersect at exactly the right angle, and a form, in which a corner and/or an edge thereof is chamfered. In the present embodiment, as shown in FIG. 7, the encapsulation body 520 is configured into a generally flat parallelepiped form. The encapsulation body 520 includes six surfaces, i.e., a back surface 521, a front surface 522, a bottom surface 523, a top surface 524, a right lateral surface 525 and a left lateral surface 526. The back surface 521 is one of two largest surfaces among the six surfaces. Furthermore, the encapsulation body 520 covers the semiconductor chip 511 such that the chip surface of the semiconductor chip 511 is generally parallel to the back surface 521.

The special terminal 530 is embedded in the encapsulation body 520 by, for example, insert molding. In the present embodiment, the special terminal 530 is configured into a rectangular column form. The special terminal 530 is held in the encapsulation body 520 such that an end part of the special terminal 530 projects from the bottom surface 523 of the encapsulation body 520. Furthermore, the special terminal 530 and the semiconductor chip 511 are electrically insulated from each other.

In the present embodiment, the general structure of each of the remaining semiconductor modules 502-506 is basically the same as that of the semiconductor module 501.

As discussed above, the heat sink 601 projects from the partition wall 107 of the motor case 101 in the direction of the central axis of the shaft 401. Furthermore, wall surfaces 108 are formed in the motor case 101 (more specifically, the partition wall 107) such that each wall surface 108 is placed adjacent to a corresponding one of the side wall surfaces 605 of the heat sink 601 (see FIGS. 1 and 6). The heat sink 601 is formed such that each side wall surface 605 is generally perpendicular to the corresponding adjacent wall surface 108. Specifically, with reference to FIG. 7, it is now assumed for the descriptive purpose that the wall surface 108 is a wall surface in an xy plane in an xyz coordinate space, which is defined by an x-axis, a y-axis and a z-axis, and the corresponding adjacent side wall surface 605 extends from the wall surface 108 in the direction of the z-axis. Here, the direction of the z-axis coincides with the direction of the central axis of the shaft 401 (i.e., the direction of the motor axis). Specifically, the side wall surface 605 is a wall surface in a yz plane of the xyz coordinate space and is formed to be generally parallel to the central axis of the shaft 401, i.e., the side wall surface 605 is formed such that the imaginary perpendicular line, which is perpendicular to the side wall surface 605, is generally perpendicular to the central axis of the shaft 401. In FIG. 7, the direction of the x-axis corresponds to the radial direction of the shaft 401, and the direction of the y-axis corresponds to a direction of a tangent line, which is tangent to the cylindrical outer peripheral surface of the shaft 401.

Each of the semiconductor modules 501-506 is installed such that the back surface 521 of the encapsulation body 520 of the semiconductor module 501-506 contacts the corresponding adjacent side wall surface 605 (see FIGS. 1 and 3). In this way, each of the semiconductor modules 501-506 is placed in its upright position such that the imaginary perpendicular line, which is perpendicular to the chip surface of the semiconductor chip 511, is generally perpendicular to the central axis of the shaft 401. Furthermore, in each of the semiconductor modules 501-506, the back surface 521 of the encapsulation body 520 forms the heat releasing surface of the semiconductor module 501-506.

A groove (recess) 109 is formed in the wall surface 108 of the motor case 101. The groove 109 is formed such that the groove 109 corresponds to the location of the special terminal 530 of the semiconductor module 501 and is configured to correspond with the shape of the projecting end part of the special terminal 530 upon the installation of the semiconductor module 501 to the motor case 101.

A cross-sectional area of the groove 109 in an imaginary plane (the xy plane), which is parallel to the wall surface 108, is slightly larger than or generally the same as a cross-sectional area of the end part of the special terminal 530 in the same imaginary plane (the xy plane) upon the installation of the semiconductor module 501. Thereby, when the special terminal 530 is received in the groove 109, the special terminal 530 is engaged with the groove 109. The corresponding portion of the motor case 101, at which the groove 109 is formed, serves as an engaging portion. This engaging portion is indicated as the engaging portion 110 in FIG. 7.

Next, the manufacturing of the drive apparatus 1 will be described in detail.

Steps of the manufacturing the drive apparatus 1 include the following steps as steps, which are particularly relevant to the semiconductor modules. That is, the steps include (I) a semiconductor module installing step, (II) a winding wire connecting step, (III) a capacitor connecting step and (IV) a printed circuit board connecting step.

(I) In the semiconductor module installing step, each semiconductor module 501-506 is installed to the motor case 101 in such a manner that the special terminal 530 is inserted into the groove 109 while the back surface 521 being in contact with the side wall surface 605 (see FIG. 7). At this time, the special terminal 530 is engaged with the groove 109 by the insertion of the special terminal 530 into the groove 109.

(II) In the winding wire connecting step, each terminal line 206 of each coil wire 205 is connected to the winding wire terminal 508 of the corresponding semiconductor module 501-506 by clamping the terminal line 206 with the winding wire terminal 508 or by contacting the terminal line 206 to the winding wire terminal 508.

(III) In the capacitor connecting step, the terminals of each capacitor 701-706 are connected to the capacitor terminals 510 of the corresponding semiconductor module 501-506.

(IV) In the printed circuit board connecting step, the printed circuit board 80, on which the electronic components are installed, is fixed to the columns 106 of the motor case 101 with the screws such that the control terminals 509 of the semiconductor modules 501-506 are inserted through the terminal holes of the printed circuit board 80. Then, the control terminals 509 of the semiconductor modules 501-506 are connected to the conductive line pattern of the printed circuit board 80 by soldering.

As discussed above, in the manufacturing of the drive apparatus 1, the semiconductor modules 501-506 are connected to the other components in the steps discussed in the above sections (II) to (IV) after the semiconductor module installing step discussed in the above section (I). Therefore, after the semiconductor module installing step discussed in the above section (I), for instance, when the other components contact the semiconductor modules, positional deviation of the semiconductor modules relative to the motor case 101 may possibly occur. However, according to the present embodiment, in the semiconductor module installing step discussed in the above section (I), the special terminal 530 of each of the semiconductor modules 501-506 is engaged with the corresponding groove 109 (the engaging portion 110). In this way, the positional deviation of each of the semiconductor modules 501-506 relative to the motor case 101 is limited even in the steps discussed in the above sections (II) to (IV).

Next, the limiting of the positional deviation of the semiconductor module through the use of the special terminal 530 and the groove 109 will be described.

Hereinafter, for the descriptive purpose, the direction from the back surface 521 toward the front surface 522 at the encapsulation body 520 will be referred to as a front surface side direction, and the direction from the front surface 522 toward the back surface 521 at the encapsulation body 520 will be referred to as a back surface side direction. Furthermore, the direction from the left lateral surface 526 toward the right lateral surface 525 at the encapsulation body 520 will be referred to as a right lateral surface side direction, and the direction from the right lateral surface 525 toward the left lateral surface 526 at the encapsulation body 520 will be referred to as a left lateral surface side direction. Also, the direction from the bottom surface 523 toward the top surface 524 at the encapsulation body 520 will be referred to as a top surface side direction, and the direction from the top surface 524 toward the bottom surface 523 at the encapsulation body 520 will be referred to as a bottom surface side direction.

In the present embodiment, with reference to FIG. 7, the engagement between the special terminal 530, which projects from the bottom surface 523 of the encapsulation body 520, and the groove 109 (the engaging portion 110) limits the positional deviations of the semiconductor module 501 relative to the motor case 101 in the front surface side direction and the back surface side direction (i.e., the direction of the x-axis) as well as the right lateral surface side direction and the left lateral surface side direction (i.e., the direction of the y-axis). The semiconductor module 501 is placed such that the back surface 521 of the encapsulation body 520 contacts the side wall surface 605 of the heat sink 601. Thereby, the heat sink 601 also limits the positional deviation of the semiconductor module 501 relative to the motor case 101 in the back surface side direction.

In the case where the motor case 101 is placed such that the central axis of the shaft 401 coincides with the direction of the gravity while the frame end 102 being placed at the bottom side of the motor case 101 to form the bottom surface, and the semiconductor module is placed in its upright position relative to this motor case 101 in the semiconductor module installing step discussed in the above section (I), the semiconductor module may possibly be tilted or tumbled relative to the motor case 101 in the subsequent steps (e.g., the steps discussed in the above sections (II) to (IV)). However, according to the present embodiment, as discussed above, the groove 109 is formed such that the cross-sectional area of the groove 109 in the imaginary plane (the xy plane), which is parallel to the wall surface 108, is slightly larger than or generally the same as the cross-sectional area of the end part of the special terminal 530 in the same imaginary plane (the xy plane) upon the installation of the semiconductor module 501. Thereby, a gap between the portion (more specifically, the engaging portion) of the motor case 101, which forms the groove 109, and the special terminal 530, is set to the predetermined size. With this construction, it is possible to limit the positional deviations of the semiconductor module 501, which include the tilting or tumbling of the semiconductor module 501 in the front surface side direction.

As discussed above, according to the present embodiment, the special terminal 530 is embedded in the encapsulation body 520 of the semiconductor module 501-506. The engaging portion 110, which corresponds to the special terminal 530, is formed in the motor case 101. The special terminal 530 is held by the encapsulation body 520 such that the special terminal 530 projects from the encapsulation body 520 in the manner that enables the limiting of the positional deviation of the semiconductor module 501-506 relative to the motor case 101 upon the engagement of the special terminal with the engaging portion 110. With this construction, for instance, the positional deviation of the semiconductor module 501 after the installation of the semiconductor module 501 to the motor 30 (more specifically, the motor case 101) can be limited by installing the semiconductor module 501 to the motor case 101 such that the special terminal 530 is engaged with the engaging portion 110 at the time of installing the semiconductor module 501 to the motor 30 (more specifically, the motor case 101). Thereby, in the case where the printed circuit board 80, on which the other electronic components are installed, is connected to the semiconductor module 501 or where the terminal lines 206 of the coil wires are connected to the semiconductor module 501, it is possible to limit the positional deviations of the semiconductor module 501, which include the tilting (or the tumbling) of the semiconductor module 501, in the manufacturing steps after the installation of the semiconductor module 501. As discussed above, in the present embodiment, the positional deviation of the semiconductor module 501 can be limited without using, for example, the jig, which supports the semiconductor module 501. Therefore, the manufacturing of the drive apparatus 1 can be eased, and thereby the manufacturing costs of the drive apparatus 1 can be reduced.

Furthermore, in the present embodiment, the motor case 101 includes the heat sink 601, which is formed to project from the wall surface 108 of the motor case 101. The semiconductor module 501 is places such that the semiconductor module 501 contacts the side wall surface 605 of the heat sink 601. With this construction, even in the case where the heat generated from the semiconductor chip 511 is large, the generated heat can be effectively released through the heat sink 601. Thereby, the erroneous operation or the damage caused by the overheating of the semiconductor chip 511 can be limited. Furthermore, the semiconductor module 501 is installed such that the semiconductor module 501 contacts the heat sink 601, as discussed above. Thereby, the positional deviation of the semiconductor module 501 relative to the motor case 101 in the back surface side direction relative to the motor case 101 can be limited. As a result, the positional deviations of the semiconductor module at the time of manufacturing can be more effectively limited.

Furthermore, in the present embodiment, the encapsulation body 520 of the semiconductor module 501 is configured into the generally parallelepiped form. The semiconductor module 501 is placed such that the back surface 521 of the encapsulation body 520 contacts the heat sink 601. Therefore, the chip surface of the semiconductor chip 511 can be placed to oppose the contact surface (the side wall surface 605), at which the semiconductor chip 511 contacts the heat sink 601. Thereby, the heat, which is generated by the semiconductor chip 511, can be effectively released through the heat sink 601. Furthermore, in the present embodiment, the back surface 521 is formed as the one of the two largest surfaces of the six surfaces of the encapsulation body 520. In this way, the size of the contact surface area between the semiconductor module 501 and the heat sink 601 is increased, so that the positional deviation of the semiconductor module 501 at the time of manufacturing can be further limited while the releasing of the heat from the semiconductor module 501 being further enhanced.

Furthermore, in the present embodiment, the engaging portion 110 is formed in the wall surface 108 of the motor case 101. The special terminal 530 projects from the bottom surface 523 of the encapsulation body 520 to engage with the engaging portion 110 upon the insertion of the special terminal 530 into the groove 109 formed in the wall surface 108 of the motor case 101. According to the present embodiment, the engaging portion 110 can limit the positional deviations of the semiconductor module in the front surface side direction, the back surface side direction, the right lateral surface side direction and the left lateral surface side direction.

Furthermore, in the present embodiment, the size of the gap between the portion (the engaging portion 110) of the motor case 101, which forms the groove 109, and the special terminal 530, is set to the predetermined size. In this way, it is possible to limit the positional deviations of the semiconductor module 501, which include the tilting (or the tumbling) of the semiconductor module 501 in the front surface side direction.

Furthermore, in the present embodiment, the special terminal 530 and the semiconductor chip 511 are electrically insulated from each other. Therefore, the special terminal 530 can be used as "the terminal for limiting the positional deviation of the semiconductor module". Thus, even when the electromagnetic noises and/or the unintentional voltage are applied to the special terminal 530, it is possible to reduce or minimize the influences, which are exerted on the semiconductor chip 511 due to the electromagnetic noises and/or the unintentional voltage.

(Second Embodiment)

A drive apparatus according to a second embodiment of the present invention will be described with reference to FIG. 8. In the second embodiment, the number of the special terminals embedded in the encapsulation body of the semiconductor module and the number of the engaging portions formed in the motor case are different from those of the first embodiment.

Figure 8:
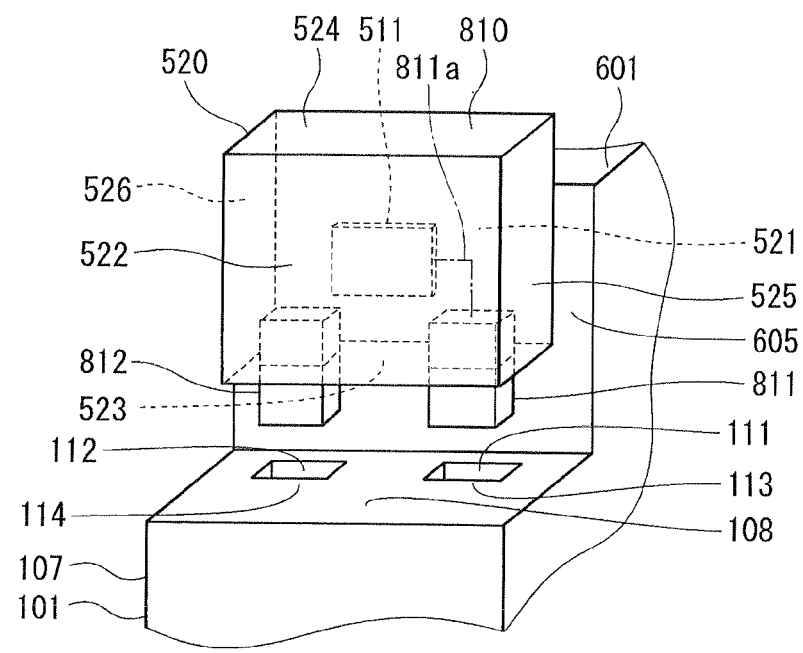
FIG. 8 is a schematic diagram showing a semiconductor module and a motor case of a drive apparatus according to a second embodiment of the present invention.
Figure 8:
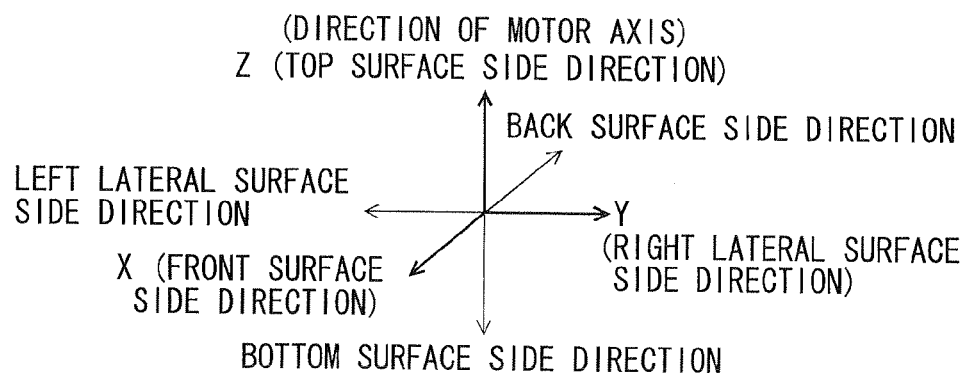

FIG. 8 schematically shows the semiconductor module 810 and the portion of the motor case 101 before the installation of the semiconductor module 801 to the motor case 101. In the second embodiment, similar to the first embodiment, six semiconductor modules are installed to the motor case 101. The semiconductor module 810 is one of these six semiconductor modules, and the other five semiconductor modules (not shown) are constructed in the manner similar to that of the semiconductor module 810.

The semiconductor module 810 includes two special terminals 811, 812, which are embedded in the encapsulation body 520. In the present embodiment, similar to the special terminal 530 of the first embodiment, each of the special terminals 811, 812 is configured into the rectangular column form. The special terminals 811, 812 are held in the encapsulation body 520 such that an end part of each of the special terminals 811, 812 projects from the bottom surface 523 of the encapsulation body 520. The special terminals 811, 812 are arranged one after another along an imaginary straight line in the right lateral surface side direction (i.e., the direction of the y-axis) at the bottom surface 523 while a predetermined distance is provided between the special terminal 811 and the special terminal 812. Furthermore, the special terminals 811, 812 are electrically insulated from the semiconductor chip 511.

The grooves 111, 112 are formed in the wall surface 108 of the motor case 101 (specifically, the partition wall 107). Each of the grooves 111, 112 is formed in the wall surface 108 of the motor case 101 (more specifically, the partition wall 107) to correspond with the location of the corresponding special terminal 811, 812 and the shape of the projecting end part of the corresponding special terminal 811, 812 at the time of installing the semiconductor module 810 to the motor case 101.

A cross-sectional area of each of the grooves 111, 112 in the imaginary plane (the xy plane), which is parallel to the wall surface 108, is slightly larger than or generally the same as a cross-sectional area of the end part of the corresponding one of the special terminals 811, 812 in the same imaginary plane (the xy plane) upon the installation of the semiconductor module 810. With this construction, when the semiconductor module 810 is installed to the motor case 101 by inserting the special terminals 811, 812 into the grooves 111, 112, the special terminals 811, 812 are engaged with the grooves 111, 112, respectively. The corresponding portions of the motor case 101, at which the grooves 111, 112 are formed, serve as engaging portions. These engaging portions are indicated as the engaging portions 113, 114 in FIG. 8.

In the present embodiment, the engagement between each of the special terminals 811, 812, which project from the bottom surface 523 of the encapsulation body 520, and the corresponding one of the grooves 111, 112 (the engaging portions 113, 114) limits the positional deviations of the semiconductor module 810 relative to the motor case 101 in the front surface side direction and the back surface side direction (i.e., the direction of the x-axis) as well as the right lateral surface side direction and the left lateral surface side direction (i.e., the direction of the y-axis).

As discussed above, according to the present embodiment, the semiconductor module 810 includes the two special terminals 811, 812, which limit the positional deviations of the semiconductor module 810 relative to the motor case 101. Therefore, in the present embodiment, the positional deviations of the semiconductor module relative to the motor case 101 can be more effectively limited in comparison to the first embodiment.

(Third Embodiment)

A drive apparatus according to a third embodiment of the present invention will be described with reference to FIG. 9. In the third embodiment, the locations of the special terminals embedded in the encapsulation body of the semiconductor module and the locations of the engaging portions formed in the motor case are different from those of the second embodiment.

Figure 9:
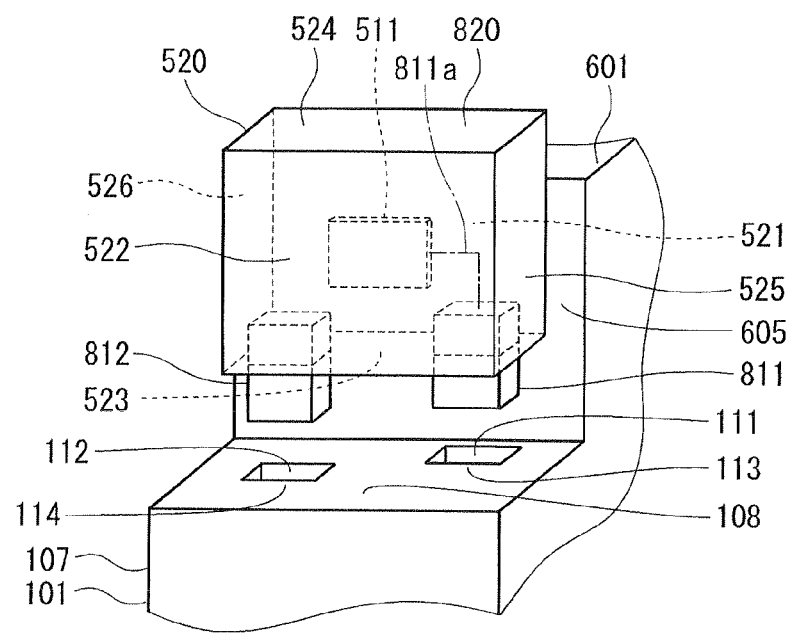
FIG. 9 is a schematic diagram showing a semiconductor module and a motor case of a drive apparatus according to a third embodiment of the present invention.
Figure 9:
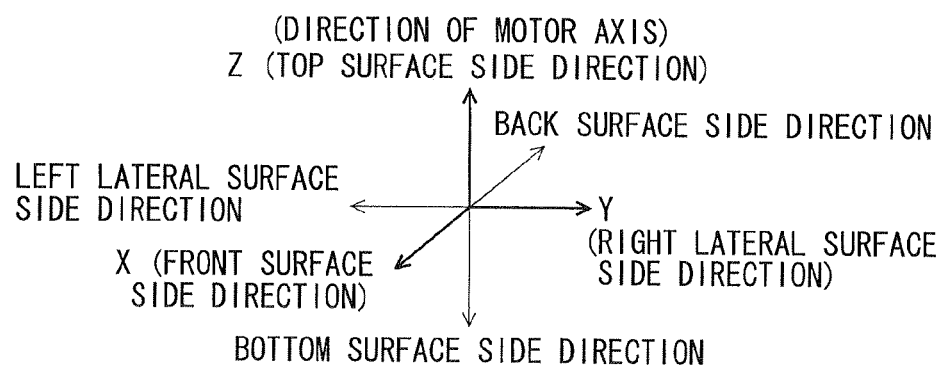

FIG. 9 schematically shows the semiconductor module 820 and the portion of the motor case 101 before the installation of the semiconductor module 820 to the motor case 101. In the third embodiment, similar to the above embodiments, six semiconductor modules are installed to the motor case 101. The semiconductor module 820 is one of these six semiconductor modules, and the other five semiconductor modules (not shown) are constructed in the manner similar to that of the semiconductor module 820.

In the third embodiment, unlike the second embodiment, the special terminals 811, 812 are arranged one after another along an imaginary diagonal line at the rectangular bottom surface 523.

Each of the grooves 111, 112 is formed in the wall surface 108 of the motor case 101 (more specifically, the partition wall 107) to correspond with the location of the corresponding special terminal 811, 812 and the shape of the projecting end part of the corresponding special terminal 811, 812 at the time of installing the semiconductor module 820 to the motor case 101.

In the present embodiment, the engagement between each of the special terminals 811, 812 and the corresponding one of the grooves 111, 112 (the engaging portions 113, 114) limits the positional deviations of the semiconductor module 820 relative to the motor case 101 in the front surface side direction and the back surface side direction (i.e., the direction of the x-axis) as well as the right lateral surface side direction and the left lateral surface side direction (i.e., the direction of the y-axis).

Furthermore, in the present embodiment, since the special terminals 811, 812 are arranged one after another along the imaginary diagonal line at the bottom surface 523, the semiconductor module 820 can be installed to the motor case 101 in its upright position in the more stable state in comparison to the second embodiment.

(Fourth Embodiment)

A drive apparatus according to a fourth embodiment of the present invention will be described with reference to FIG. 10. In the fourth embodiment, the projecting directions (projecting surfaces) of the special terminals relative to the encapsulation body and the locations and shapes of the engaging portions of the motor case are different from those of the above embodiments.

Figure 10:
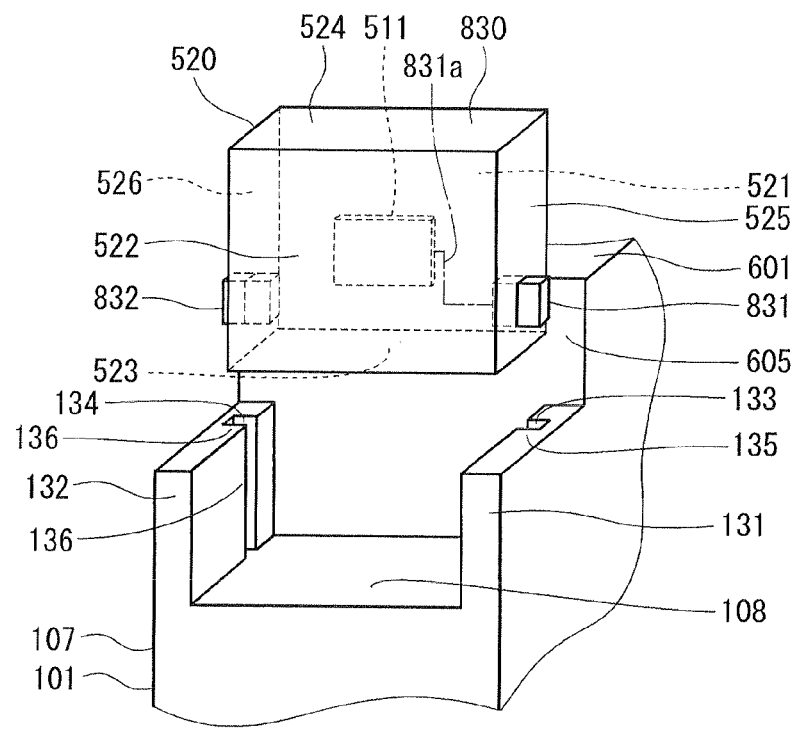
FIG. 10 is a schematic diagram showing a semiconductor module and a motor case of a drive apparatus according to a fourth embodiment of the present invention.
Figure 10:
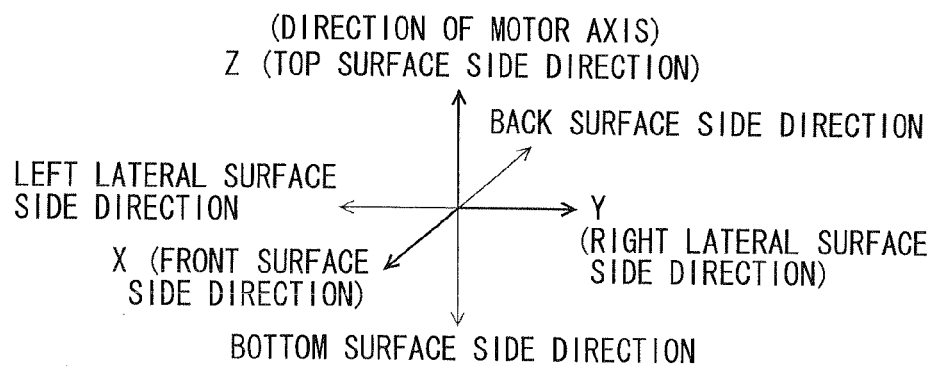

FIG. 10 schematically shows the semiconductor module 830 and the portion of the motor case 101 before the installation of the semiconductor module 830 to the motor case 101. In the fourth embodiment, similar to the above embodiments, six semiconductor modules are installed to the motor case 101. The semiconductor module 830 is one of these six semiconductor modules, and the other five semiconductor modules (not shown) are constructed in the manner similar to that of the semiconductor module 830.

The semiconductor module 830 includes two special terminals 831, 832, which are embedded in the encapsulation body 520. Each of the special terminals 831, 832 is configured into the rectangular column form. The special terminal 831 is held in the encapsulation body 520 such that an end part of the special terminal 831 projects from the right lateral surface 525 of the encapsulation body 520. The special terminal 832 is held in the encapsulation body 520 such that an end part of the special terminal 832 projects from the left lateral surface 526 of the encapsulation body 520. Furthermore, the special terminals 831, 832 are electrically insulated from the semiconductor chip 511.

The motor case 101 includes a right terminal receiving portion 131 and a left terminal receiving portion 132, which extend from the wall surface 108 of the partition wall 107 in the direction of the z-axis. A groove 133 is formed in the right terminal receiving portion 131. A groove 134 is formed in the left terminal receiving portion 132. Each of the grooves 133, 134 is formed to correspond with the location of the corresponding special terminal 831, 832 and the shape of the corresponding special terminal 831, 832 at the time of installing the semiconductor module 830 to the motor case 101.

The grooves 133, 134 are formed in the right and left terminal receiving portions 131, 132, respectively, to extend in the direction of the z-axis. The grooves 133, 134 are formed such that the back surface 521 of the encapsulation body 520 contacts the side wall surface 605 of the heat sink 601 upon the installation of the semiconductor module 830 to the motor case 101 by inserting the special terminals 831, 832 into the grooves 133, 134, respectively. Furthermore, each of the grooves 133, 134 is formed such that a width of the groove 133, 134 measured in the direction of the x-axis is slightly larger than or generally equal to a width of a projecting end part of the corresponding adjacent one of the special terminals 831, 832 measured in the direction of the x-axis.

With this construction, when the semiconductor module 830 is installed to the motor case 101 by inserting the special terminals 831, 832 into the grooves 133, 134, respectively, the back surface 521 of the semiconductor module 830 contacts the side wall surface 605. Furthermore, when the special terminals 831, 832 are inserted into the grooves 133, 134 respectively, the special terminals 831, 832 are engaged with the grooves 133, 134, respectively. That is, the corresponding portions of the motor case 101, at which the grooves 133, 134 are formed, serve as engaging portions. These engaging portions are indicated as the engaging portions 135, 136 in FIG. 10.

In the present embodiment, the positional deviations of the semiconductor module 830 relative to the motor case 101 in the front surface side direction and the back surface side direction (i.e., the direction of the x-axis) are limited by the engagement of the special terminals 831, 832, which project form the right lateral surface 525 and the left lateral surface 526, respectively, of the encapsulation body 520, with the grooves 133, 134 (the engaging portions 135, 136), respectively.

Furthermore, in the present embodiment, the right terminal receiving portion 131 is formed such that the right terminal receiving portion 131 contacts the right lateral surface 525 of the semiconductor module 830 or is slightly spaced from the right lateral surface 525 of the semiconductor module 830 by a small gap. Furthermore, the left terminal receiving portion 132 is formed such that the left terminal receiving portion 132 contacts the left lateral surface 526 of the semiconductor module 830 or is slightly spaced from the left lateral surface 526 of the semiconductor module 830 by a small gap. That is, a distance between the right terminal receiving portion 131 and the left terminal receiving portion 132 is set to be substantially the same as or slightly larger than the width of the encapsulation body 520 of the semiconductor module 830 (i.e., a distance from the right lateral surface 525 to the left lateral surface 526). Therefore, the semiconductor module 830 is placed between the right terminal receiving portion 131 and the left terminal receiving portion 132, and thereby the positional deviations of the semiconductor module 830 relative to the motor case 101 in the right lateral surface side direction and the left lateral surface side direction (i.e., the direction of the y-axis) are limited.

Furthermore, in the present embodiment, similar to the above embodiments, the semiconductor module 830 is placed such that the back surface 521 of the encapsulation body 520 contacts the side wall surface 605 of the heat sink 601. Thereby, the positional deviation of the semiconductor module 830 in the back surface side direction is also limited by the heat sink 601.

As discussed above, according to the present embodiment, the semiconductor module 830 includes the two special terminals 831, 832, which limit the positional deviations of the semiconductor module 830 relative to the motor case 101. Furthermore, the right terminal receiving portion 131, the left terminal receiving portion 132 and the heat sink 601 limit the positional deviations of the semiconductor module 830. Therefore, in the present embodiment, the positional deviations of the semiconductor module relative to the motor case 101 can be more effectively limited.

In the present embodiment, as shown in FIG. 10, the special terminals 831, 832 are arranged one after another along an imaginary straight line that extends in the right lateral surface side direction (i.e., the direction of the y-axis). As a modification of the present embodiment, it is conceivable to arrange the special terminals 831, 832 in another way, which is other than the arranging of the special terminals 831, 832 along the imaginary straight line that extends in the right lateral surface side direction (i.e., the direction of the y-axis). That is, the special terminals 831, 832 may be arranged one after another in the front surface side direction (i.e., the direction of the x-axis) or in the top surface side direction (i.e., the direction of the z-axis). Also, as another modification of the present embodiment, it is conceivable to provide only one of the right terminal receiving portion 131 and the left terminal receiving portion 132. Even with this construction (the modification), the positional deviation of the semiconductor module 830 in the predetermined direction can be limited.

(Fifth Embodiment)

A drive apparatus according to a fifth embodiment of the present invention will be described with reference to FIG. 11. In the fifth embodiment, the projecting direction (projecting surface) of the special terminal relative to the encapsulation body and the location and shape of the engaging portion of the motor case are different from those of the above embodiments.

Figure 11:
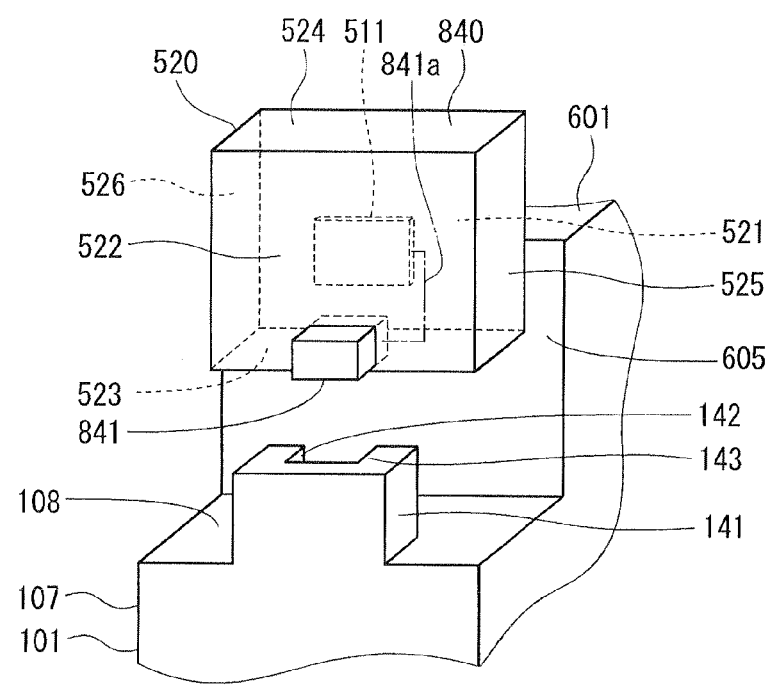
FIG. 11 is a schematic diagram showing a semiconductor module and a motor case of a drive apparatus according to a fifth embodiment of the present invention.
Figure 11:
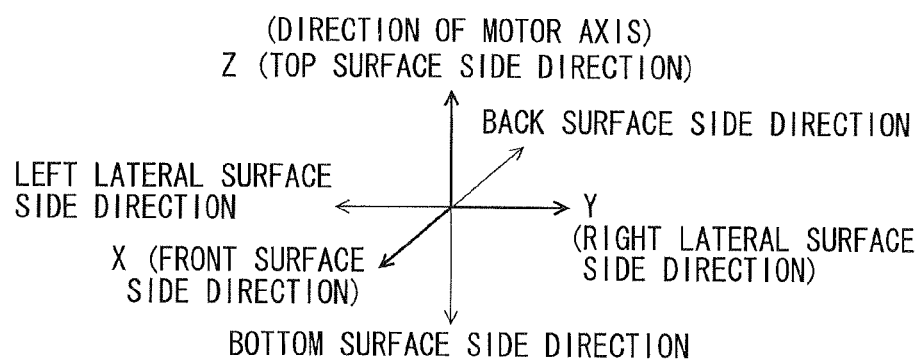

FIG. 11 schematically shows the semiconductor module 840 and the portion of the motor case 101 before the installation of the semiconductor module 840 to the motor case 101. In the fifth embodiment, similar to the above embodiments, six semiconductor modules are installed to the motor case 101. The semiconductor module 840 is one of these six semiconductor modules, and the other five semiconductor modules (not shown) are constructed in the manner similar to that of the semiconductor module 840.

The semiconductor module 840 includes the special terminal 841, which is embedded in the encapsulation body 520. The special terminal 841 is configured into the rectangular column form. The special terminal 841 is held in the encapsulation body 520 such that an end part of the special terminal 841 projects from the front surface 522 of the encapsulation body 520. Furthermore, the special terminal 841 is electrically insulated from the semiconductor chip 511.

The motor case 101 includes a front terminal receiving portion 141, which extend from the wall surface 108 of the partition wall 107 in the direction of the z-axis. A groove 142 is formed in the front terminal receiving portion 141. The groove 142 is formed such that the groove 142 corresponds to the location of the special terminal 841 of the semiconductor module 840 and is configured to correspond with the shape of the projecting end part of the special terminal 841 upon the installation of the semiconductor module 840 to the motor case 101.

The groove 142 is formed in the front terminal receiving portion 141 to extend in the direction of the z-axis. Furthermore, the groove 142 is formed such that a width of the groove 142 measured in the direction of the y-axis is slightly larger than or generally equal to a width of the projecting end part of the special terminal 841 measured in the direction of the y-axis. With this construction, when the semiconductor module 840 is installed to the motor case 101 by inserting the special terminal 841 into the groove 142, the special terminals 841 is engaged with the groove 142. The corresponding portion of the motor case 101, at which the groove 142 is formed, serves as an engaging portion. This engaging portion is indicated as the engaging portion 143 in FIG. 11.

In the present embodiment, the engagement between the special terminal 841, which projects from the front surface 522 of the encapsulation body 520, and the groove 142 (the engaging portion 143) limits the positional deviations of the semiconductor module 840 relative to the motor case 101 in the right lateral surface side direction and the left lateral surface side direction (i.e., the direction of the y-axis).

Furthermore, in the present embodiment, the front terminal receiving portion 141 is formed such that the front terminal receiving portion 141 contacts the front surface 522 of the semiconductor module 840 or is slightly spaced from the front surface 522 of the semiconductor module 840 by a small gap. The heat sink 601 is formed such that the side wall surface 605 of the heat sink 601 contacts the back surface 521 of the semiconductor module 840. That is, a distance between the front terminal receiving portion 141 and the heat sink 601 is set to be substantially the same as or slightly larger than a thickness of the encapsulation body 520 of the semiconductor module 840 in the direction of the x-axis (i.e., a distance from the front surface 522 to the back surface 521). Therefore, the semiconductor module 840 is placed between the front terminal receiving portion 141 and the heat sink 601, and thereby the positional deviations of the semiconductor module 840 relative to the motor case 101 in the front surface side direction and the back surface side direction (i.e., the direction of the x-axis) are limited.

As discussed above, according to the present embodiment, the semiconductor module 840 includes the special terminal 841, and the positional deviations of the semiconductor module 840 relative to the motor case 101 are limited by the special terminal 841. Furthermore, the positional deviations of the semiconductor module 840 are also limited by the front terminal receiving portion 141 and the heat sink 601. Therefore, in the present embodiment, the positional deviations of the semiconductor module relative to the motor case 101 can be more effectively limited.

(Sixth Embodiment)

A drive apparatus according to a sixth embodiment of the present invention will be described with reference to FIG. 12.

Figure 12:
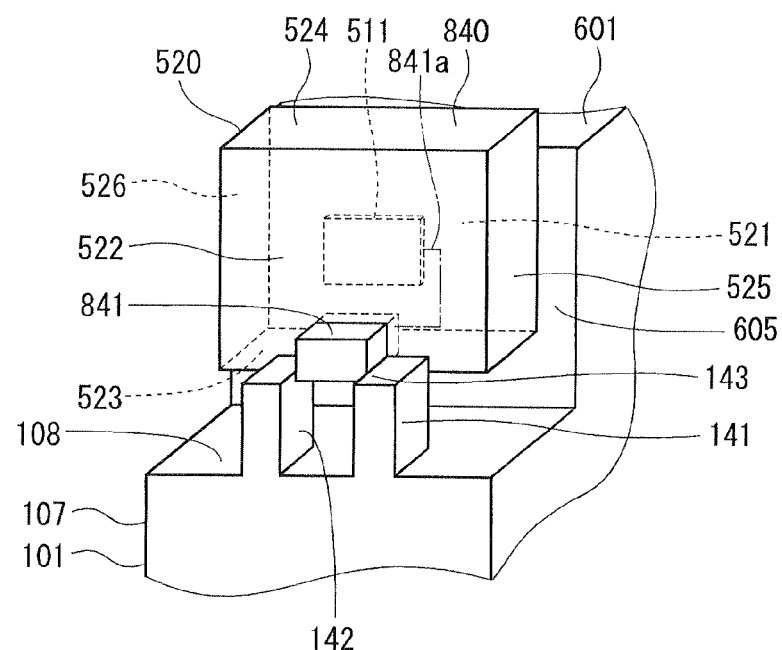
FIG. 12 is a schematic diagram showing a semiconductor module and a motor case of a drive apparatus according to a sixth embodiment of the present invention.
Figure 12:
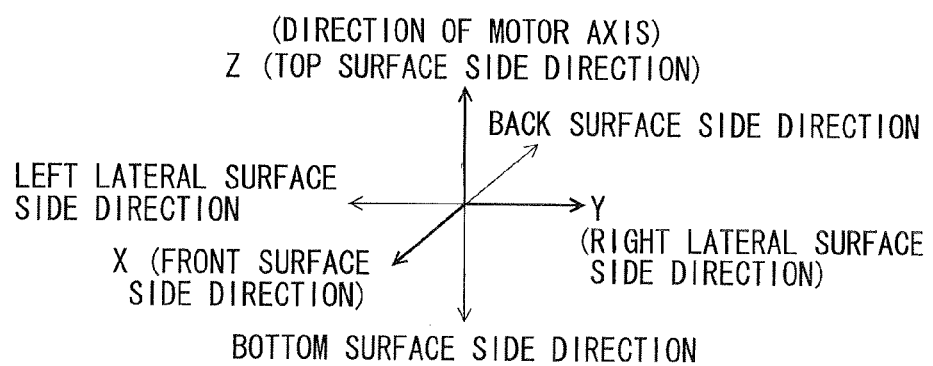

FIG. 12 schematically shows the semiconductor module 840 and the portion of the motor case 101 before the installation of the semiconductor module 840 to the motor case 101. In the sixth embodiment, similar to the above embodiments, six semiconductor modules are installed to the motor case 101. The semiconductor module 840 is one of these six semiconductor modules, and the other five semiconductor modules (not shown) are constructed in the manner similar to that of the semiconductor module 840.

In the sixth embodiment, only the shape of the front terminal receiving portion 141 differs from that of the fifth embodiment. In the sixth embodiment, as shown in FIG. 12, a groove 142 is formed in the front terminal receiving portion 141 to extend through the front terminal receiving portion 141 in the direction of the x-axis. Thereby, the groove 142 connects between two opposed surfaces (the heat sink 601 side surface and the opposite surface, which is opposite from the heat sink 601) of the front terminal receiving portion 141, which are opposed to each other in the direction of the x-axis. The remaining structure of the drive apparatus other than the above described front terminal receiving portion 141 is the same as the drive apparatus of the fifth embodiment.

Even with this construction, the positional deviations of the semiconductor module can be advantageously limited.

(Seventh Embodiment)

A drive apparatus according to a seventh embodiment of the present invention will be described with reference to FIG. 13. In the seventh embodiment, the number of the special terminals embedded in the encapsulation body and the number of the front terminal receiving portions formed in the motor case are different from those of the fifth embodiment.

Figure 13:
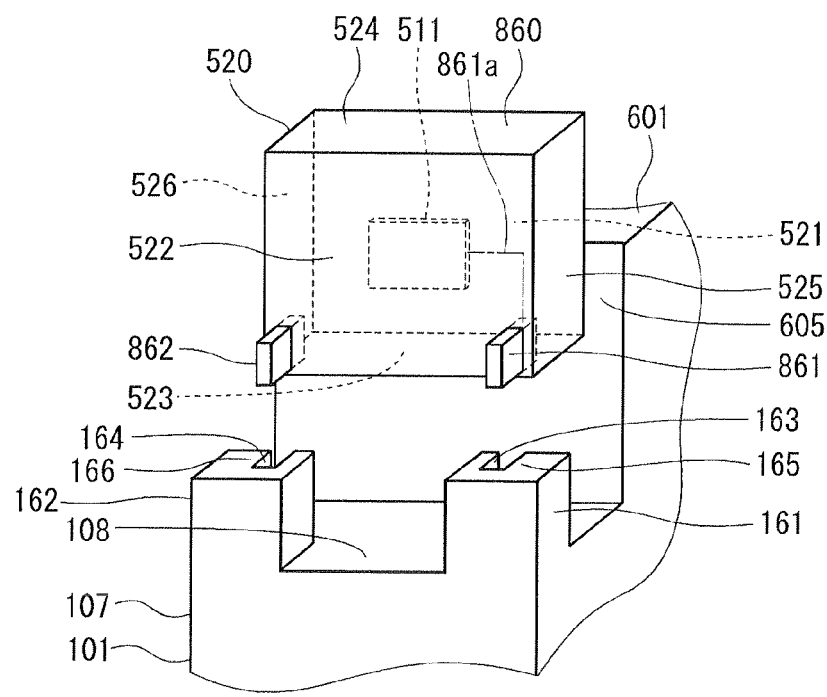
FIG. 13 is a schematic diagram showing a semiconductor module and a motor case of a drive apparatus according to a seventh embodiment of the present invention.
Figure 13:
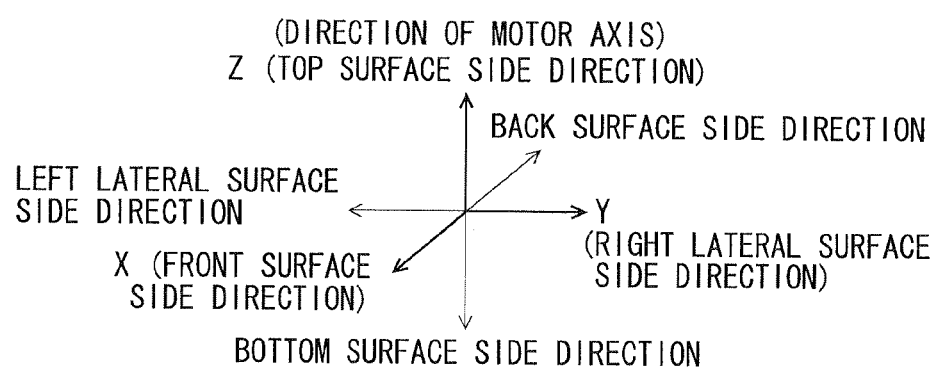

FIG. 13 schematically shows the semiconductor module 860 and the portion of the motor case 101 before the installation of the semiconductor module 860 to the motor case 101. In the seventh embodiment, similar to the above embodiments, six semiconductor modules are installed to the motor case 101. The semiconductor module 860 is one of these six semiconductor modules, and the other five semiconductor modules (not shown) are constructed in the manner similar to that of the semiconductor module 860.

The semiconductor module 860 includes two special terminals 861, 862, which are embedded in the encapsulation body 520. Each of the special terminals 861, 862 is configured into the rectangular column form. The special terminals 861, 862 are held in the encapsulation body 520 such that an end part of each of the special terminals 861, 862 projects from the front surface 522 of the encapsulation body 520. In the present embodiment, the special terminal 861 is placed at the right lower end part of the front surface 522, i.e., is placed at the predetermined location of the front surface 522, which is adjacent to the right lateral surface 525 and the bottom surface 523. The special terminal 862 is placed at the left lower end part of the front surface 522, i.e., is placed at the predetermined location of the front surface 522, which is adjacent to the left lateral surface 526 and the bottom surface 523. Furthermore, the special terminals 861, 862 are electrically insulated from the semiconductor chip 511.

The motor case 101 includes two front terminal receiving portions 161, 162, which extend from the wall surface 108 of the partition wall 107 in the direction of the z-axis. Grooves 163, 164 are formed in the front terminal receiving portions 161, 162, respectively. The groove 163 is formed such that the groove 163 corresponds to the location of the special terminal 861 of the semiconductor module 860 and is configured to correspond with the shape of the projecting end part of the special terminal 861 upon the installation of the semiconductor module 860 to the motor case 101. The groove 164 is formed such that the groove 164 corresponds to the location of the special terminal 862 of the semiconductor module 860 and is configured to correspond with the shape of the projecting end part of the special terminal 862 upon the installation of the semiconductor module 860 to the motor case 101.

Each of the front terminal receiving portions 161, 162 and each of the grooves 163, 164 are configured like the front terminal receiving portion 141 and the groove 142, respectively, of the fifth embodiment. That is, according to the present embodiment, the two front terminal receiving portions, each of which is similar to the front terminal receiving portion 162 of the fifth embodiment, are provided for each semiconductor module. The portion of the front terminal receiving portion 161, at which the groove 163 is formed, serves as the engaging portion. Also, the portion of the front terminal receiving portion 162, at which the groove 164 is formed, serves as the engaging portion. These engaging portions are indicated as the engaging portions 165, 166 in FIG. 13.

In the present embodiment, the engagement between the special terminal 861 and the groove 163 (the engaging portion 165) and the engagement between the special terminal 862 and the groove 164 (the engaging portion 166) limit the positional deviations of the semiconductor module 860 relative to the motor case 101 in the right lateral surface side direction and the left lateral surface side direction (i.e., the direction of the y-axis). Furthermore, the front terminal receiving portions 161, 162 and the heat sink 601 limit the positional deviations of the semiconductor module 860 relative to the motor case 101 in the front surface side direction and the back surface side direction (i.e., the direction of the x-axis).

As discussed above, in the present embodiment, the two front terminal receiving portions are provided, so that the positional deviations of the semiconductor module relative to the motor case 101 can be more effectively limited in comparison to the fifth embodiment.

In the present embodiment, as shown in FIG. 13, the special terminals 861, 862 are provided at the lower side part of the front surface 522, which is adjacent to the bottom surface 523. Furthermore, as a modification of the present embodiment, the special terminal 861 or the special terminal 862 may be placed at the upper side part of the front surface 522, which is adjacent to the top surface 524, or may be placed generally at a middle part (a vertical center part) of the front surface 522 between the top surface 524 and the bottom surface 523. That is, the special terminals 861, 862 may be placed at any locations in the top surface side direction (i.e., the direction of the z-axis) between the bottom surface 523 and the top surface 524 in the front surface 522.

Furthermore, at least one of the front terminal receiving portions 161, 162 may be configured into the shape that is similar to the shape of the front terminal receiving portion 141 of the sixth embodiment.

(Eighth Embodiment)

A drive apparatus according to an eighth embodiment of the present invention will be described with reference to FIG. 14. In the eighth embodiment, the number of the special terminals embedded in the encapsulation body and the number of the front terminal receiving portion(s) formed in the motor case are different from those of the fifth embodiment.

Figure 14:
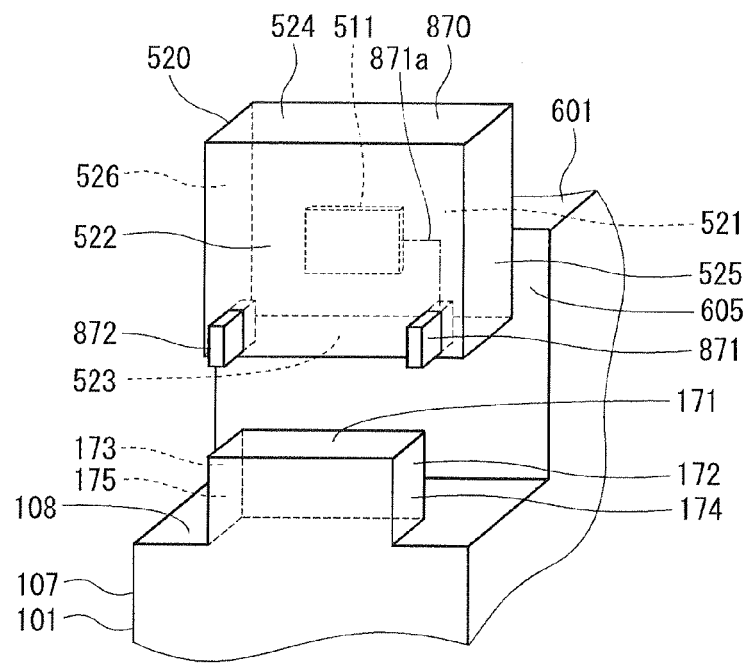
FIG. 14 is a schematic diagram showing a semiconductor module and a motor case of a drive apparatus according to an eighth embodiment of the present invention.
Figure 14:
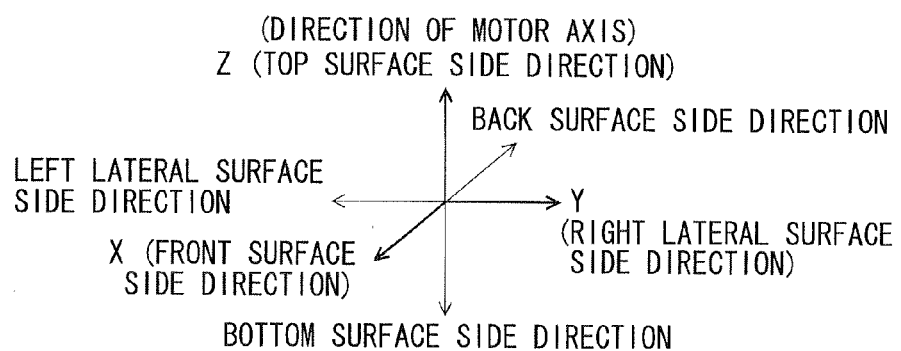

FIG. 14 schematically shows the semiconductor module 870 and the portion of the motor case 101 before the installation of the semiconductor module 870 to the motor case 101. In the eighth embodiment, similar to the above embodiments, six semiconductor modules are installed to the motor case 101. The semiconductor module 870 is one of these six semiconductor modules, and the other five semiconductor modules (not shown) are constructed in the manner similar to that of the semiconductor module 870.

The semiconductor module 870 includes first and second special terminals 871, 872, which are embedded in the encapsulation body 520. Specifically, in the present embodiment, the special terminals include the first and second special terminals 871, 872. Each of the first and second special terminals 871, 872 is configured into the rectangular column form. The first and second special terminals 871, 872 are held in the encapsulation body 520 such that an end part of each of the first and second special terminals 871, 872 projects from the front surface 522 of the encapsulation body 520. In the present embodiment, the first and second special terminals 871, 872 are placed at the lower end part of the front surface 522, which is adjacent to the bottom surface 523. Furthermore, the first and second special terminals 871, 872 are electrically insulated from the semiconductor chip 511.

The motor case 101 includes a front terminal receiving portion 171, which extends from the wall surface 108 of the partition wall 107 in the direction of the z-axis. The front terminal receiving portion 171 includes wall surfaces 172, 173, which are opposed to each other in the direction of the y-axis and are generally parallel to the x-axis. The first and second special terminals 871, 872 are held in the encapsulation body 520 such that a distance between the first special terminal 871 and the second special terminal 872 is generally the same as or slightly larger than a width of the front terminal receiving portion 171 (i.e., a distance between the wall surface 172 and the wall surface 173). Therefore, when the semiconductor module 870 is placed at the predetermined position of the motor case 101, the front terminal receiving portion 171 is held between the first special terminal 871 and the second special terminal 872. At this time, the wall surface 172 is engageable with the first special terminal 871, and the wall surface 173 is engageable with the second special terminal 872. The portion of the front terminal receiving portion 171, at which the wall surface 172 is formed, and the other portion of the front terminal receiving portion 171, at which the wall surface 173 is formed, serve as engaging portions. These engaging portions are indicated as the engaging portions 174, 175 in FIG. 14.

In the present embodiment, the engagement between the first special terminal 871, which projects from the front surface 522 of the encapsulation body 520, and the wall surface 172 (the engaging portion 174) of the front terminal receiving portion 171 and the engagement between the second special terminal 872, which projects from the front surface 522 of the encapsulation body 520, and the wall surface 173 (the engaging portion 175) of the front terminal receiving portion 171 limit the positional deviations of the semiconductor module 870 relative to the motor case 101 in the right lateral surface side direction and the left lateral surface side direction (i.e., the direction of the y-axis).

Furthermore, similar to the fifth embodiment, the distance between the front terminal receiving portion 171 and the heat sink 601 is set to be substantially the same as or slightly larger than the thickness of the encapsulation body 520 of the semiconductor module 870 in the direction of the x-axis (i.e., the distance from the front surface 522 to the back surface 521). Therefore, the semiconductor module 870 is placed between the front terminal receiving portion 171 and the heat sink 601, and thereby the positional deviations of the semiconductor module 870 relative to the motor case 101 in the front surface side direction and the back surface side direction (i.e., the direction of the x-axis) are limited.

As discussed above, in the present embodiment, the semiconductor module 870 includes the first and second special terminals 871, 872, and the positional deviations of the semiconductor module 870 relative to the motor case 101 are limited by these special terminals 871, 872. Furthermore, the positional deviations of the semiconductor module 870 are also limited by the front terminal receiving portion 171 and the heat sink 601. Therefore, in the present embodiment, the positional deviations of the semiconductor module relative to the motor case 101 can be more effectively limited.

In the present embodiment, as shown in FIG. 14, the first and second special terminals 871, 872 are provided at the lower side part of the front surface 522, which is adjacent to the bottom surface 523. Furthermore, as a modification of the present embodiment, the first special terminal 871 or the second special terminal 872 may be placed at the upper side part of the front surface 522, which is adjacent to the top surface 524, or may be placed generally at the middle part (the vertical center part) of the front surface 522 between the top surface 524 and the bottom surface 523. That is, the first and second special terminals 871, 872 may be placed at any locations in the top surface side direction (i.e., the direction of the z-axis) between the bottom surface 523 and the top surface 524 in the front surface 522.

(Ninth Embodiment)

A drive apparatus according to a ninth embodiment of the present invention will be described with reference to FIG. 15. In the ninth embodiment, the number of the terminal receiving portions formed in the motor case is different from that of the eighth embodiment.

Figure 15:
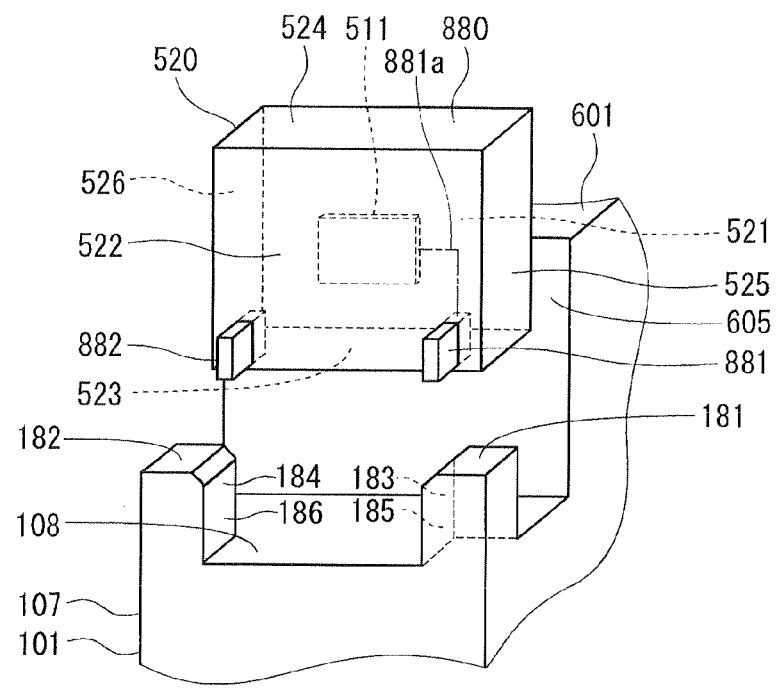
FIG. 15 is a schematic diagram showing a semiconductor module and a motor case of a drive apparatus according to a ninth embodiment of the present invention.
Figure 15:
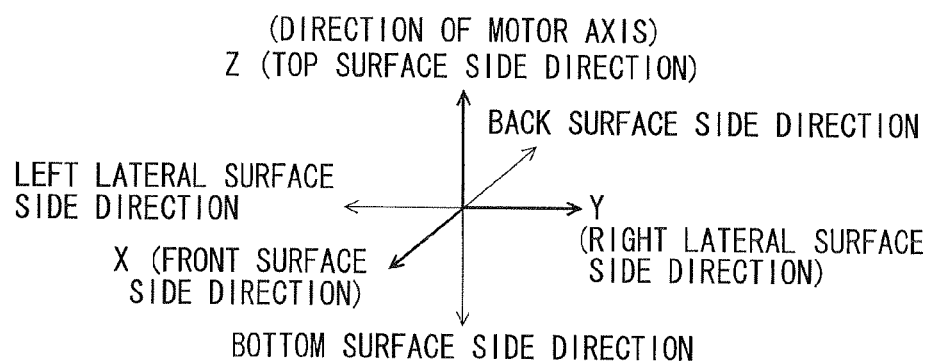

FIG. 15 schematically shows the semiconductor module 880 and the portion of the motor case 101 before the installation of the semiconductor module 880 to the motor case 101. In the ninth embodiment, similar to the above embodiments, six semiconductor modules are installed to the motor case 101. The semiconductor module 880 is one of these six semiconductor modules, and the other five semiconductor modules (not shown) are constructed in the manner similar to that of the semiconductor module 880.

The semiconductor module 880 includes first and second special terminals 881, 882, which are embedded in the encapsulation body 520. Specifically, in the present embodiment, the special terminals include the first and second special terminals 881, 882. Each of the first and second special terminals 881, 882 is configured into the rectangular column form. The first and second special terminals 881, 882 are held in the encapsulation body 520 such that an end part of each of the first and second special terminals 881, 882 projects from the front surface 522 of the encapsulation body 520. In the present embodiment, the first and second special terminals 881, 882 are placed at the lower end part of the front surface 522, which is adjacent to the bottom surface 523. Furthermore, the first and second special terminals 881, 882 are electrically insulated from the semiconductor chip 511.

The motor case 101 includes first and second front terminal receiving portions 181, 182, which extend from the wall surface 108 of the partition wall 107 in the direction of the z-axis. The first front terminal receiving portion 181 includes a wall surface 183, which is generally parallel to the x-axis. The second front terminal receiving portion 182 includes a wall surface 184, which is generally parallel to the x-axis. The first and second special terminals 881, 882 are held in the encapsulation body 520 such that a distance between a lateral wall surface of the first special terminal 881, which is located on the side where the right lateral surface 525 is placed, and a lateral wall surface of the second special terminal 882, which is located on the side where the left lateral surface 526 is placed, is generally the same or is slightly larger than a distance between the first front terminal receiving portion 181 and the second front terminal receiving portion 182 (i.e., a distance from the wall surface 183 to the wall surface 184). Therefore, when the semiconductor module 880 is placed in the predetermined position of the motor case 101, the first and second special terminals 881, 882 are held between the first front terminal receiving portion 181 and the second front terminal receiving portion 182. At this time, the wall surface 183 is engageable with the first special terminal 881, and the wall surface 184 is engageable with the second special terminal 882. The portion of the first front terminal receiving portion 181, at which the wall surface 183 is formed, and the portion of the second front terminal receiving portion 182, at which the wall surface 184 is formed, serve as engaging portions. These engaging portions are indicated as the engaging portions 185, 186, respectively, in FIG. 15.

In the present embodiment, the engagement between the first special terminal 881, which projects from the front surface 522 of the encapsulation body 520, and the wall surface 183 (the engaging portion 185) of the first front terminal receiving portion 181 and the engagement between the second special terminal 882, which projects from the front surface 522 of the encapsulation body 520, and the wall surface 184 (the engaging portion 186) of the second front terminal receiving portion 182 limit the positional deviations of the semiconductor module 880 relative to the motor case 101 in the right lateral surface side direction and the left lateral surface side direction (i.e., the direction of the y-axis).

Furthermore, similar to the eighth embodiment, the distance between the front terminal receiving portion (specifically, each of the first front terminal receiving portion 181 and the second front terminal receiving portion 182) and the heat sink 601 is set to be substantially the same as or slightly larger than the thickness of the encapsulation body 520 of the semiconductor module 880 in the direction of the x-axis (i.e., the distance from the front surface 522 to the back surface 521). Therefore, the semiconductor module 880 is held between the first and second front terminal receiving portions 181, 182 and the heat sink 601, and thereby the positional deviations of the semiconductor module 880 relative to the motor case 101 in the front surface side direction and the back surface side direction (i.e., the direction of the x-axis) are limited.

As discussed above, in the present embodiment, the semiconductor module 880 includes the first and second special terminals 881, 882, and the positional deviations of the semiconductor module 880 relative to the motor case 101 are limited by these special terminals 881, 882. Furthermore, the positional deviations of the semiconductor module 880 are also limited by the first and second front terminal receiving portions 181, 182 and the heat sink 601. Therefore, in the present embodiment, the positional deviations of the semiconductor module relative to the motor case 101 can be more effectively limited.

In the present embodiment, as shown in FIG. 15, the first and second special terminals 881, 882 are provided at the lower side part of the front surface 522, which is adjacent to the bottom surface 523. Furthermore, as a modification of the present embodiment, the first special terminal 881 or the second special terminal 882 may be placed at the upper side part of the front surface 522, which is adjacent to the top surface 524, or may be placed generally at the middle part (the vertical center part) of the front surface 522 between the top surface 524 and the bottom surface 523. That is, the first and second special terminals 881, 882 may be placed at any locations in the top surface side direction (i.e., the direction of the z-axis) between the bottom surface 523 and the top surface 524 in the front surface 522.

(Tenth Embodiment)

A drive apparatus according to a tenth embodiment of the present invention will be described with reference to FIG. 16. In the tenth embodiment, the projecting directions (projecting surfaces) of the special terminals relative to the encapsulation body and the locations of the engaging portions of the motor case are different from those of the second embodiment.

Figure 16:
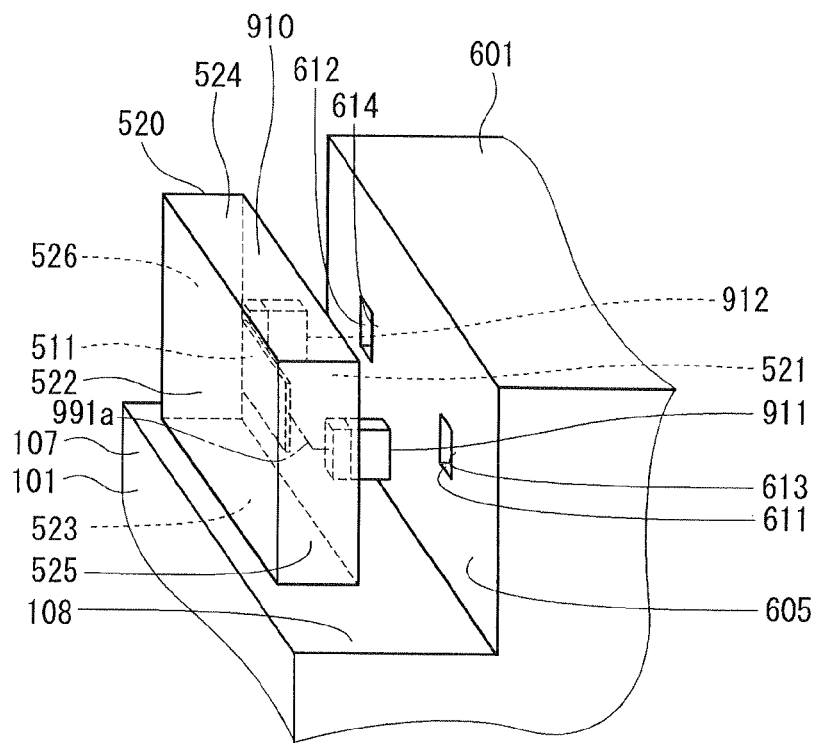
FIG. 16 is a schematic diagram showing a semiconductor module and a motor case of a drive apparatus according to a tenth embodiment of the present invention.
Figure 16:
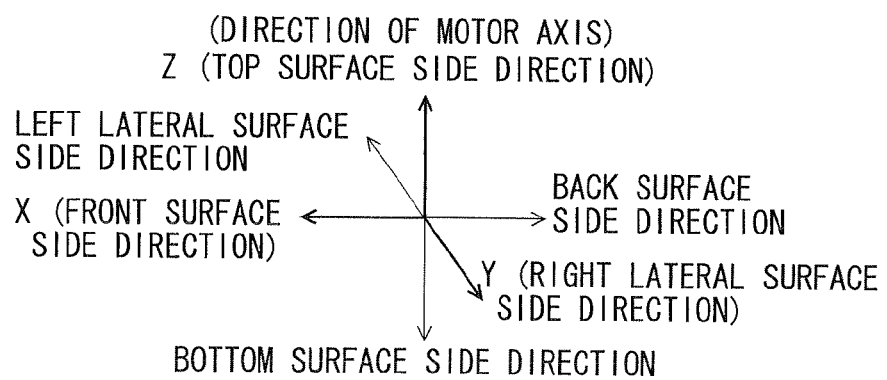

FIG. 16 schematically shows the semiconductor module 910 and the portion of the motor case 101 before the installation of the semiconductor module 910 to the motor case 101. In the tenth embodiment, similar to the above embodiments, six semiconductor modules are installed to the motor case 101. The semiconductor module 910 is one of these six semiconductor modules, and the other five semiconductor modules (not shown) are constructed in the manner similar to that of the semiconductor module 910.

The semiconductor module 910 includes two special terminals 911, 912, which are embedded in the encapsulation body 520. Each of the special terminals 911, 912 is configured into the rectangular column form. The special terminals 911, 912 are held in the encapsulation body 520 such that an end part of each of the special terminals 911, 912 projects from the back surface 521 of the encapsulation body 520. The special terminals 911, 912 are arranged one after another along an imaginary straight line in the right lateral surface side direction (i.e., the direction of the y-axis) at the back surface 521 while a predetermined distance is provided between the special terminal 911 and the special terminal 912. Furthermore, the special terminals 911, 912 are electrically insulated from the semiconductor chip 511.

Grooves 611, 612 are formed in the side wall surface 605 of the heat sink 601. Each of the grooves 611, 612 is formed to correspond with the location of the corresponding special terminal 911, 912 and the shape of the projecting end part of the corresponding special terminal 911, 912 at the time of installing the semiconductor module 910 to the motor case 101.

A cross-sectional area of each of the grooves 111, 112 in the imaginary plane (the xy plane), which is parallel to the side wall surface 605, is slightly larger than or generally the same as a cross-sectional area of the end part of the corresponding one of the special terminals 911, 912 in the same imaginary plane (the xy plane) upon the installation of the semiconductor module 910. With this construction, when the semiconductor module 910 is installed to the motor case 101 by inserting the special terminals 911, 912 into the grooves 611, 612, the special terminals 911, 912 are engaged with the grooves 611, 612, respectively. The corresponding portions of the heat sink 601, at which the grooves 611, 612 are formed, serve as engaging portions. These engaging portions are indicated as the engaging portions 613, 614, respectively, in FIG. 16.

In the present embodiment, the engagement between the special terminal 911, which projects from the back surface 521 of the encapsulation body 520, and groove 611 (the engaging portion 613) and the engagement between the special terminal 912, which projects from the back surface 521 of the encapsulation body 520, and groove 612 (the engaging portion 614) limit the positional deviations of the semiconductor module 910 relative to the motor case 101 in the right lateral surface direction and the left lateral surface direction (i.e., the direction of the y-axis). Furthermore, in the present embodiment, the engagement between the special terminal 911 and the groove 611 and the engagement between the special terminal 912 and the groove 612 can also limit the positional deviations of the semiconductor module 910 relative to the motor case 101 in the bottom surface side direction and the top surface side direction (i.e., the direction of the z-axis). Furthermore, in the present embodiment, the semiconductor module 910 is placed such that the back surface 521 contacts the side wall surface 605 of the heat sink 601. Therefore, the heat sink 601 can limit the positional deviation of the semiconductor module 910 relative to the motor case 101 in the back surface side direction.

With reference to FIG. 16, the special terminals 911, 912 are arranged one after another along an imaginary straight line in the right lateral surface side direction (i.e., the direction of the y-axis) at the back surface 521 while a predetermined distance is provided between the special terminal 911 and the special terminal 912. As a modification of the present embodiment, it is conceivable to arrange the special terminals 911, 912 in another way, which is other than the arranging of the special terminals 911, 912 along the imaginary straight line that extends in the right lateral surface side direction (i.e., the direction of the y-axis). Specifically, the special terminal 911 and the special terminal 912 may be displaced from each other in the top surface side direction (i.e., the direction of the z-axis) relative to the back surface 521.

In the present embodiment, the semiconductor module 910 includes the two special terminals 911, 912. Alternatively, the semiconductor module 910 may include only one of these two special terminals 911, 912.

(Eleventh Embodiment)

A drive apparatus according to an eleventh embodiment of the present invention will be described with reference to FIGS. 17A and 17B. In the eleventh embodiment, the shapes of the special terminals and the shapes of the grooves formed in the heat sink are different from those of the tenth embodiment.

Figure 17A:
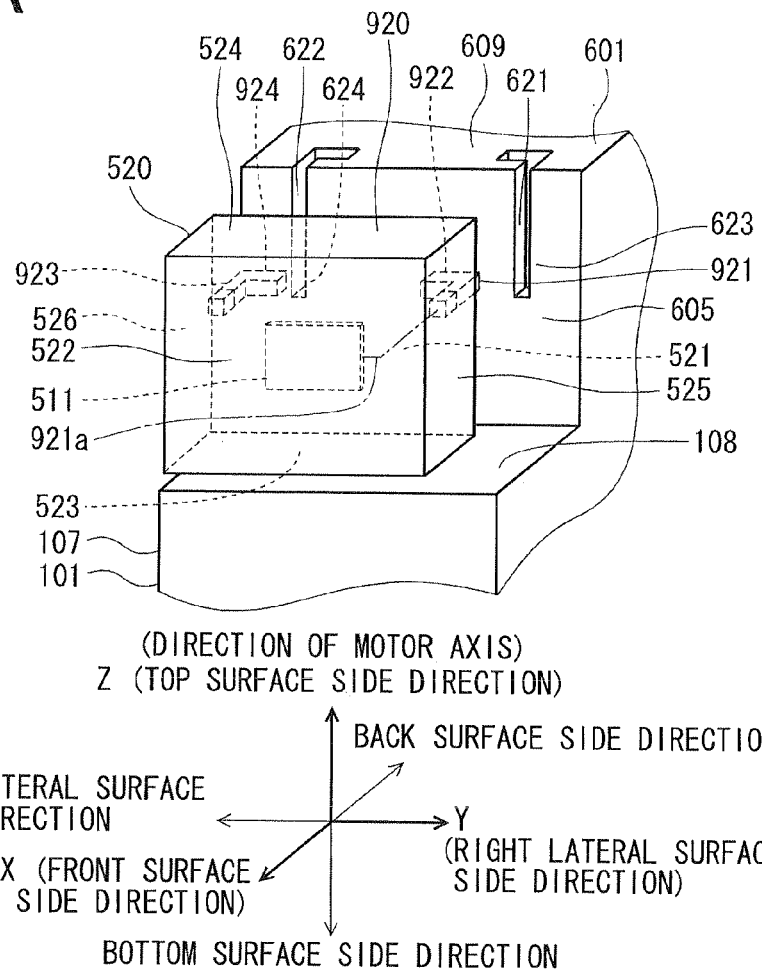
FIG. 17A is a schematic diagram showing a semiconductor module and a motor case of a drive apparatus according to an eleventh embodiment of the present invention.

FIG. 17A schematically shows the semiconductor module 920 and the portion of the motor case 101 before the installation of the semiconductor module 920 to the motor case 101. In the eleventh embodiment, similar to the above embodiments, six semiconductor modules are installed to the motor case 101. The semiconductor module 920 is one of these six semiconductor modules, and the other five semiconductor modules (not shown) are constructed in the manner similar to that of the semiconductor module 920.

The semiconductor module 920 includes two special terminals 921, 923, which are embedded in the encapsulation body 520. The special terminals 921, 923 are held in the encapsulation body 520 such that an end part of each of the special terminals 921, 923 projects from the back surface 521 of the encapsulation body 520. The special terminal 921 includes an extension 922, which extends from the projecting end part of the special terminal 921 in the left lateral surface side direction (see FIG. 17B). The special terminal 923 includes an extension 924, which extends from the projecting end part of the special terminal 923 in the right lateral surface side direction. That is, each of the special terminals 921, 923 is configured into a generally L-shape upon viewing the special terminal 921, 923 in the top surface side direction (i.e., the direction of the z-axis). The special terminals 921, 923 are arranged one after another along an imaginary straight line in the right lateral surface side direction (i.e., the direction of the y-axis) at the back surface 521 while a predetermined distance is provided between the special terminal 921 and the special terminal 923. Furthermore, the special terminals 921, 923 are electrically insulated from the semiconductor chip 511.

Grooves 621, 622 are formed in the side wall surface 605 of the heat sink 601. Each of the grooves 621, 622 is formed to correspond with the location of the corresponding special terminal 921, 923 and the shape of the projecting part of the corresponding special terminal 921, 923, which projects from the encapsulation body 520, at the time of installing the semiconductor module 920 to the motor case 101.

Each of the grooves 621, 622 is formed to extend in the direction of the z-axis at the side wall surface 605, and one end part of the groove 621, 622 opens to the top wall surface 609 of the heat sink 601. Here, the top wall surface 609 is generally parallel to the wall surface 108 and is placed adjacent to the end part of the side wall surface 605, which is opposite from the wall surface 108. A cross-sectional area of each of the grooves 621, 622 in an imaginary plane (the xy plane), which is parallel to the top wall surface 609, is slightly larger than or generally the same as a cross-sectional area of the projecting part of the corresponding special terminal 921, 923, which projects from the encapsulation body 520, in the same imaginary plane (the xy plane) upon the installation of the semiconductor module 920. Therefore, the cross-sectional area of each of the grooves 621, 622 is configured into the generally L-shape in the imaginary plane (the xy plane), which is parallel to the top wall surface 609.

With this construction, when the semiconductor module 920 is installed to the motor case 101 by inserting the special terminals 921, 923 into the grooves 621, 622, the special terminals 921, 923 are engaged with the grooves 621, 622, respectively. The corresponding portions of the heat sink 601, at which the grooves 621, 622 are formed, serve as engaging portions. These engaging portions are indicated as the engaging portions 623, 624, respectively, in FIG. 17A.

In the present embodiment, the engagement between the special terminal 921, which projects from the back surface 521 of the encapsulation body 520, and the groove 621 (the engaging portion 623) and the engagement between the special terminal 923, which projects from the back surface 521 of the encapsulation body 520, and the groove 622 (the engaging portion 624) limit the positional deviations of the semiconductor module 920 relative to the motor case 101 in the right lateral surface direction and the left lateral surface direction (i.e., the direction of the y-axis). Furthermore, in the present embodiment, each of the special terminals 921, 923 is configured into the generally L-shape, so that it is possible to limit the positional deviation of the semiconductor module 920 relative to the motor case 101 in the front surface side direction (i.e., the direction away from the heat sink 601 on the side where the semiconductor module 920 is placed). Furthermore, in the present embodiment, the semiconductor module 920 is placed such that the back surface 521 contacts the side wall surface 605 of the heat sink 601. Therefore, the heat sink 601 can limit the positional deviation of the semiconductor module 920 relative to the motor case 101 in the back surface side direction.

Figure 17B:
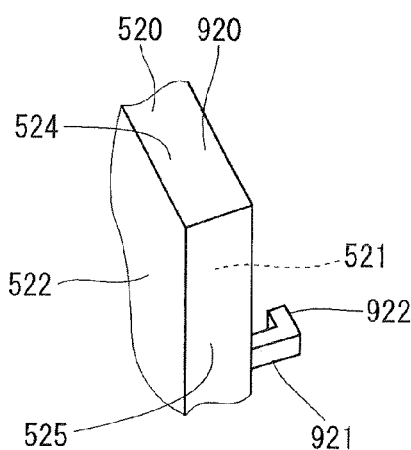
FIG. 17B is a partial perspective view showing a portion of the semiconductor module of FIG. 17A.

With reference to FIGS. 17A and 17B, the special terminals 921, 923 are arranged one after another along an imaginary straight line in the right lateral surface side direction (i.e., the direction of the y-axis) at the back surface 521 while a predetermined distance is provided between the special terminal 921 and the special terminal 923. As a modification of the present embodiment, it is conceivable to arrange the special terminals 921, 923 in another way, which is other than the arranging of the special terminals 911, 912 along the imaginary straight line that extends in the right lateral surface side direction (i.e., the direction of the y-axis). Specifically, the special terminal 921 and the special terminal 923 may be displaced from each other in the top surface side direction (i.e., the direction of the z-axis) relative to the back surface 521.

In the present embodiment, the semiconductor module 920 includes the two special terminals 921, 923. Alternatively, the semiconductor module 920 may include only one of these two special terminals 921, 923.

(Twelfth Embodiment)

A drive apparatus according to a twelfth embodiment of the present invention will be described with reference to FIGS. 18A and 18B. In the twelfth embodiment, the shapes of the special terminals and the shapes of the grooves formed in the heat sink are different from those of the eleventh embodiment.

Figure 18A:
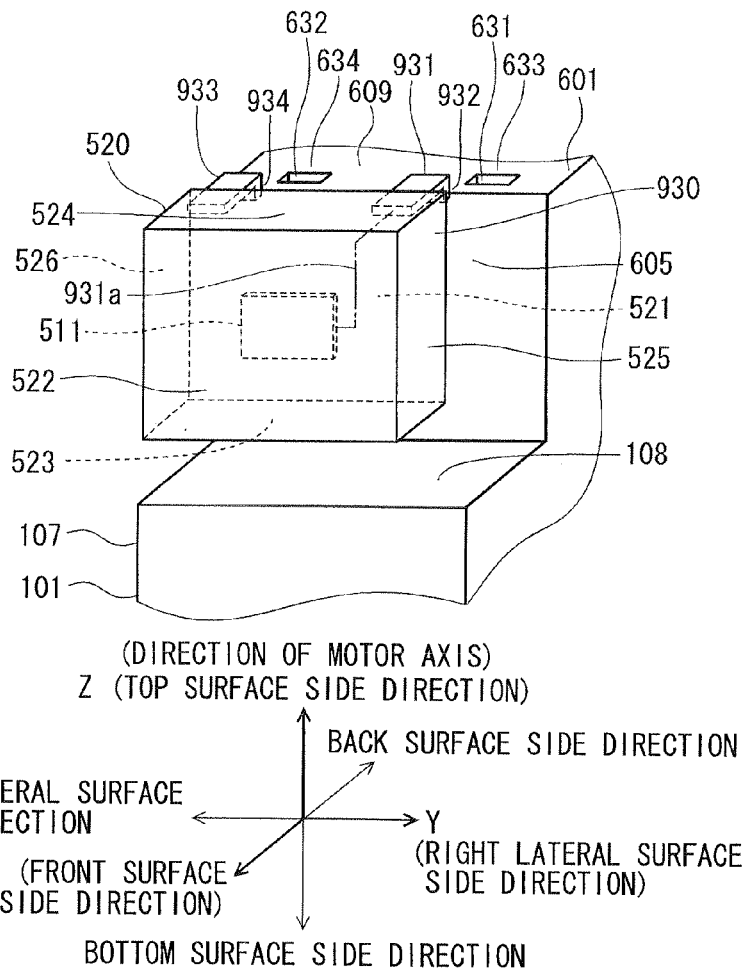
FIG. 18A is a schematic diagram showing a semiconductor module and a motor case of a drive apparatus according to a twelfth embodiment of the present invention.
Figure 18B:
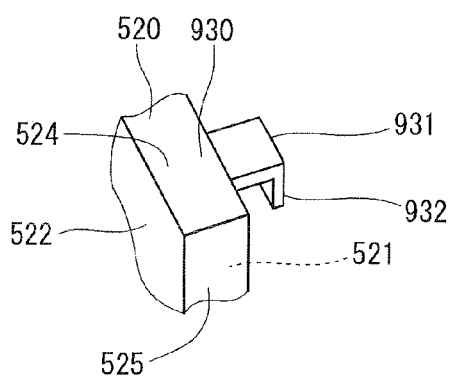
FIG. 18B is a partial perspective view showing a portion of the semiconductor module of FIG. 18A.

FIG. 18A schematically shows the semiconductor module 930 and the portion of the motor case 101 before the installation of the semiconductor module 930 to the motor case 101. In the twelfth embodiment, similar to the above embodiments, six semiconductor modules are installed to the motor case 101. The semiconductor module 930 is one of these six semiconductor modules, and the other five semiconductor modules (not shown) are constructed in the manner similar to that of the semiconductor module 930.

The semiconductor module 930 includes two special terminals 931, 933, which are embedded in the encapsulation body 520. The special terminals 931, 933 are held in the encapsulation body 520 such that an end part of each of the special terminals 931, 933 projects from the back surface 521 of the encapsulation body 520. The special terminals 931, 933 are placed at the upper end part of the back surface 521, which is adjacent to the top surface 524. The special terminal 931 includes an extension 932, which extends from a projecting end part of the special terminal 931 in the bottom surface side direction (see FIG. 18B). The special terminal 933 includes an extension 934, which extends from the projecting end part of the special terminal 933 in the bottom surface side direction. That is, each of the special terminals 931, 933 is configured into a generally L-shape upon viewing the special terminal 931, 933 in the right surface side direction (i.e., the direction of the y-axis). The special terminal 931 is placed at the right upper end part of the back surface 521, i.e., is placed at the predetermined location of the back surface 521, which is adjacent to the right lateral surface 525 and the top surface 524. The special terminal 933 is placed at the left upper end part of the back surface 521, i.e., is placed at the predetermined location of the back surface 521, which is adjacent to the left lateral surface 526 and the top surface 524. Furthermore, the special terminals 931, 933 are electrically insulated from the semiconductor chip 511.

Grooves 631, 632 are formed in the top wall surface 609 of the heat sink 601. Each of the grooves 631, 632 is formed to correspond with the location and the shape of the extension 932, 934 of the corresponding special terminal 931, 933. A cross-sectional area of each of the grooves 631, 632 in an imaginary plane (the xy plane), which is parallel to the top wall surface 609, is slightly larger than or generally the same as a cross-sectional area of the extension 932, 934 of the corresponding special terminal 931, 933 in the same imaginary plane (the xy plane) upon the installation of the semiconductor module 930.

With this construction, when the semiconductor module 930 is installed to the motor case 101 by inserting the extensions 932, 934 of the special terminals 921, 923 into the grooves 631, 632, respectively, the special terminals 921, 923 are engaged with the grooves 631, 632, respectively. The corresponding portions of the heat sink 601, at which the grooves 631, 632 are formed, serve as engaging portions. These engaging portions are indicated as the engaging portions 633, 634, respectively, in FIG. 18A.

In the present embodiment, the engagement between the extension 932 of the special terminal 931 and the groove 631 (the engaging portion 633) and the engagement between the extension 934 of the special terminal 933 and the groove 632 (the engaging portion 634) limit the positional deviations of the semiconductor module 930 relative to the motor case 101 in the right lateral surface side direction and the left lateral surface side direction (i.e., the direction of the y-axis). Furthermore, in the present embodiment, each of the special terminals 931, 933 is configured into the generally L-shape, so that it is possible to limit the positional deviation of the semiconductor module 930 relative to the motor case 101 in the front surface side direction (i.e., the direction away from the heat sink 601 on the side where the semiconductor module 930 is placed). Furthermore, in the present embodiment, the semiconductor module 930 is placed such that the back surface 521 contacts the side wall surface 605 of the heat sink 601. Therefore, the heat sink 601 can limit the positional deviation of the semiconductor module 930 relative to the motor case 101 in the back surface side direction.

In the present embodiment, the semiconductor module 930 includes the two special terminals 931, 933, which are configured into the identical shape. Alternatively, the semiconductor module 930 may include only one of these two special terminals 931, 932.

(Thirteenth Embodiment)

A drive apparatus according to a thirteenth embodiment of the present invention will be described with reference to FIG. 19. In the thirteenth embodiment, the number and the shape of the special terminal(s) are different from those of the eleventh embodiment, and also the number and the shape of the groove(s) formed in the heat sink are different from those of the eleventh embodiment.

Figure 19:
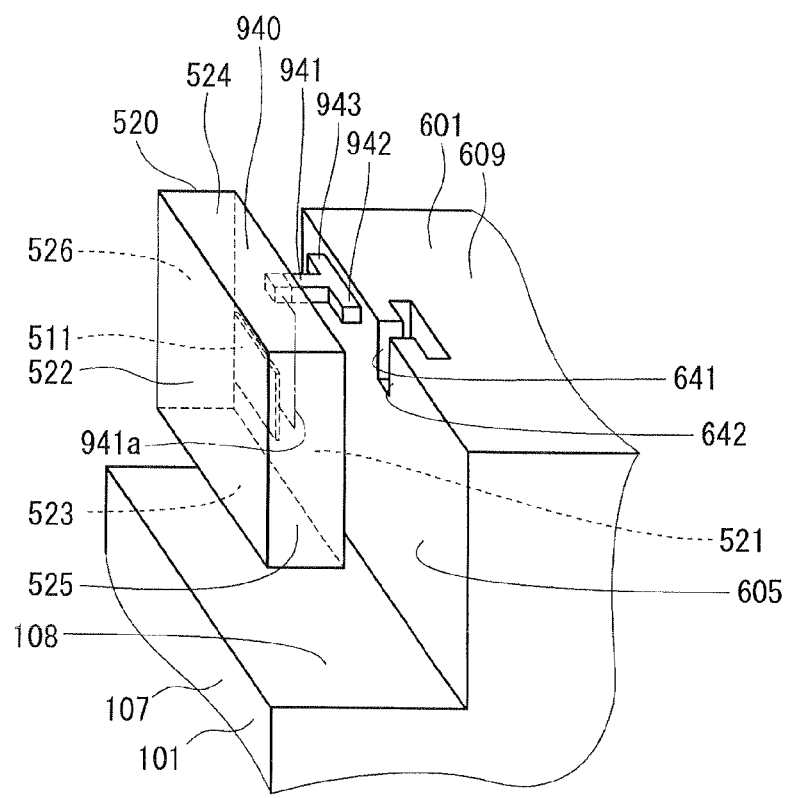
FIG. 19 is a schematic diagram showing a semiconductor module and a motor case of a drive apparatus according to a thirteenth embodiment of the present invention.
Figure 19:
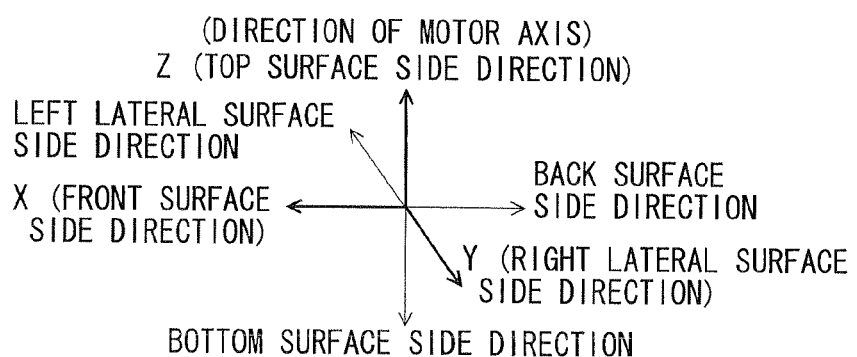

FIG. 19 schematically shows the semiconductor module 940 and the portion of the motor case 101 before the installation of the semiconductor module 940 to the motor case 101. In the thirteenth embodiment, similar to the above embodiments, six semiconductor modules are installed to the motor case 101. The semiconductor module 940 is one of these six semiconductor modules, and the other five semiconductor modules (not shown) are constructed in the manner similar to that of the semiconductor module 940.

The semiconductor module 940 includes the special terminal 941, which is embedded in the encapsulation body 520. The special terminal 941 is held in the encapsulation body 520 such that an end part of the special terminal 941 projects from the back surface 521 of the encapsulation body 520. The special terminal 941 includes an extension 942, which extends from the projecting end part of the special terminal 941 in the right lateral surface side direction. Furthermore, the special terminal 941 includes an extension 943, which extends from the projecting end part of the special terminal 941 in the left lateral surface side direction, i.e., the direction opposite from that of the extension 942. That is, the special terminal 941 is configured into a generally T-shape upon viewing the special terminal 941 in the top surface side direction (i.e., the direction of the z-axis). Furthermore, the special terminal 941 is electrically insulated from the semiconductor chip 511.

A groove 641 is formed in the side wall surface 605 of the heat sink 601. The groove 641 is formed such that the groove 641 corresponds to the location of the special terminal 941 of the semiconductor module 940 and is configured to correspond with the shape of the projecting part of the special terminal 941, which projects from the encapsulation body 520, upon the installation of the semiconductor module 940 to the motor case 101.

The groove 641 is formed to extend in the direction of the z-axis at the side wall surface 605, and one end part of the groove 641 opens to the top wall surface 609 of the heat sink 601. A cross-sectional area of the groove 641 in an imaginary plane (the xy plane), which is parallel to the top wall surface 609, is slightly larger than or generally the same as a cross-sectional area of the projecting part of the corresponding special terminal 941, which projects from the encapsulation body 520, in the same imaginary plane (the xy plane) upon the installation of the semiconductor module 940. Therefore, the cross-sectional area of the groove 641 is configured into the generally T-shape in the imaginary plane (the xy plane), which is parallel to the top wall surface 609.

With this construction, when the semiconductor module 940 is installed to the motor case 101 by inserting the special terminal 941 into the groove 641, the special terminal 941 is engaged with the groove 641. The corresponding portion of the heat sink 601, at which the groove 641 is formed, serves as an engaging portion. This engaging portion is indicated as the engaging portion 642 in FIG. 19.

In the present embodiment, the engagement between the special terminal 941, which projects from the back surface 521 of the encapsulation body 520, and the groove 641 (the engaging portion 642) limits the positional deviations of the semiconductor module 940 relative to the motor case 101 in the right lateral surface side direction and the left lateral surface side direction (i.e., the direction of the y-axis). Furthermore, in the present embodiment, the special terminal 941 is configured into the generally T-shape, so that it is possible to limit the positional deviation of the semiconductor module 940 relative to the motor case 101 in the front surface side direction (i.e., the direction away from the heat sink 601 on the side where the semiconductor module 940 is placed). Furthermore, in the present embodiment, the semiconductor module 940 is placed such that the back surface 521 contacts the side wall surface 605 of the heat sink 601. Therefore, the heat sink 601 can limit the positional deviation of the semiconductor module 940 relative to the motor case 101 in the back surface side direction.

In the present embodiment, the semiconductor module 940 includes the single special terminal 941. Alternatively, the semiconductor module 940 may include multiple special terminals 941.

(Fourteenth Embodiment)

A drive apparatus according to a fourteenth embodiment of the present invention will be described with reference to FIG. 20. The fourteenth embodiment is an example of a combination of the above embodiments.

Figure 20:
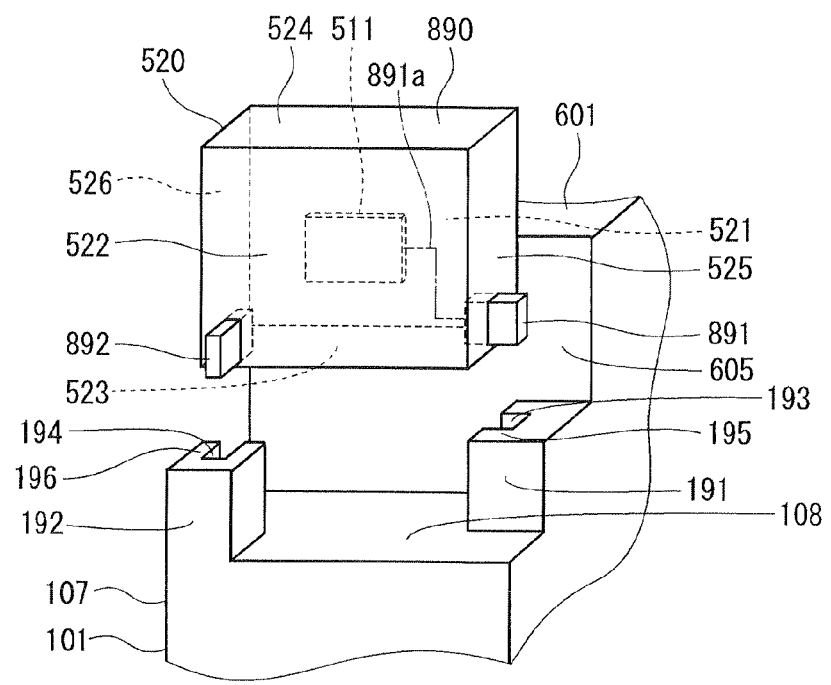
FIG. 20 is a schematic diagram showing a semiconductor module and a motor case of a drive apparatus according to a fourteenth embodiment of the present invention.
Figure 20:
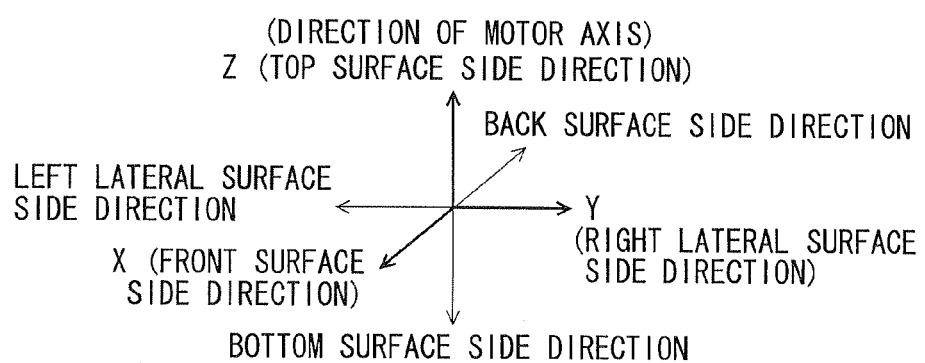

FIG. 20 schematically shows the semiconductor module 890 and the portion of the motor case 101 before the installation of the semiconductor module 890 to the motor case 101. In the fourteenth embodiment, similar to the above embodiments, six semiconductor modules are installed to the motor case 101. The semiconductor module 890 is one of these six semiconductor modules, and the other five semiconductor modules (not shown) are constructed in the manner similar to that of the semiconductor module 890.

The semiconductor module 890 includes two special terminals 891, 892, which are embedded in the encapsulation body 520. Each of the special terminals 891, 892 is configured into the rectangular column form. The special terminal 891 is held in the encapsulation body 520 such that an end part of the special terminal 891 projects from the right lateral surface 525 of the encapsulation body 520. The special terminal 892 is held in the encapsulation body 520 such that an end part of the special terminal 892 projects from the front surface 522 of the encapsulation body 520. In the present embodiment, the special terminal 891 is placed at the lower end part of the right lateral surface 525, i.e., is at the predetermined location of the right lateral surface 525, which is adjacent to the bottom surface 523. The special terminal 892 is placed at the left lower end part of the front surface 522, i.e., is placed at the predetermined location of the front surface 522, which is adjacent to the left lateral surface 526 and the bottom surface 523. Furthermore, the special terminals 891, 892 are electrically insulated from the semiconductor chip 511.

The motor case 101 includes a right terminal receiving portion 191 and a front terminal receiving portion 192, which extend from the wall surface 108 of the partition wall 107 in the direction of the z-axis. Grooves 193, 194 are formed in the right terminal receiving portion 191 and the front terminal receiving portions 192, respectively. The groove 193 is formed such that the groove 193 corresponds to the location of the special terminal 891 of the semiconductor module 890 and is configured to correspond with the shape of the projecting end part of the special terminal 891 upon the installation of the semiconductor module 890 to the motor case 101. The groove 194 is formed such that the groove 194 corresponds to the location of the special terminal 892 of the semiconductor module 890 and is configured to correspond with the shape of the projecting end part of the special terminal 892 upon the installation of the semiconductor module 890 to the motor case 101.

The right terminal receiving portion 191 and the groove 193 are configured like the right terminal receiving portion 131 and the groove 133, respectively, of the fourth embodiment. The front terminal receiving portion 192 and the groove 194 are configured like the front terminal receiving portion 141 and the groove 142, respectively, of the fifth embodiment. That is, the present embodiment is a combination of the fourth embodiment and the fifth embodiment. The portion of the right terminal receiving portion 191, at which the groove 193 is formed, serves as the engaging portion. Also, the portion of the front terminal receiving portion 192, at which the groove 194 is formed, serves as the engaging portion. These engaging portions are indicated as the engaging portions 195, 196 in FIG. 20.

In the present embodiment, the engagement between the special terminal 891 and the groove 193 (the engaging portion 195) limits the positional deviations of the semiconductor module 890 relative to the motor case 101 in the front surface side direction and in the back surface side direction (i.e., the direction of the x-axis). The engagement between the special terminal 892 and the groove 194 (the engaging portion 196) limits the positional deviations of the semiconductor module 890 relative to the motor case 101 in the right lateral surface side direction and the left lateral surface side direction (i.e., the direction of the y-axis). Furthermore, the front terminal receiving portion 192 and the heat sink 601 limit the positional deviations of the semiconductor module 890 relative to the motor case 101 in the front surface side direction and the back surface side direction (i.e., the direction of the x-axis).

According to the present embodiment, as discussed above, the right terminal receiving portion 191 (the engaging portion 195) and the front terminal receiving portion 192 (the engaging portion 196) are formed in the motor case 101 for the semiconductor module 890. Therefore, the right terminal receiving portion 191 and the front terminal receiving portion 192 can limit the positional deviations of the semiconductor module 890 in the predetermined directions, respectively. Therefore, according to the present embodiment, the advantages of the fourth embodiment and of the fifth embodiment can be achieved.

The first to fifteenth embodiment discussed above may be modified as follows.

In the fourteenth embodiment, the feature of the fourth embodiment and the feature of the fifth embodiment are combined. As a modification of the above embodiments, like the fourteenth embodiment, the features of any two or more of the above embodiments can be freely combined as long as such a combination is applicable. Furthermore, the present invention is not limited to the above embodiments, in which the one or two special terminals are provided to the corresponding one surface of the encapsulation body. For instance, three or more special terminals may be provided to the corresponding one surface of the encapsulation body, if desired.

Furthermore, the shape of each special terminal is not limited to the rectangular column form. For example, the shape of each special terminal may be a solid cylindrical form, a polygonal column form, a semispherical form or any other three dimensional form. However, in such a case, the shape of the engaging portion, which corresponds to the special terminal, needs to be configured to correspond with the shape of the special terminal.

Furthermore, in the above embodiments, the number of the terminal lines of the coil wires, which are wound around the salient poles of the stator, is set to be six. However, the number of the terminal lines of the coil wires is not limited to six. As another modification of the above embodiment(s), the number of the terminal lines may be changed to any other appropriate number other than six. In such a case, the number of the semiconductor modules installed in the drive apparatus, should correspond with the number of the terminal lines.

Furthermore, as another modification of the above embodiment(s), the special terminal(s) may be electrically connected the semiconductor chip, as indicated by a line 530a in FIG. 7. This electrical connection of FIG. 7 may be equally applicable to the embodiments of FIGS. 8 to 20 as indicated by a corresponding line 811a, 831a, 841a, 861a, 871a, 881a, 991a, 921a, 931a, 941a, 891a. In such a case, the special terminal(s) can be used as the terminal(s), which implements the additional function of electrically connecting between the semiconductor chip and the other component, in addition to the function of limiting of the positional deviations of the semiconductor module. In this way, the special terminal may be used as, for example, a ground terminal of the semiconductor chip, which is grounded.

Alternatively, the ground terminal of the semiconductor chip, which projects from the encapsulation body, may be used as a special terminal, which limits the positional deviations of the semiconductor module. In such a case, an engaging portion, which corresponds to, for example, the location and the shape of the ground terminal, should be formed in the motor case to limit the positional deviations of the semiconductor module.

Furthermore, as another modification of the above embodiment(s), a portion of the semiconductor chip of the semiconductor module may be externally exposed from the encapsulation body. Specifically, the portion of the semiconductor chip may be exposed from the back surface of the encapsulation body. In such a case, the back surface of the semiconductor module (the portion of the semiconductor chip) and the side wall surface of the heat sink may contact with each other while a dielectric heat releasing sheet is interposed between the back surface of the semiconductor module and the side wall surface of the heat sink made of, for example, metal. In this way, the heat of the semiconductor chip can be effectively released. Furthermore, at this time, the dielectric heat releasing sheet can serve as a member (or a component), which constitutes a portion of the encapsulation body.

Furthermore, as another modification of the above embodiment(s), the extending direction of the heat sink 601 may be different from the direction of the motor axis. That is, the side wall surfaces of the heat sink may be tilted relative to the motor axis or may extend in a direction perpendicular to the motor axis. Furthermore, the angle defined between the side wall surface of the heat sink and the wall surface of the motor case (the wall surface, which is opposed to the bottom surface of the semiconductor module) is not limited to the right angle and may be changed to any other angle other than the right angle. Furthermore, a leaf spring may be provided as an urging member, which urges the semiconductor module against the side wall surface of the heat sink to establish sufficient contact between the back surface of the semiconductor module and the side wall surface of the heat sink.

Furthermore, as another modification of the above embodiment(s), the heat sink may be eliminated. In the case of the present invention, the positional deviations of the semiconductor module can be limited by the special terminal(s) of the semiconductor module and the engaging portion(s) of the motor case.

In the above embodiment(s), the imaginary perpendicular line, which is perpendicular to the planar chip surface of the semiconductor chip, extends generally perpendicular to the motor axis, i.e., the central axis of the shaft of the motor. In another modification of the above embodiment(s), the semiconductor module may be placed such that the imaginary perpendicular line, which is perpendicular to the planar chip surface of the semiconductor chip, is tilted relative to the motor axis or is parallel to the motor axis. Furthermore, the position of each semiconductor module is not limited to that of the above embodiments where the semiconductor module is placed in the motor case in the direction of the motor axis. For instance, each semiconductor module may be placed radially outward of the motor case.

In the above embodiments, the drive apparatus is used for the EPS system. However, the drive apparatus of the present invention may be implemented in any other system or apparatus, which is other than the EPS system.

(Fifteenth Embodiment)

A fifteenth embodiment of the present invention will be described with reference to FIGS. 21 to 23.

The present embodiment differs from the above embodiments with respect to the structure for installing six semiconductor modules 1501-1506 to the motor case 101, and the remaining structure of the drive apparatus 1 is substantially the same as the structure of the drive apparatus 1 discussed with reference to the first embodiment. Specifically, in the present embodiment, the special terminal(s) of the above embodiments is not used to install each semiconductor module 1501-1506 to the motor case 101. In the following description, the structure for installing the semiconductor modules 1501-1506 to the motor case 101 will be mainly discussed, and the other remaining structure of the drive apparatus 1, which is similar to that of the first embodiment, will not be described for the sake of simplicity. Also, the components, which are similar to those of the first embodiment, will be indicated by the same reference numerals.

Since the semiconductor modules 1501-1506 have generally the same structure, only the semiconductor module 1501 will be described particularly with reference to FIG. 23. In FIG. 23, only the semiconductor module 1501 is shown while the winding wire terminals 508, the control terminals 509 and the capacitor terminals 510 are eliminated for the sake of simplicity.

As discussed above with reference to the first embodiment, the heat sink (the heat releasing portion) 601 extends from the partition wall 107 of the motor case 101 in the direction of the central axis of the shaft 401. Each of the wall surfaces 108, which is placed adjacent to the corresponding one of the side wall surfaces 605 of the heat sink 601, is formed to extend in the radial direction of the motor case 101 (see FIG. 22). Each of the side wall surfaces 605 is formed to extend in the direction generally perpendicular to the corresponding wall surface 108. The side wall surface 605 is formed as the planar surface.

Figure 23:
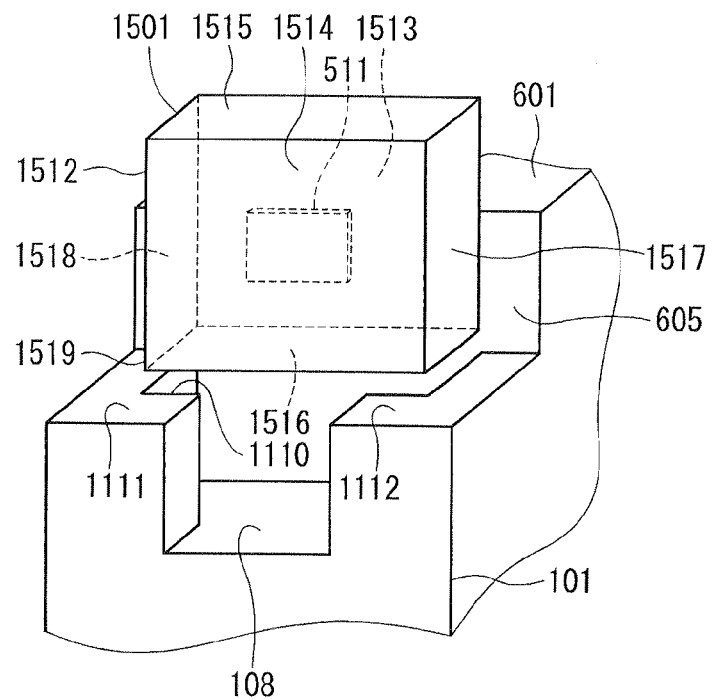
FIG. 23 is a schematic diagram showing a semiconductor module and a motor case of the drive apparatus of the fifteenth embodiment.
Figure 23:
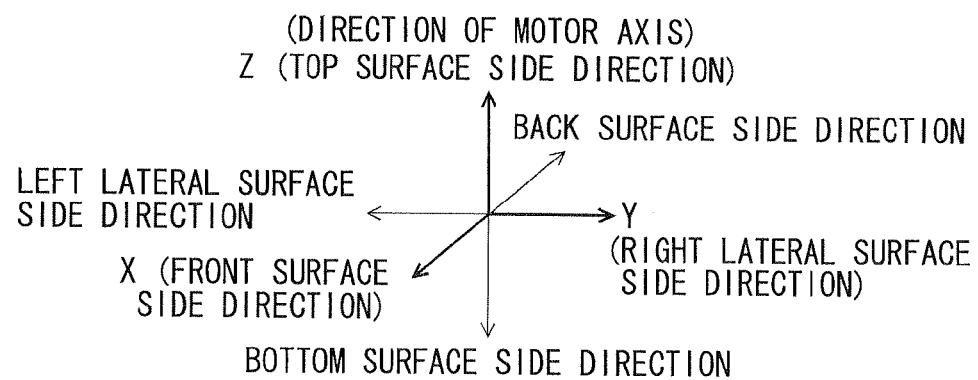

With reference to FIG. 23, similar to the above embodiments, it is assumed for the descriptive purpose that the wall surface 108 is the wall surface in the xy plane in the xyz coordinate space, which is defined by the x-axis, the y-axis and the z-axis, and the corresponding adjacent side wall surface 605 extends from the wall surface 108 in the direction of the z-axis. That is, the wall surface 605 is the wall surface in the yz plane. In the present embodiment, the central axis of the shaft 401 of the motor 30 is generally parallel to the z-axis. The wall surface 605 is generally parallel to the central axis of the shaft 401.

Figure 21:
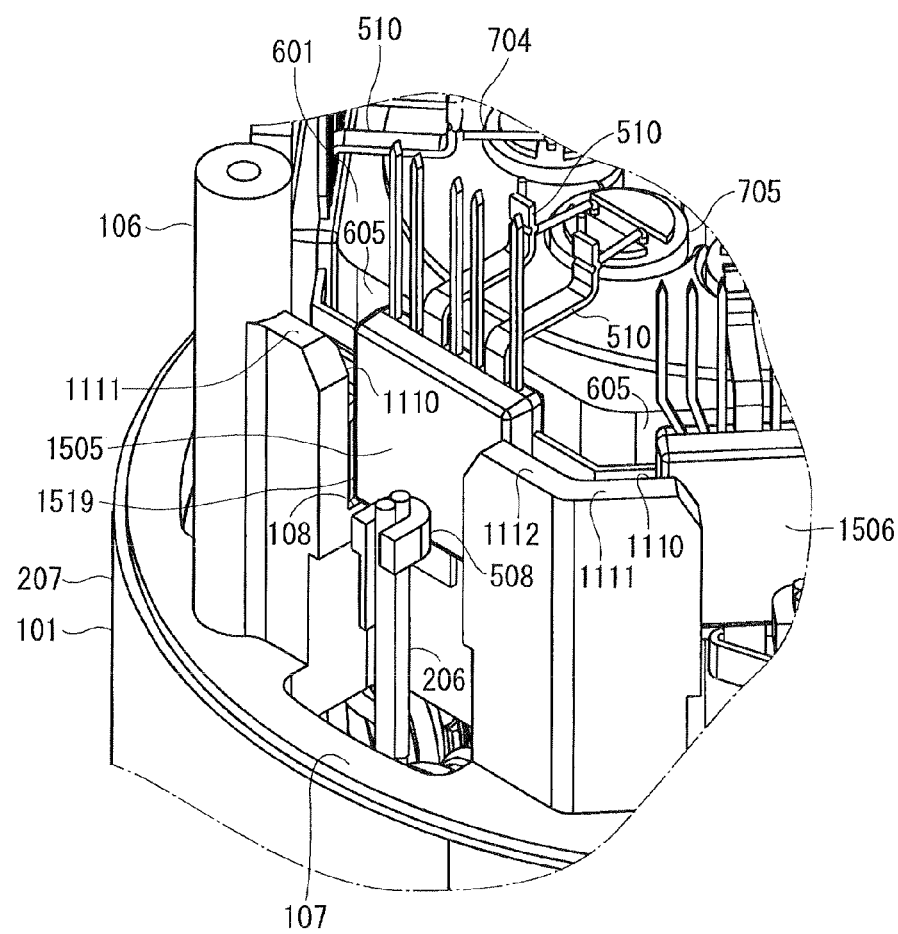
FIG. 21 is a partial enlarged perspective view of a drive apparatus according to a fifteenth embodiment of the present invention.
Figure 22:
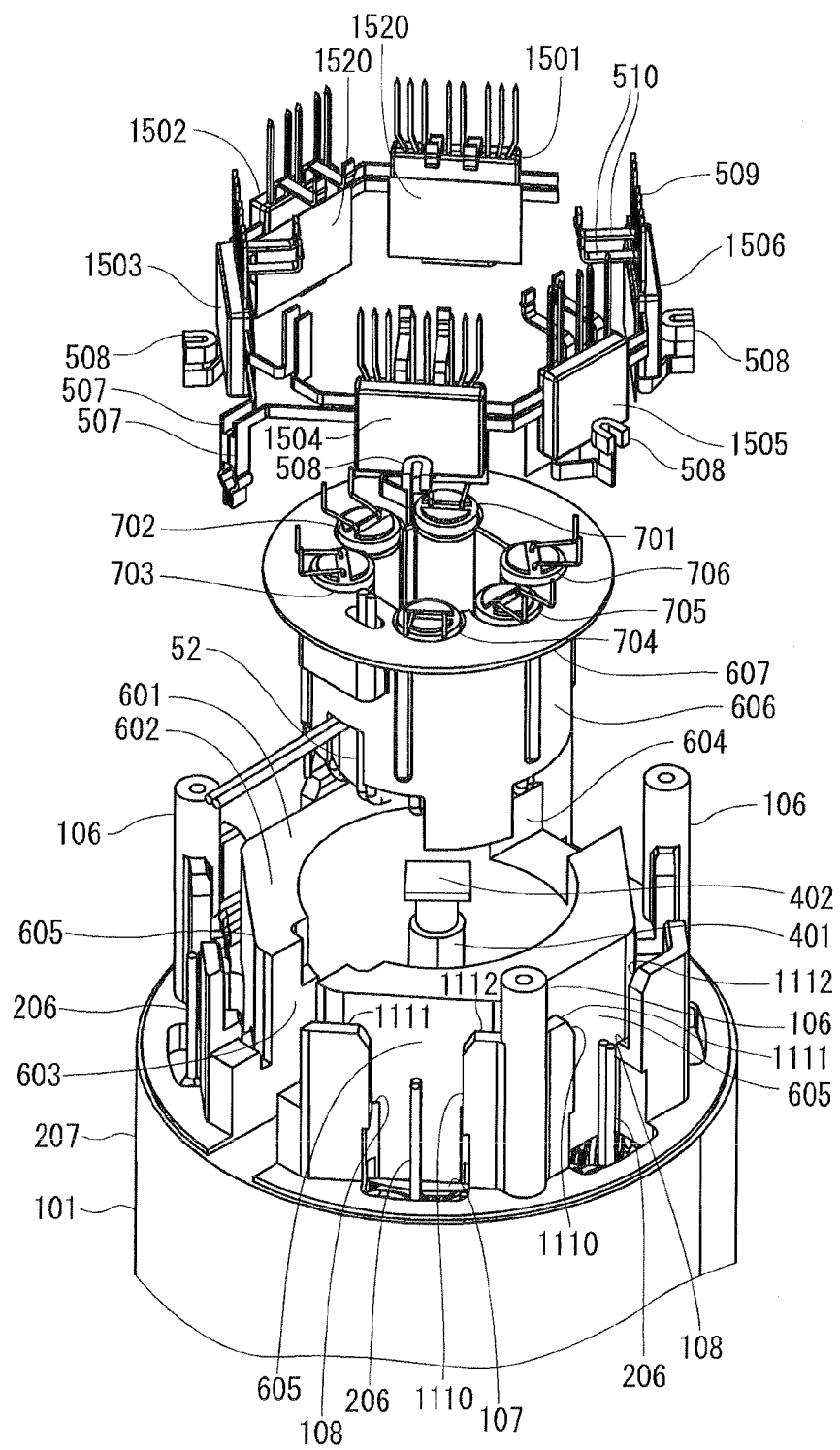
FIG. 22 is an exploded perspective view of the drive apparatus according to the fifteenth embodiment.

With reference to FIGS. 21-23, a case side engaging portion 1110 is formed in the wall surface 108 of the motor case 101. In the present embodiment, the case side engaging portion 1110 includes first and second case side engaging portions 1111, 1112. In FIG. 22, the wall surface 108 does not continuously extend between the first case side engaging portion 1111 and the second case side engaging portion 1112. That is, the wall surface 108 is provided to radially extend between the first case side engaging portion 1111 and the side wall surface 605, and the other wall surface 108 is provided to radially extend between the second case side engaging portion 1112 and the side wall surface 605. However, it should be noted that the wall surface 108 may continuously extend between the first case side engaging portion 1111 and the second case side engaging portion 1112. In other words, the wall surface 108 may be formed in a manner similar to that of FIG. 1. In FIG. 23 as well as the subsequent embodiments, it is assumed that the wall surface 108 continuously extends between the first case side engaging portion 1111 and the second case side engaging portion 1112.

Next, the semiconductor module 1501 of the present embodiment will be described in detail. In the semiconductor module 1501, a portion of the semiconductor chip 511 is covered with the encapsulation body 1512, which is made of the resin material. The encapsulation body 1512 is configured into a generally planar parallelepiped form. The encapsulation body 1512 includes six surfaces, i.e., the back surface (the heat releasing surface) 1513, the front surface 1514, the bottom surface 1516, the top surface 1515, the right lateral surface 1517 and the left lateral surface 1518. The back surface 1513 is one of two opposed largest surfaces among the six surfaces of the encapsulation body 1512. The back surface 1513 is configured such that the back surface 1513 is generally parallel to the chip surface of the semiconductor chip 511.

The semiconductor module 1501 includes a module side engaging portion 1519. The module side engaging portion 1519 is configured to have a shape that corresponds to the shape of the case side engaging portion 1110 formed in the motor case 101. In the present embodiment, the outer surfaces of the semiconductor module 1501 serve as the module side engaging portion 1519.

With this construction, when the semiconductor module 1501 is placed on the motor case 101, the case side engaging portion 1110 and the module side engaging portion 1519 are engaged with each other. Thereby, the semiconductor module 1501 is positioned in the predetermined position on the motor case 101.

In this embodiment, a portion of the semiconductor chip 511 is externally exposed from the encapsulation body 1512. Therefore, the semiconductor module 1501 contacts the side wall surface 605 such that a dielectric heat releasing sheet 1520 is interposed between the back surface 1513 and the side wall surface 605 (see FIG. 22). In FIG. 23, the heat releasing sheet 1520 is eliminated for the sake of simplicity.

The advantages, which can be achieved by providing the case side engaging portion 1110 to the motor case 101 and the module side engaging portion 1519 to the semiconductor module 1501-1506 in the drive apparatus 1 of the present embodiment, will be described. Hereinafter, similar to the above embodiments, for the descriptive purpose, the direction from the back surface 1513 toward the front surface 1514 at the encapsulation body 1512 will be referred to as the front surface side direction, and the direction from the front surface 1514 toward the back surface 1513 at the encapsulation body 1512 will be referred to as the back surface side direction (also referred to as a heat releasing surface side direction).

Furthermore, the direction from the left lateral surface 1518 toward the right lateral surface 1517 at the encapsulation body 1512 will be referred to as the right lateral surface side direction, and the direction from the right lateral surface 1517 toward the left lateral surface 1518 at the encapsulation body 1512 will be referred to as the left lateral surface side direction.

In the drive apparatus 1 of the present embodiment, the case side engaging portion 1110 is formed in the motor case 101, and the module side engaging portion 1519, which corresponds to the case side engaging portion 1110, is formed in the semiconductor module 1501-1506. The case side engaging portion 1110 and the module side engaging portion 1519 are formed such that the semiconductor module 1501-1506 is positioned relative to the motor case 101 by engaging the module side engaging portion 1519 to the case side engaging portion 1110.

In this way, with reference to FIG. 23, the engagement between the case side engaging portion 1110 and the module side engaging portion 1519 limits the positional deviations of the semiconductor module 1501 relative to the motor case 101 in the front surface side direction and the back surface side direction (i.e., in the direction of the x-axis) as well as the right lateral surface side direction and the left lateral surface side direction (i.e., in the direction of the y-axis). Furthermore, the semiconductor module 1501-1506 can be positioned in place without using the jig, which supports the semiconductor module 1501-1506, so that the assembling process of the drive apparatus 1 can be simplified, and thereby the manufacturing costs can be reduced.

In the drive apparatus 1 of the present embodiment, the motor case 101 has the side wall surface 605, which extends from the motor case 101, and the case side engaging portion 1110 and the module side engaging portion 1519 are engaged with each other. Thereby, the semiconductor module 1501-1506 is placed such that the back surface 1513 of the semiconductor module 1501-1506 contacts the side wall surface 605. In this way, the positional deviation of the semiconductor module 1501-1506 relative to the motor case 101 toward the side wall surface 605 side is limited.

In the drive apparatus 1 of the present embodiment, the back surface 1513 of the semiconductor module 1501-1506 is made generally planar to correspond with the side wall surface 605, which is generally planar, and the semiconductor module 1501-1506 is placed such that the back surface 1513 contacts the side wall surface 605. In this way, the heat, which is generated from the semiconductor module 1501-1506, is released through the side wall surface 605. Thereby, the increase in the temperature of the semiconductor chip 511 beyond the allowable temperature can be limited.

In the drive apparatus 1 of the present embodiment, the surface area of the back surface 1513 of the semiconductor module 1501-1506 is set to be the largest among the surfaces of the semiconductor module 1501-1506. In this way, the contact surface area between the semiconductor module 1501-1506 and the side wall surface 605 is made large. Thus, the heat releasing effect for releasing the heat of the semiconductor module 1501-1506 can be promoted.

(Sixteenth Embodiment)

Figure 24:
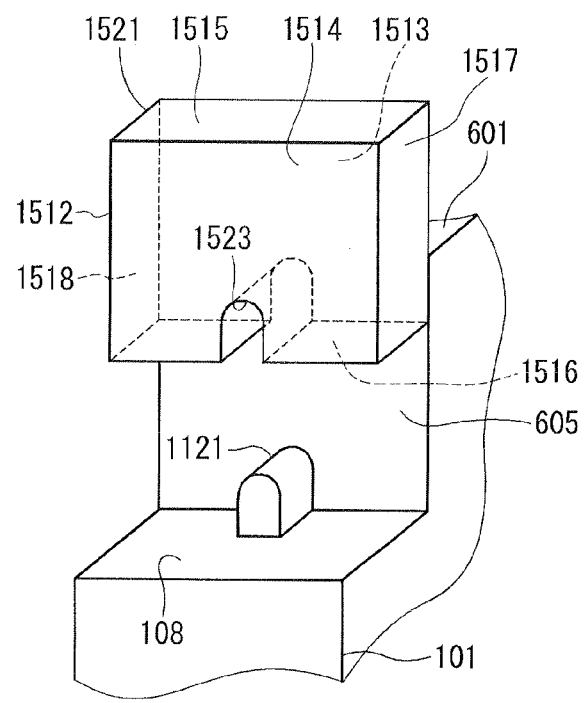
FIG. 24 is a schematic diagram showing a semiconductor module and a motor case of a drive apparatus according to a sixteenth embodiment of the present invention.
Figure 24:
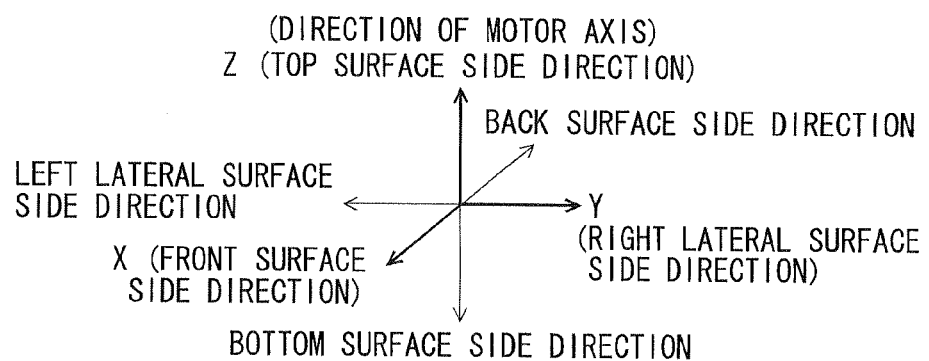

A drive apparatus according to a sixteenth embodiment of the present invention will be described with reference to FIG. 24. In the present embodiment, the shape of the case side engaging portion, which is formed in the motor case, and the shape of the module side engaging portion, which is formed in the semiconductor module, are different from those of the fifteenth embodiment. In the following description, the semiconductor chip 511 is not shown for the sake of simplicity.

In the present embodiment, the module side engaging portion 1523 is formed in the bottom surface 1516 of the semiconductor module 1521 (more specifically, of the encapsulation body 1512) and is configured into a grooved recess (also, referred to as a groove or recess), which extends from the front surface 1514 toward the back surface (i.e., the heat releasing surface) 1513 at the semiconductor module. The grooved recess, which extends from the front surface 1514 of the semiconductor module 1521, may reach or may not reach the back surface 1513 of the semiconductor module 1521. In this particular embodiment, the module side engaging portion 1523, which is formed as the grooved recess, extends from the front surface 1514 of the semiconductor module 1521 and reaches the back surface 1513 of the semiconductor module 1521. At the wall surface 108 of the motor case 101, the case side engaging portion 1121 is formed as a projection, which extends from the side wall surface 605 in the front surface side direction. The case side engaging portion 1121 is configured to correspond with the module side engaging portion 1523.

In this way, according to the present embodiment, the engagement between the case side engaging portion 1121 and the module side engaging portion 1523 limits the positional deviations of the semiconductor module 1521 relative to the motor case 101 in the right lateral surface side direction and the left lateral surface side direction.

(Seventeenth Embodiment)

Figure 25:
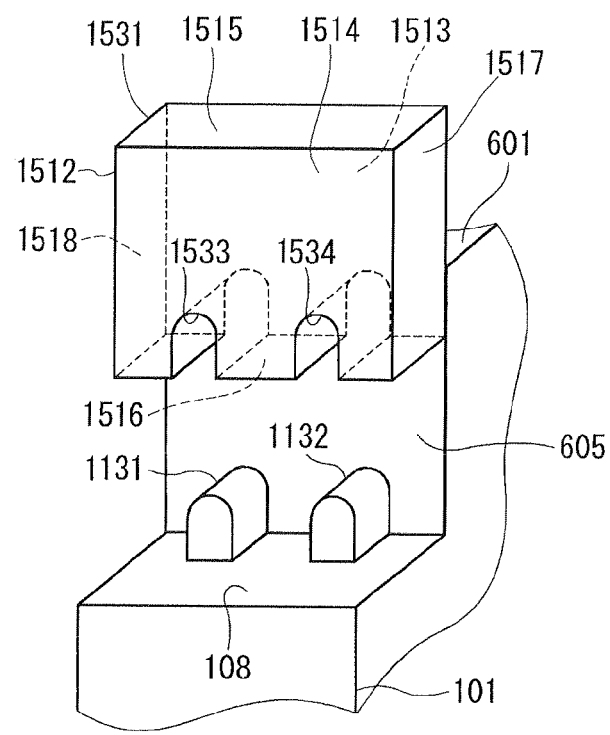
FIG. 25 is a schematic diagram showing a semiconductor module and a motor case of a drive apparatus according to a seventeenth embodiment of the present invention.
Figure 25:
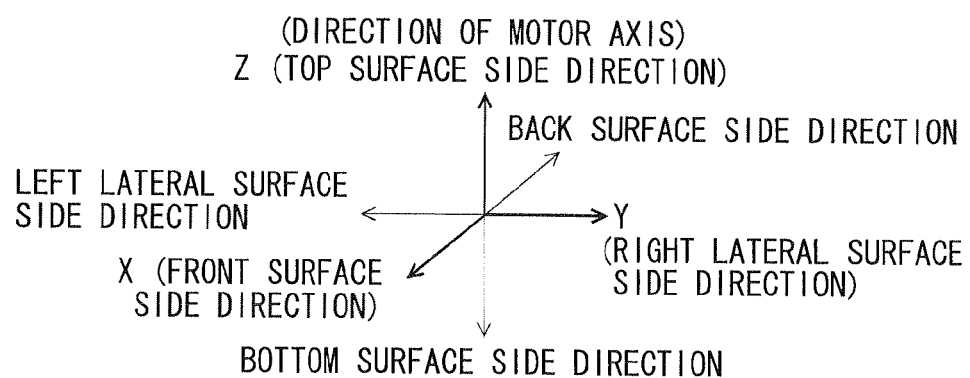

A drive apparatus according to a seventeenth embodiment of the present invention will be described with reference to FIG. 25. The present embodiment differs from the sixteenth embodiment in that a plurality of case side engaging portions is provided in the motor case, and a plurality of module side engaging portions is provided in the semiconductor module.

In the present embodiment, two module side engaging portions 1533, 1534 are formed in the bottom surface 1516 of the semiconductor module 1531. The module side engaging portion 1533 is placed on the left lateral surface side of the center of the semiconductor module 1531, and the module side engaging portion 1534 is placed on the right lateral surface side of the center of the semiconductor module 1531. At the wall surface 108 of the motor case 101, two motor case side engaging portions 1131, 1132 are formed as two projections, respectively, which extend from the side wall surface 605 in the front surface side direction. The case side engaging portions 1131, 1132 are configured to correspond with the module side engaging portions 1533, 1534, respectively.

In this way, according to the present embodiment, the engagement between each of the case side engaging portions 1131, 1132 and the corresponding one of the module side engaging portions 1533, 1534 effectively limits the positional deviations of the semiconductor module 1531 relative to the motor case 101 in the right lateral surface side direction and the left lateral surface side direction, like the sixteenth embodiment.

(Eighteenth Embodiment)

Figure 26:
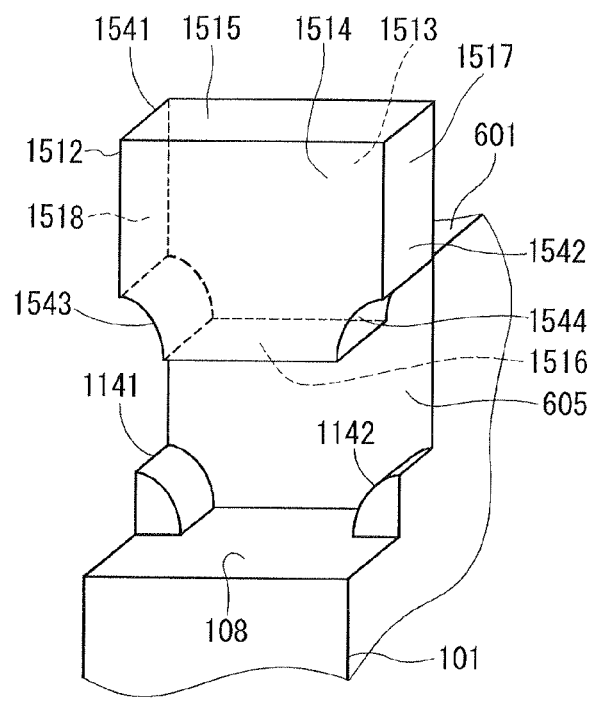
FIG. 26 is a schematic diagram showing a semiconductor module and a motor case of a drive apparatus according to an eighteenth embodiment of the present invention.
Figure 26:
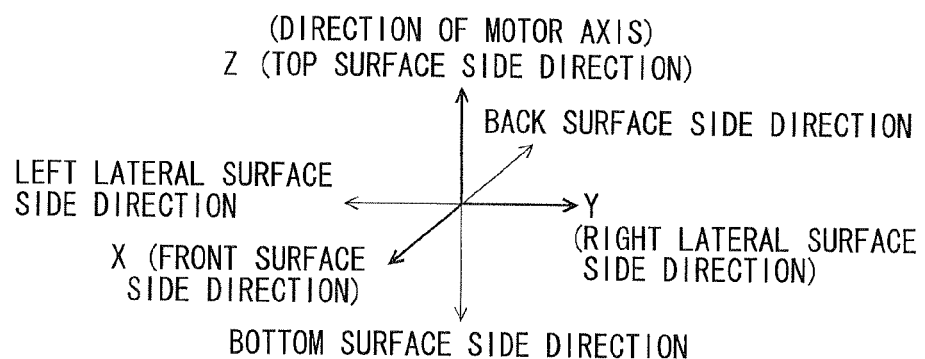

A drive apparatus according to an eighteenth embodiment of the present invention will be described with reference to FIG. 26. In the present embodiment, the shapes of the case side engaging portions, which are formed in the motor case, and the shapes of the module side engaging portions, which are formed in the semiconductor module, are different from those of the seventeenth embodiment.

In the present embodiment, two module side engaging portions 1543, 1544 are formed in the bottom surface 1516 of the semiconductor module 1541 (more specifically, of the encapsulation body 1512). The module side engaging portion 1543 is configured into a notched recess, which is formed by cutting a corner defined between the bottom surface 1516 and the left lateral surface 1518 of the semiconductor module 1541. Similarly, the module side engaging portion 1544 is configured into a notched recess, which is formed by cutting a corner defined between the bottom surface 1516 and the right lateral surface 1517 of the semiconductor module 1541. At the wail surface 108 of the motor case 101, two motor case side engaging portions 1141, 1142 are formed as two projections, respectively, which extend from the side wall surface 605 in the front surface side direction. The case side engaging portions 1141, 1142 are configured to correspond with the module side engaging portions 1543, 1544, respectively.

In this way, according to the present embodiment, the engagement between each of the case side engaging portions 1141, 1142 and the corresponding one of the module side engaging portions 1543, 1544 effectively limits the positional deviations of the semiconductor module 1541 relative to the motor case 101 in the right lateral surface side direction and the left lateral surface side direction, like the seventeenth embodiment.

(Nineteenth Embodiment)

Figure 27:
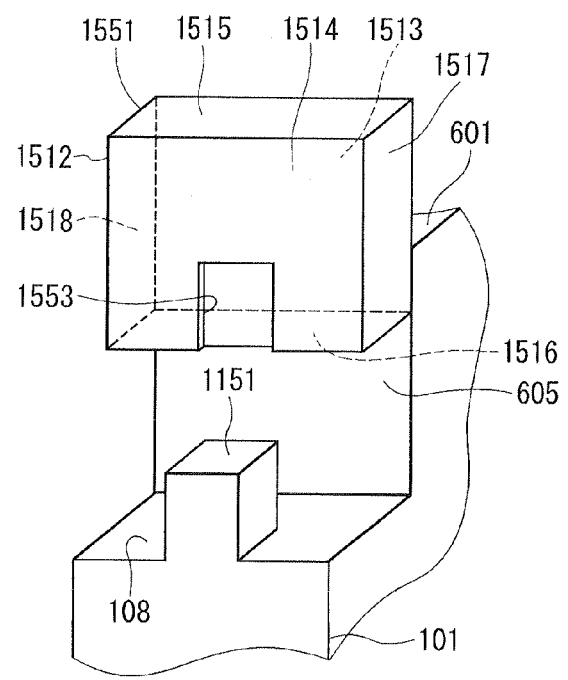
FIG. 27 is a schematic diagram showing a semiconductor module and a motor case of a drive apparatus according to a nineteenth embodiment of the present invention.
Figure 27:
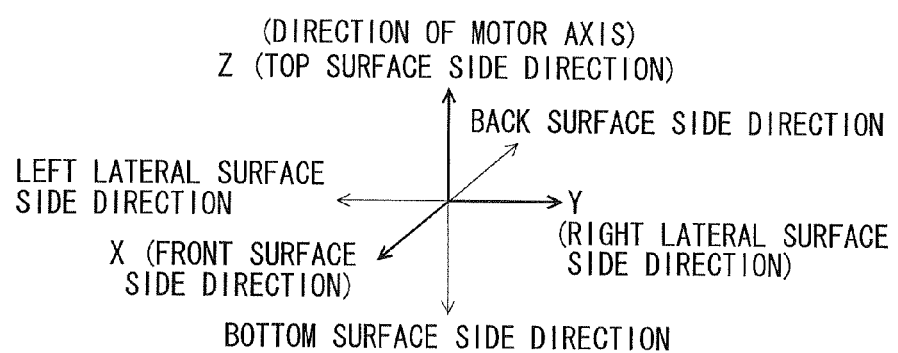

A drive apparatus according to a nineteenth embodiment of the present invention will be described with reference to FIG. 27. In the present embodiment, the shape of the case side engaging portion, which is formed in the motor case, and the shape of the module side engaging portion, which is formed in the semiconductor module, are different from those of the sixteenth embodiment.

In the present embodiment, the module side engaging portion 1553 is formed in the bottom surface 1516 of the semiconductor module 1551 (more specifically, of the encapsulation body 1512) and is configured into a grooved recess, which extends from the front surface 1514 toward the back surface (i.e., the heat releasing surface) 1513 at the semiconductor module 1551. In the present embodiment, the module side engaging portion 1553 extends from the front surface 1514 of the semiconductor module 1551 but does not reach the back surface 1513 of the semiconductor module 1551. At the wall surface 108 of the motor case 101, the case side engaging portion 1151 is formed as a projection, which is spaced from the side wall surface 605 in the front surface side direction and extends in the front surface side direction. That is, a gap is formed between the case side engaging portion 1151 and the side wall surface 605. The case side engaging portion 1151 is configured to correspond with the module side engaging portion 1553.

In this way, according to the present embodiment, when the module side engaging portion 1553 engages the case side engaging portion 1151, the semiconductor module 1551 is placed such that the semiconductor module 1551 is received in the gap between the case side engaging portion 1151 and the side wall surface 605. Thereby, it is possible to limit the positional deviations of the semiconductor module 1551 relative to the motor case 101 in the front surface side direction and the back surface side direction in addition to the right lateral surface side direction and the left lateral surface side direction discussed in the sixteenth embodiment.

(Twentieth Embodiment)

Figure 28:
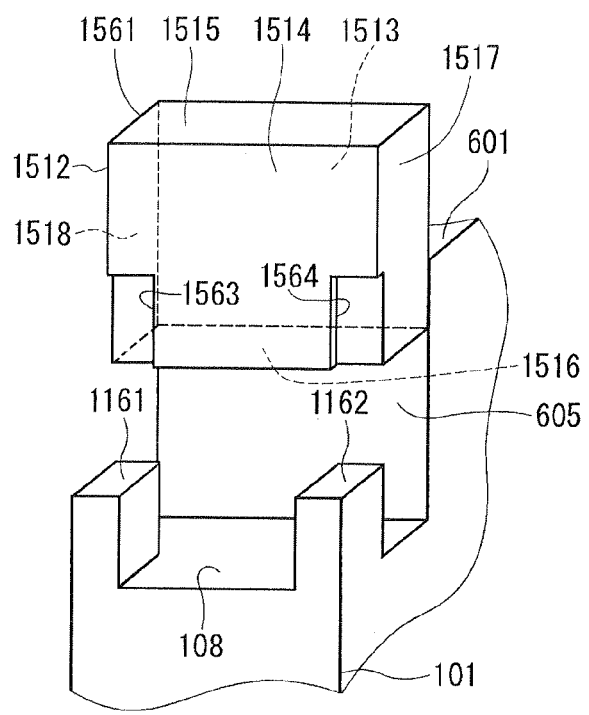
FIG. 28 is a schematic diagram showing a semiconductor module and a motor case of a drive apparatus according to a twentieth embodiment of the present invention.
Figure 28:
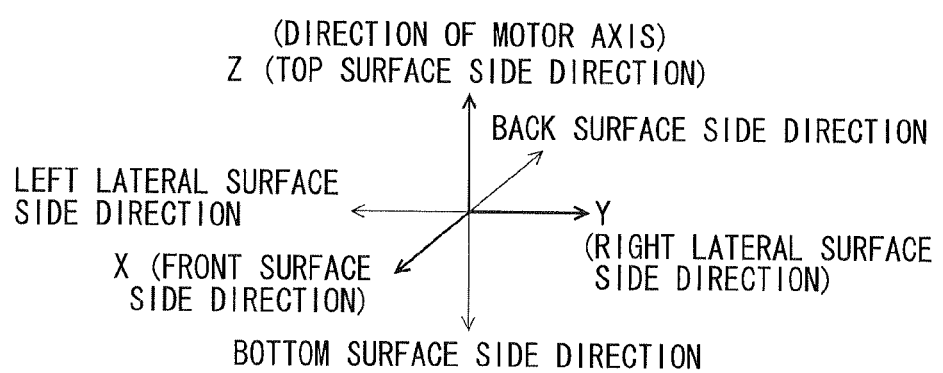

A drive apparatus according to a twentieth embodiment of the present invention will be described with reference to FIG. 28. The present embodiment differs from the nineteenth embodiment in that a plurality of case side engaging portions is provided in the motor case, and a plurality of module side engaging portions is provided in the semiconductor module.

In the present embodiment, two module side engaging portions 1563, 1564 are formed in the bottom surface 1516 of the semiconductor module 1561 (more specifically, of the encapsulation body 1512). The module side engaging portion 1563 is formed to extend in the left lateral surface 1518 of the semiconductor module 1561, and the module side engaging portion 1564 is formed to extend in the right lateral surface 1517 of the semiconductor module 1561. Two case side engaging portions 1161, 1162 are formed in the motor case 101 to correspond with the module side engaging portions 1563, 1564, respectively.

In this way, according to the present embodiment, the engagement between each of the case side engaging portions 1161, 1162 and the corresponding one of the module side engaging portions 1563, 1564 effectively limits the positional deviations of the semiconductor module 1561 relative to the motor case 101 in the front surface side direction, the back surface side direction, the right lateral surface side direction and the left lateral surface side direction, like the nineteenth embodiment.

(Twenty-First Embodiment)

Figure 29A:
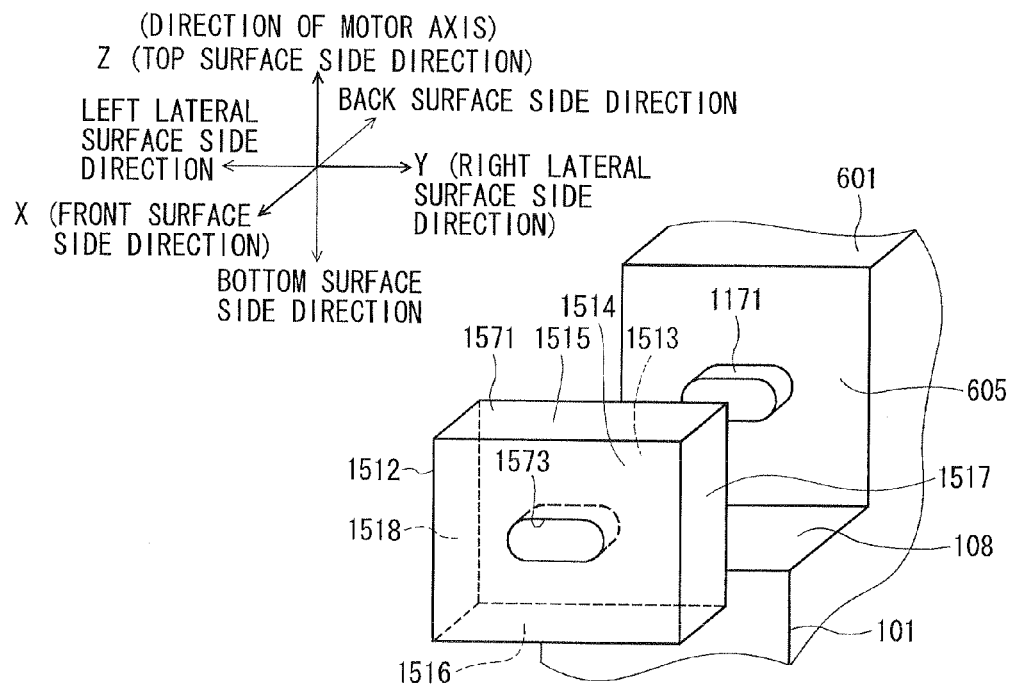
FIG. 29A is a schematic diagram showing a semiconductor module and a motor case of a drive apparatus according to a twenty-first embodiment of the present invention.

A drive apparatus according to a twenty-first embodiment of the present invention will be described with reference to FIG. 29A. In the present embodiment, the shape of the case side engaging portion, which is formed in the motor case, and the shape of the module side engaging portion, which is formed in the semiconductor module, are different from those of the sixteenth embodiment.

In the present embodiment, the module side engaging portion 1573 is formed as a through hole, which extends through the semiconductor module 1571 (more specifically, the encapsulation body 1512) from the back surface (i.e., the heat releasing surface) 1513 to the front surface 1514 thereof. The module side engaging portion 1573 is placed at the location, which is displaced from the semiconductor chip 511 (see FIG. 23). For instance, the location of the semiconductor chip 511 may be displaced from the center position toward the top surface 1515 or the bottom surface 1516 of the encapsulation body 1512 to implement the present embodiment. Alternatively, the location and/or the size of the module side engaging portion 1573 may be changed. For instance, the module side engaging portion 1573 may be displaced toward the top surface 1515 or the bottom surface 1516 of the encapsulation body 1512. Furthermore, in the present embodiment, a cross-sectional area of this through hole has an ellipsoidal shape. In the motor case 101, the case side engaging portion 1171 is formed as a projection, which extends from the side wall surface 605 in the front surface side direction. The case side engaging portion 1171 is configured to correspond with the module side engaging portion 1573.

In this way, according to the present embodiment, the engagement between the case side engaging portion 1171 and the module side engaging portion 1573 limits the positional deviations of the semiconductor module 1571 in the right lateral surface side direction, the left lateral surface side direction, the top surface side direction and the bottom surface side direction. Furthermore, in the present embodiment, the module side engaging portion, which is formed as the through hole, has the ellipsoidal shape in its cross section. Therefore, in addition to the positional deviations of the semiconductor module 1571 in the right lateral surface side direction, the left lateral surface side direction, the top surface side direction and the bottom surface side direction, it is possible to limit rotation of the semiconductor module 1571 about the axis of the case side engaging portion 1171.

Figure 29B:
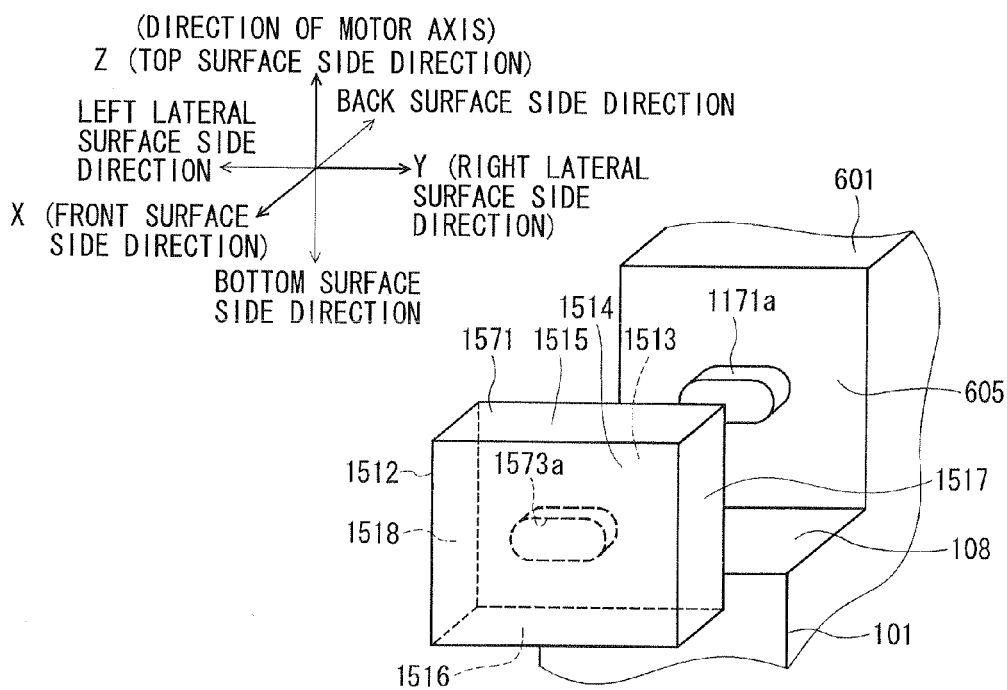
FIG. 29B is a schematic diagram showing a modification of the drive apparatus shown in FIG. 29A.

In the present embodiment, the module side engaging portion 1573 is formed as the through hole, which extends through the semiconductor module 1571 from the back surface 1513 to the front surface 1514 thereof. Alternatively, as shown in FIG. 29B, in place of the module side engaging portion 1573 of FIG. 29A, it is possible to have a module side engaging portion 1573*a* that is formed as a recess, which is recessed in the back surface 1513 of the semiconductor module 1571 toward the front surface 1514 of the semiconductor module 1571 without passing through the encapsulation body 1512. In such a case, the case side engaging portion 1171 of FIG. 29A may be modified to a case side engaging portion 1171*a* of FIG. 29B, which has a shorter projecting length in comparison to the case side engaging portion 1171 of FIG. 29A to correspond with the module side engaging portion 1573*a*. Even with this modification, it is possible to achieve the advantages discussed above.

(Twenty-Second Embodiment)

A drive apparatus according to a twenty-second embodiment of the present invention will be described with reference to FIG. 30A. In the present embodiment, the shapes and the number of the case side engaging portions, which are formed in the motor case, and the shapes and the number of the module side engaging portions, which are formed in the semiconductor module, are different from those of the twenty-first embodiment.

In the present embodiment, two module side engaging portions 1583, 1584 are formed as through holes, respectively, which extend through the semiconductor module 1581 (more specifically, the encapsulation body 1512) from the front surface 1514 to the back surface (i.e., the heat releasing surface) 1513 thereof while avoiding the location of the semiconductor chip 511 like the twenty-first embodiment. The module side engaging portion 1583 is placed on the left lateral surface side of the center of the semiconductor module 1581, and the module side engaging portion 1584 is placed on the right lateral surface side of the center of the semiconductor module 1581. In the present embodiment, a cross-sectional area of each of these through holes has a generally circular shape. In the motor case 101, two case side engaging portions 1181, 1182 are formed as projections, which extend from the side wall surface 605 in the front surface side direction. The case side engaging portions 1181, 1182 are formed to correspond with the module side engaging portions 1583, 1584, respectively.

In a case where a single through hole, which has a generally circular cross section, is formed in the semiconductor module, the semiconductor module may possibly be rotated about an axis of a corresponding case side engaging portion formed in the motor case.

However, in the present embodiment, the plurality of module side engaging portions, each of which is configured as the through hole having the generally circular cross section, is formed in the semiconductor module 1581. In this way, according to the present embodiment, the engagement between each of the case side engaging portions 1181, 1182 and the corresponding one of the module side engaging portions 1583, 1584 can limit the rotation of the semiconductor module 1581 about the axis of any of the module side engaging portions 1181, 1182. Thereby, the advantages similar to those of the twenty-first embodiment can be achieved.

Figure 30A:
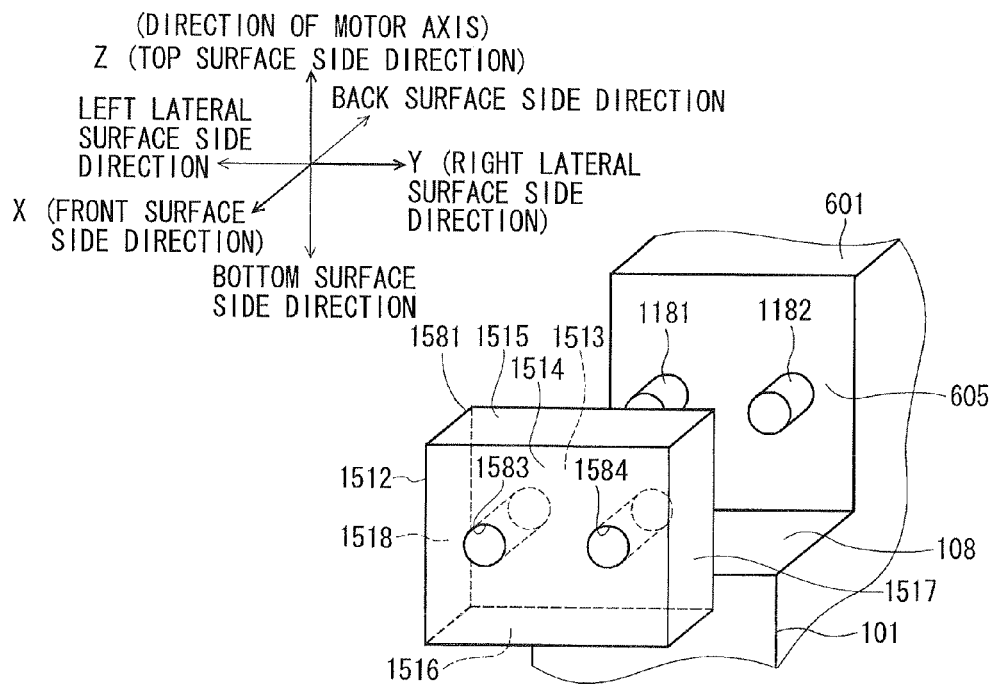
FIG. 30A is a schematic diagram showing a semiconductor module and a motor case of a drive apparatus according to a twenty-second embodiment of the present invention.
Figure 30B:
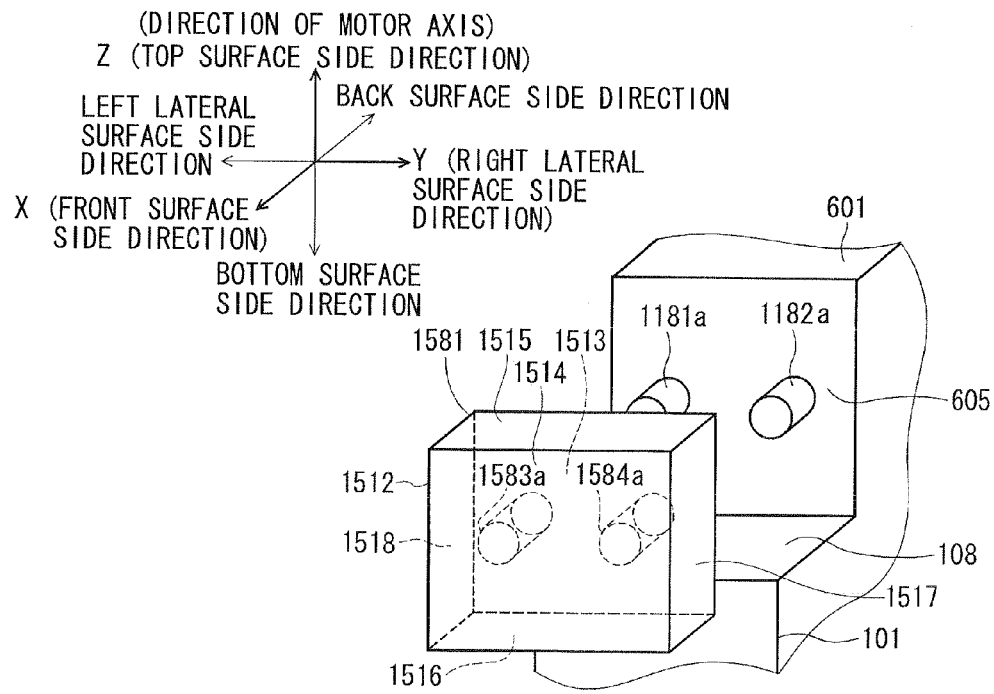
FIG. 30B is a schematic diagram showing a modification of the drive apparatus shown in FIG. 30A.

In the present embodiment, the module side engaging portions 1583, 1584 of FIG. 30A are formed as the through holes, which extend through the semiconductor module 1581 from the back surface 1513 to the front surface 1514 thereof. The module side engaging portions 1583, 1584 of FIG. 30A may be replaced with module side engaging portions 1583*a*, 1584*a* of FIG. 30B, each of which is formed as a recess that is recessed in the back surface 1513 of the semiconductor module 1581 toward the front surface 1514 of the semiconductor module 1581 without passing through the semiconductor module 1581. In such a case, the case side engaging portions 1181, 1182 of FIG. 30A may be modified to case side engaging portions 1181*a*, 1182*a* of FIG. 30B, which has a shorter projecting length in comparison to the case side engaging portions 1181, 1182 of FIG. 30A to correspond with the module side engaging portions 1583*a*, 1584*a*. Even with this modification, it is possible to achieve the advantages discussed above.

(Twenty-Third Embodiment)

Figure 31:
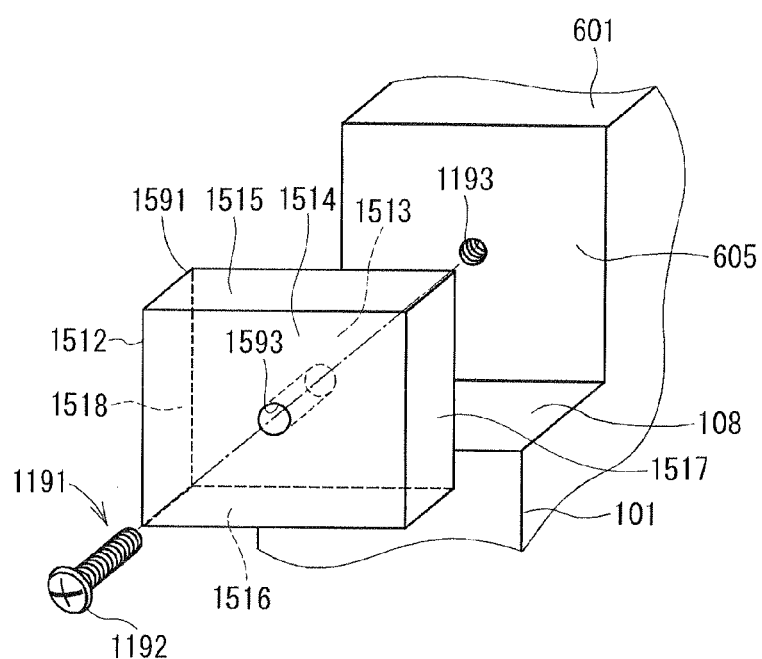
FIG. 31 is a schematic diagram showing a semiconductor module and a motor case of a drive apparatus according to a twenty-third embodiment of the present invention.
Figure 31:
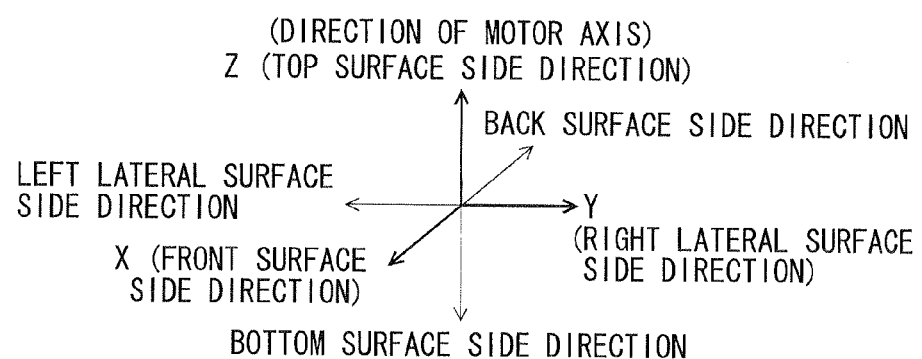

A drive apparatus according to a twenty-third embodiment of the present invention will be described with reference to FIG. 31. In the present embodiment, the structure of the case side engaging portion, which is formed in the motor case, is different from that of the twenty-first embodiment.

In the present embodiment, the module side engaging portion 1593 is formed as a through hole, which extends through the semiconductor module 1591 from the front surface 1514 to the back surface (i.e., the heat releasing surface) 1513 thereof. The case side engaging portion 1191 is composed of a threaded screw hole 1193, which is formed in the side wall surface 605, and a screw (a rod member) 1192, which is threadably engaged with the threaded screw hole 1193.

The screw 1192 is received through the through hole of the semiconductor module 1591, which serves as the module side engaging portion 1593, and is threadably engaged with the threaded screw hole 1193, which is formed in the side wall surface 605, so that the semiconductor module 1591 is fixed to the motor case 101. Thereby, the positional deviations of the semiconductor module 1591 relative to the motor case 101 can be reliably limited.

(Twenty-Fourth Embodiment)

Figure 32:
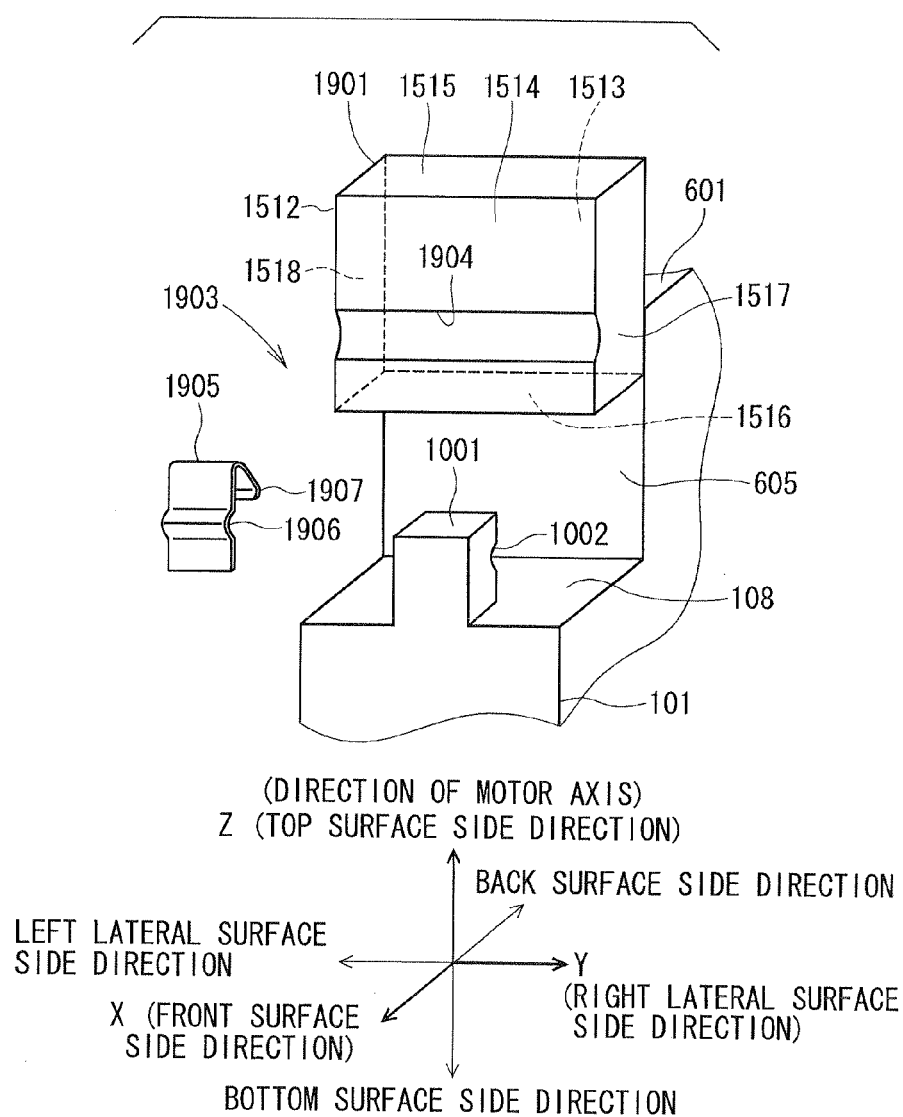
FIG. 32 is a schematic diagram showing a semiconductor module and a motor case of a drive apparatus according to a twenty-fourth embodiment of the present invention.

A drive apparatus according to a twenty-fourth embodiment of the present invention will be described with reference to FIG. 32. In the present embodiment, the structure of the case side engaging portion, which is formed in the motor case, and the structure of the module side engaging portion, which is formed in the semiconductor module, are different from those of the nineteenth embodiment.

In the present embodiment, the module side engaging portion 1903 is composed of an urging member 1905 and a grooved recess 1904, which is formed in the front surface 1514 of the semiconductor module 1901 (more specifically, of the encapsulation body 1512) and extends from the left lateral surface 1518 to the right lateral surface 1517 of the semiconductor module 1901. The urging member 1905 is a leaf spring and has a first curved portion 1907 and a second curved portion 1906.

At the wall surface 108 of the motor case 101, the case side engaging portion 1001 is formed as a projection, which is spaced from the side wall surface 605 in the front surface side direction and extends in the front surface side direction. That is, a gap is formed between the case side engaging portion 1001 and the side wall surface 605. The case side engaging portion 1001 has a recess 1002, which corresponds to the second curved portion 1906 of the urging member 1905.

At the time of installing the semiconductor module 1901 to the motor case 101, the semiconductor module 1901 is placed in the gap, which is defined between the case side engaging portion 1001 and the side wall surface 605. Next, the urging member 1905 is fitted between the semiconductor module 1901 and the case side engaging portion 1001. At this time, the second curved portion 1906 of the urging member 1905 is engaged with the recess 1002, and the grooved recess 1904 of the semiconductor module 1901 is urged by the first curved portion 1907 of the urging member 1905 toward the back surface direction to urge the back surface (i.e., the heat releasing surface) 1513 of the semiconductor module 1901 against the side wall surface 605 of the heat sink 601.

Therefore, the engagement between the case side engaging portion 1001 and the module side engaging portion 1903 limits the positional deviations of the semiconductor module 1901 relative to the motor case 101 in the front surface direction, the back surface side direction, the top surface side direction, the bottom surface side direction, the left lateral surface side direction and the right lateral surface side direction.

(Twenty-Fifth Embodiment)

Figure 33:
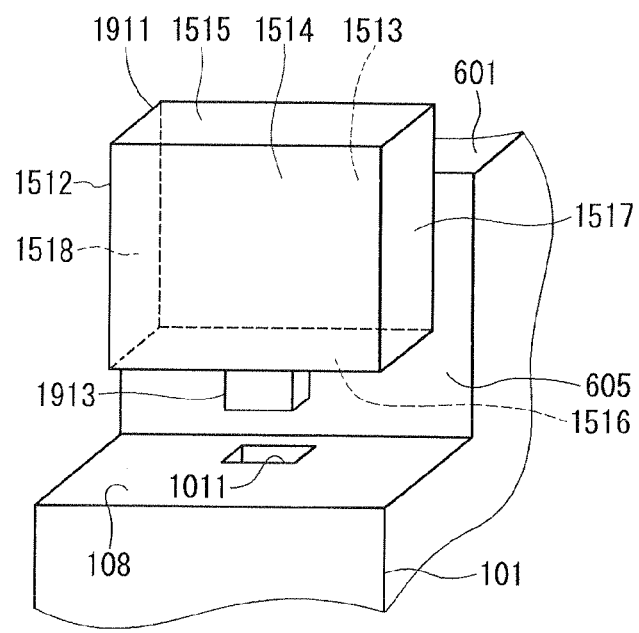
FIG. 33 is a schematic diagram showing a semiconductor module and a motor case of a drive apparatus according to a twenty-fifth embodiment of the present invention.
Figure 33:
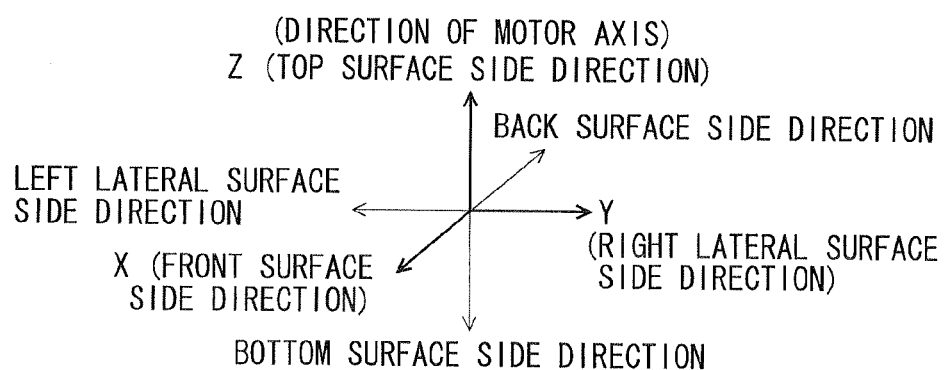

A drive apparatus according to a twenty-fifth embodiment of the present invention will be described with reference to FIG. 33. In the present embodiment, the shape of the case side engaging portion, which is formed in the motor case, and the shape of the module side engaging portion, which is formed in the semiconductor module, are reversed from those of the sixteenth embodiment.

That is, in the present embodiment, the module side engaging portion 1913 is formed as a projection, which projects from the bottom surface 1516 of the semiconductor module 1911 (more specifically, of the encapsulation body 1512), and the case side engaging portion 1011 is formed as a grooved recess in the wall surface 108 of the motor case 101.

In this way, the advantages similar to those of the sixteenth embodiment can be achieved in the present embodiment.

The fifteenth to twenty-fifth embodiments may be modified as follows.

In the sixteenth embodiment to the twenty-second embodiment and the twenty-fourth embodiment, the case side engaging portion(s) formed in the motor case is made as the projection(s), and the module side engaging portion(s) formed in the semiconductor module is made as the recess(es). In contrast, in the twenty-fifth embodiment, the projection and the recess of the sixteenth embodiment are reversed such that the case side engaging portion formed in the motor case is made as the recess, and the module side engaging portion formed in the semiconductor module is made as the projection. Similar to the twenty-fifth embodiment, the projection(s) and the recess(es) of each of the sixteenth embodiment to the twenty-second embodiment and the twenty-fourth embodiment may be reversed. Even in such a modification, the advantages of the above corresponding embodiment, can be achieved.

Furthermore, as a modification of the above embodiment(s), an urging member, which urges the back surface (i.e., the heat releasing surface) 1513 of the semiconductor module against the side wall surface of the motor case, may be provided in the above embodiment(s).

As a modification of the above embodiments, the features of any two or more of the above embodiments may be freely combined as long as such a combination is applicable.

Also, in the above embodiments, the semiconductor chip of the semiconductor module is exposed to the back surface 1513 of the encapsulation body, and the back surface 1513 of the semiconductor module is connected to the side wall surface of the heat sink while the dielectric heat releasing sheet 1520 is interposed between the back surface 1513 of the semiconductor module and the side wall surface 605 of the heat sink 601. In a modification of the above embodiments, a metal plate of the semiconductor chip, through which the heat is released from the semiconductor chip, may be exposed at the back surface 1513 of the encapsulation body. Alternatively, the semiconductor module may be formed such that the entire semiconductor chip is covered by the encapsulation body. In any of the above instances, the back surface 1513 of the semiconductor module indirectly or directly contacts the side wall surface of the heat sink, so that the releasing of the heat from the semiconductor chip is promoted.

Furthermore, as another modification of the above embodiment(s), the extending direction of the heat sink may be different from the direction of the motor axis. That is, the side wall surfaces of the heat sink may be tilted relative to the motor axis or may extend in a direction perpendicular to the motor axis. Furthermore, the angle defined between the side wall surface of the heat sink and the wall surface of the motor case (the wall surface, which is opposed to the bottom surface 1516 of the semiconductor module) is not limited to the right angle and may be changed to any other angle other than the right angle.

Furthermore, as another modification of the above embodiment(s), the heat sink may be eliminated. In the present invention, even in the case where the heat sink is not provided, the case side engaging portion of the motor case and the module side engaging portion of the semiconductor module are engaged with each other to position of the semiconductor module in place relative to the motor case.

In the above embodiment(s), the imaginary perpendicular line, which is perpendicular to the planar chip surface of the semiconductor chip, extends generally perpendicular to the motor axis, i.e., the central axis of the shaft of the motor. In another modification of the above embodiment(s), the semiconductor module may be placed such that the imaginary perpendicular line, which is perpendicular to the planar chip surface of the semiconductor chip, is tilted relative to the motor axis or is parallel to the motor axis. Furthermore, the position of each semiconductor module is not limited to that of the above embodiments where the semiconductor module is placed in the motor case in the direction of the motor axis. For instance, each semiconductor module may be placed radially outward of the motor case. The multiple semiconductor modules are provided in the above embodiments. Alternatively, the number of the semiconductor modules may be changed to one.

In the above embodiments, the drive apparatus is used for the EPS system. However, the drive apparatus of the present invention may be implemented in any other system or apparatus, which is other than the EPS system.

As discussed above, the present invention is not limited to the above embodiments, and the above embodiments may be modified within the spirit and scope of the present invention.

Any one or more components of any one of the first to twenty-fifth embodiments may be combined with any one or more components of any one or more of the remaining embodiments. For instance, the special terminal(s) of any one of the first to fourteenth embodiments may be provided to the encapsulation body of any one or more of the fifteenth to twenty-fifth embodiments. The special terminal(s) of any one of the first to fourteenth embodiments may serve as a module side engaging portion(s). Also, the engaging portion(s) of any one of the first to fourteenth embodiments may serve as a case side engaging portion(s).

In the fifteenth to twenty-fifth embodiments, each module side engaging portion is formed integrally in the encapsulation body. Alternatively, the each module side engaging portion may be formed separately from the encapsulation body and then may be joined to or fixed to the encapsulation body. This is also true for each case side engaging portion of any one of the fifteenth to twenty-fifth embodiments.

What is claimed is:

1. A drive apparatus comprising:
    an electric motor that includes:
        a motor case that is configured into a tubular form;
        a stator that is placed radially inward of the motor case and has a plurality of winding wires wound at the stator to form a plurality of phases;

a rotor that is placed radially inward of the stator; and
a shaft that is rotatable integrally with the rotor; and
at least one semiconductor module, each of which includes:
  a semiconductor chip that is adapted to switch an electric current, which flows through each corresponding one of the plurality of winding wires;
  an encapsulation body that covers the semiconductor chip; and
  at least one special terminal that is embedded in the encapsulation body, wherein:
the motor case includes at least one engaging portion that corresponds to the at least one special terminal;
the at least one special terminal projects from the encapsulation body and is engaged with the at least one engaging portion to limit a positional deviation of the semiconductor module relative to the motor case;
the motor case includes a heat releasing portion which projects from a wall surface of the motor case;
the at least one semiconductor module contacts the heat releasing portion;
the encapsulation body of each semiconductor module is configured into a generally parallelepiped form;
six surfaces of the encapsulation body includes:
  back and front surfaces, which are opposed to each other and generally parallel to a chip surface of the semiconductor chip;
  bottom and top surfaces, which are opposed to each other and are generally perpendicular to the back and front surfaces;
  right and left lateral surfaces, which are opposed to each other and are generally perpendicular to the back and front surfaces and the bottom and top surfaces;
the semiconductor module is positioned such that the back surface of the encapsulation body contacts the heat releasing portion;
the at least one engaging portion includes an engaging portion that is formed in a right terminal receiving portion, which projects from the wall surface of the motor case; and
the at least one special terminal includes a special terminal, which projects from the right lateral surface of the encapsulation body and is received in a groove formed in the right terminal receiving portion, so that the special terminal, which projects from the right lateral surface of the encapsulation body, is engaged with the engaging portion formed in the right terminal receiving portion.

2. The drive apparatus according to claim 1, wherein:
the at least one engaging portion is formed in the wall surface of the motor case; and
the at least one special terminal is inserted into at least one groove, which is formed in the wall surface of the motor case, so that the at least one special terminal is engaged with the at least one engaging portion.

3. The drive apparatus according to claim 1, wherein:
the at least one engaging portion includes an engaging portion that is formed in a left terminal receiving portion, which projects from the wall surface of the motor case; and
the at least one special terminal includes a special terminal, which projects from the left lateral surface of the encapsulation body and is received in a groove formed in the left terminal receiving portion, so that the special terminal, which projects from the left lateral surface of the encapsulation body, is engaged with the engaging portion formed in the left terminal receiving portion.

4. The drive apparatus according to claim 1, wherein:
the at least one engaging portion includes an engaging portion that is formed in a front terminal receiving portion, which projects from the wall surface of the motor case; and
the at least one special terminal includes a special terminal, which projects from the front surface of the encapsulation body and is received in a groove formed in the front terminal receiving portion, so that the special terminal, which projects from the front surface of the encapsulation body, is engaged with the engaging portion formed in the front terminal receiving portion.

5. The drive apparatus according to claim 1, wherein:
the at least one engaging portion includes an engaging portion that is formed in a front terminal receiving portion, which projects from the wall surface of the motor case; and
the at least one special terminal includes first and second special terminals, which project from the front surface of the encapsulation body and hold the front terminal receiving portion therebetween, so that the first and second special terminals are engaged with the engaging portion formed in the front terminal receiving portion.

6. The drive apparatus according to claim 1, wherein:
the at least one engaging portion includes:
  an engaging portion, which is formed in a first front terminal receiving portion that projects from the wall surface of the motor case; and
  an engaging portion, which is formed in a second front terminal receiving portion that projects from the wall surface of the motor case;
the at least one special terminal includes first and second special terminals, which project from the front surface of the encapsulation body; and
the first and second special terminals are placed between the first front terminal receiving portion and the second front terminal receiving portion, so that the first and second special terminals are respectively engaged with the engaging portion, which is formed in the first front terminal receiving portion, and the engaging portion, which is formed in the second front terminal receiving portion.

7. The drive apparatus according to claim 1, wherein:
the at least one engaging portion includes an engaging portion, which is formed in the heat releasing portion;
the at least one special terminal includes a special terminal, which projects from the back surface of the encapsulation body and is received in a groove formed in the heat releasing portion, so that the special terminal, which projects from the back surface of the encapsulation body, is engaged with the engaging portion, which is formed in the heat releasing portion.

8. The drive apparatus according to claim 1, wherein:
the at least one special terminal includes a plurality of special terminals, which project from a corresponding one of the six surfaces of the encapsulation body; and
the at least one engaging portion includes a plurality of engaging portions, which correspond to the plurality of special terminals, respectively.

9. The drive apparatus according to claim 1, wherein the at least one special terminal includes at least one L-shaped special terminal, which is configured into an L-shape.

10. The drive apparatus according to claim 1, wherein the at least one special terminal includes at least one T-shaped special terminal, which is configured into a T-shape.

11. The drive apparatus according to claim 1, wherein the at least one special terminal is electrically insulated from the semiconductor chip.

12. The drive apparatus according to claim 1, wherein the at least one special terminal is electrically connected to the semiconductor chip.

13. The drive apparatus according to claim 1, wherein the at least one semiconductor module includes a plurality of semiconductor modules.

14. The drive apparatus according to claim 1, wherein:
each semiconductor module is placed at an axial side portion of the motor case, which is opposite from the rotor in a direction of a central axis of the shaft; and
each semiconductor module is placed upright at the axial side portion of the motor case such that an imaginary perpendicular line, which is perpendicular to the chip surface of the semiconductor chip, is nonparallel to the central axis of the shaft.

15. The drive apparatus according to claim 14, wherein each semiconductor module is placed such that the imaginary perpendicular line, which is perpendicular to the chip surface of the semiconductor chip, is generally perpendicular to the central axis of the shaft.

16. A drive apparatus comprising:
an electric motor that is rotated upon supplying an electric current to the electric motor and includes:
a motor case, which has a tubular body and a partition wall, wherein the partition wall radially inwardly extends from one end part of the tubular body;
a stator that is placed radially inward of the tubular body and has a plurality of winding wires wound at the stator to form a plurality of phases;
a rotor that is placed radially inward of the stator;
a shaft that is rotatable integrally with the rotor; and
at least one case side engaging portion, which is formed in the motor case; and
an electronic circuit that includes at least one semiconductor module, which controls the electric current supplied to the electric motor, wherein:
each semiconductor module includes:
a semiconductor chip that is adapted to switch the electric current, which flows through each corresponding one of the plurality of winding wires;
an encapsulation body that covers the semiconductor chip; and
at least one module side engaging portion that is formed in the encapsulation body and is engaged with the at least one case side engaging portion to position the semiconductor module relative to the motor case;
the motor case includes a heat releasing portion that extends from the partition wall in a direction of a central axis of the shaft;
each semiconductor module has a heat releasing surface, which is formed at the encapsulation body and is opposed to a chip surface of the semiconductor chip; and
the heat releasing surface is engaged with the heat releasing portion by engaging the at least one module side engaging portion with the at least one case side engaging portion.

17. The drive apparatus according to claim 16, wherein the heat releasing surface of the encapsulation body has a largest surface area in comparison to other surfaces of the encapsulation body.

18. The drive apparatus according to claim 16, wherein the encapsulation body of each semiconductor module is configured into a generally parallelepiped form and includes:
a front surface that is generally parallel to the chip surface of the semiconductor chip and is opposed to the heat releasing surface;
top and bottom surfaces that are generally perpendicular to the heat releasing surface and the front surface and are opposed to each other; and
right and left lateral surfaces that are generally perpendicular to the heat releasing surface, the front surface, the top surface and the bottom surface and are opposed to each other.

19. The drive apparatus according to claim 18, wherein the at least one module side engaging portion includes at least one grooved recess, which is recessed in the bottom surface of the encapsulation body and extends from the front surface toward the heat releasing surface of the encapsulation body.

20. The drive apparatus according to claim 18, wherein the at least one module side engaging portion includes at least one grooved recess, which is recessed in the front surface of the encapsulation body and extends from the bottom surface toward the top surface of the encapsulation body.

21. The drive apparatus according to claim 18, wherein:
the at least one module side engaging portion includes at least one recess, which is recessed in the heat releasing surface; and
the at least one case side engaging portion includes at least one projection, which projects from the heat releasing portion of the motor case.

22. The drive apparatus according to claim 18, wherein:
the at least one module side engaging portion includes at least one through hole, which extends through the encapsulation body from the heat releasing surface to the front surface of the encapsulation body; and
the at least one case side engaging portion includes at least one projection, which projects from the heat releasing portion of the motor case.

23. The drive apparatus according to claim 18, wherein:
the at least one module side engaging portion includes a through hole, which extends through the encapsulation body from the heat releasing surface to the front surface; and
the at least one case side engaging portion includes:
a hole, which is formed in the heat releasing portion of the motor case; and
a rod member that is received through the through hole of the semiconductor module and is engaged with the hole of the heat releasing portion to engage the semiconductor module to the heat releasing portion of the motor case.

24. The drive apparatus according to claim 18, wherein the at least one module side engaging portion includes a grooved recess, which is recessed in the front surface of the encapsulation body and extends from the left lateral surface to the right lateral surface of the encapsulation body.

25. The drive apparatus according to claim 16, wherein the at least one module side engaging portion is the encapsulation body of the semiconductor module itself configured into a generally parallelepiped form.

26. The drive apparatus according to claim 16, wherein:
the least one module side engaging portion includes a plurality of module side engaging portions, which are formed in a corresponding surface of the encapsulation body; and
the at least one case side engaging portion includes a plurality of case side engaging portions, which correspond to the plurality of module side engaging portions, respectively.

27. The drive apparatus according to claim 16, wherein:
  each semiconductor module is placed on one axial side of the partition wall of the motor case, which is opposite from the rotor in a direction of a central axis of the shaft; and
  each semiconductor module is placed upright such that an imaginary perpendicular line, which is perpendicular to the chip surface of the semiconductor chip, is nonparallel to the central axis of the shaft.

28. The drive apparatus according to claim 27, wherein:
  each semiconductor module is placed such that the imaginary perpendicular line, which is perpendicular to the chip surface of the semiconductor chip, is generally perpendicular to the central axis of the shaft.

29. The drive apparatus according to claim 16, further comprising an urging member that urges the heat releasing surface of the semiconductor module against the heat releasing portion.

30. A semiconductor module adapted to be installed to an electronic circuit for driving an electric motor that includes a motor case, which has a tubular body and a partition wall radially inwardly extending from one end part of the tubular body, a stator, which is placed radially inward of the tubular body and has a plurality of winding wires wound at the stator to form a plurality of phases, a rotor, which is placed radially inward of the stator, a shaft, which is rotatable integrally with the rotor, and at least one case side engaging portion, which is formed in the motor case, the semiconductor module controlling the electric current supplied to the electric motor and comprising:
  a semiconductor chip that is adapted to switch the electric current, which flows through each corresponding one of the plurality of winding wires;
  an encapsulation body that covers the semiconductor chip; and
  at least one module side engaging portion that is formed in the encapsulation body and is adapted to be engaged with the at least one case side engaging portion to position the semiconductor module relative to the motor case, wherein:
  the motor case includes a heat releasing portion that extends from the partition wall in a direction of a central axis of the shaft;
  a heat releasing surface is formed at the encapsulation body and is opposed to a chip surface of the semiconductor chip; and
  the heat releasing surface is adapted to be engaged with the heat releasing portion of the motor case by engaging the at least one module side engaging portion with the at least one case side engaging portion.

31. The semiconductor module according to claim 30, wherein the heat releasing surface has a largest surface area in comparison to other surfaces of the encapsulation body.

32. The semiconductor module according to claim 30, wherein the encapsulation body is configured into a generally parallelepiped form and includes:
  a front surface that is generally parallel to the chip surface of the semiconductor chip and is opposed to the heat releasing surface;
  top and bottom surfaces that are generally perpendicular to the heat releasing surface and the front surface and are opposed to each other; and
  right and left lateral surfaces that are generally perpendicular to the heat releasing surface, the front surface, the top surface and the bottom surface and are opposed to each other.

33. The semiconductor module according to claim 32, wherein the at least one module side engaging portion includes at least one grooved recess, which is recessed in the bottom surface of the encapsulation body and extends from the front surface toward the heat releasing surface of the encapsulation body.

34. The semiconductor module according to claim 32, wherein the at least one module side engaging portion includes at least one grooved recess, which is recessed in the front surface of the encapsulation body and extends from the bottom surface toward the top surface of the encapsulation body.

35. The semiconductor module according to claim 32, wherein:
  the at least one module side engaging portion includes at least one recess, which is recessed in the heat releasing surface of the encapsulation body; and
  the at least one case side engaging portion includes at least one projection, which projects from the heat releasing portion of the motor case.

36. The semiconductor module according to claim 32, wherein:
  the at least one module side engaging portion includes at least one through hole, which extends through the encapsulation body from the heat releasing surface to the front surface of the encapsulation body; and
  the at least one case side engaging portion includes at least one projection, which projects from the heat releasing portion of the motor case.

37. The semiconductor module according to claim 32, wherein:
  the at least one module side engaging portion includes a through hole, which extends through the encapsulation body from the heat releasing surface to the front surface; and
  the at least one case side engaging portion includes:
    a hole, which is formed in the heat releasing portion of the motor case; and
    a rod member that is received through the through hole of the encapsulation body and is engaged with the hole of the heat releasing portion to engage the semiconductor module to the heat releasing portion of the motor case.

38. The semiconductor module according to claim 32, wherein the at least one module side engaging portion includes a grooved recess, which is recessed in the front surface of the encapsulation body and extends from the left lateral surface to the right lateral surface of the encapsulation body.

39. The semiconductor module according to claim 30, wherein:
  the least one module side engaging portion includes a plurality of module side engaging portions, which are formed in a corresponding surface of the encapsulation body; and
  the at least one case side engaging portion includes a plurality of case side engaging portions, which correspond to the plurality of module side engaging portions, respectively.

40. The semiconductor module according to claim 30, wherein:
  the semiconductor module is adapted to be placed on one axial side of the partition wall of the motor case, which is opposite from the rotor in a direction of a central axis of the shaft; and
  the semiconductor module is adapted to be placed upright such that an imaginary perpendicular line, which is perpendicular to the chip surface of the semiconductor chip, is nonparallel to the central axis of the shaft.

41. The semiconductor module according to claim 40, wherein:
the semiconductor module is adapted to be placed such that the imaginary perpendicular line, which is perpendicular to the chip surface of the semiconductor chip, is generally perpendicular to the central axis of the shaft.

42. The semiconductor module according to claim 30, further comprising an urging member that is adapted to urge the heat releasing surface of the semiconductor module against the heat releasing portion.

43. A drive apparatus comprising:
an electric motor that includes:
   a motor case that is configured into a tubular form;
   a stator that is placed radially inward of the motor case and has a plurality of winding wires wound at the stator to form a plurality of phases;
   a rotor that is placed radially inward of the stator; and
   a shaft that is rotatable integrally with the rotor; and
at least one semiconductor module, each of which includes:
   a semiconductor chip that is adapted to switch an electric current, which flows through each corresponding one of the plurality of winding wires;
   an encapsulation body that covers the semiconductor chip; and
   at least one special terminal that is embedded in the encapsulation body, wherein:
the motor case includes at least one engaging portion that corresponds to the at least one special terminal;
the at least one special terminal projects from the encapsulation body and is engaged with the at least one engaging portion to limit a positional deviation of the semiconductor module relative to the motor case;
the motor case includes a heat releasing portion, which projects from a wall surface of the motor case;
the at least one semiconductor module contacts the heat releasing portion;
the encapsulation body of each semiconductor module is configured into a generally parallelepiped form;
six surfaces of the encapsulation body includes:
   back and front surfaces, which are opposed to each other and generally parallel to a chip surface of the semiconductor chip;
   bottom and top surfaces, which are opposed to each other and are generally perpendicular to the back and front surfaces;
   right and left lateral surfaces, which are opposed to each other and are generally perpendicular to the back and front surfaces and the bottom and top surfaces;
the semiconductor module is positioned such that the back surface of the encapsulation body contacts the heat releasing portion;
the at least one engaging portion includes an engaging portion that is formed in a left terminal receiving portion, which projects from the wall surface of the motor case; and
the at least one special terminal includes a special terminal, which projects from the left lateral surface of the encapsulation body and is received in a groove formed in the left terminal receiving portion, so that the special terminal, which projects from the left lateral surface of the encapsulation body, is engaged with the engaging portion formed in the left terminal receiving portion.

44. A drive apparatus comprising:
an electric motor that includes:
   a motor case that is configured into a tubular form;
   a stator that is placed radially inward of the motor case and has a plurality of winding wires wound at the stator to form a plurality of phases;
   a rotor that is placed radially inward of the stator; and
   a shaft that is rotatable integrally with the rotor; and
at least one semiconductor module, each of which includes:
   a semiconductor chip that is adapted to switch an electric current, which flows through each corresponding one of the plurality of winding wires;
   an encapsulation body that covers the semiconductor chip; and
   at least one special terminal that is embedded in the encapsulation body, wherein:
the motor case includes at least one engaging portion that corresponds to the at least one special terminal;
the at least one special terminal projects from the encapsulation body and is engaged with the at least one engaging portion to limit a positional deviation of the semiconductor module relative to the motor case;
the motor case includes a heat releasing portion, which projects from a wall surface of the motor case;
the at least one semiconductor module contacts the heat releasing portion;
the encapsulation body of each semiconductor module is configured into a generally parallelepiped form;
six surfaces of the encapsulation body includes:
   back and front surfaces, which are opposed to each other and generally parallel to a chip surface of the semiconductor chip;
   bottom and top surfaces, which are opposed to each other and are generally perpendicular to the back and front surfaces;
   right and left lateral surfaces, which are opposed to each other and are generally perpendicular to the back and front surfaces and the bottom and top surfaces;
the semiconductor module is positioned such that the back surface of the encapsulation body contacts the heat releasing portion;
the at least one engaging portion includes an engaging portion that is formed in a front terminal receiving portion, which projects from the wall surface of the motor case; and
the at least one special terminal includes a special terminal, which projects from the front surface of the encapsulation body and is received in a groove formed in the front terminal receiving portion, so that the special terminal, which projects from the front surface of the encapsulation body, is engaged with the engaging portion formed in the front terminal receiving portion.

45. A drive apparatus comprising:
an electric motor that includes:
   a motor case that is configured into a tubular form;
   a stator that is placed radially inward of the motor case and has a plurality of winding wires wound at the stator to form a plurality of phases;
   a rotor that is placed radially inward of the stator; and
   a shaft that is rotatable integrally with the rotor; and
at least one semiconductor module, each of which includes:
   a semiconductor chip that is adapted to switch an electric current, which flows through each corresponding one of the plurality of winding wires;

an encapsulation body that covers the semiconductor chip; and
at least one special terminal that is embedded in the encapsulation body, wherein:
the motor case includes at least one engaging portion that corresponds to the at least one special terminal;
the at least one special terminal projects from the encapsulation body and is engaged with the at least one engaging portion to limit a positional deviation of the semiconductor module relative to the motor case;
the motor case includes a heat releasing portion, which projects from a wall surface of the motor case;
the at least one semiconductor module contacts the heat releasing portion;
the encapsulation body of each semiconductor module is configured into a generally parallelepiped form;
six surfaces of the encapsulation body includes:
 back and front surfaces, which are opposed to each other and generally parallel to a chip surface of the semiconductor chip;
 bottom and top surfaces, which are opposed to each other and are generally perpendicular to the back and front surfaces;
 right and left lateral surfaces, which are opposed to each other and are generally perpendicular to the back and front surfaces and the bottom and top surfaces;
the semiconductor module is positioned such that the back surface of the encapsulation body contacts the heat releasing portion;
the at least one engaging portion includes an engaging portion that is formed in a front terminal receiving portion, which projects from the wall surface of the motor case; and
the at least one special terminal includes first and second special terminals, which project from the front surface of the encapsulation body and hold the front terminal receiving portion therebetween, so that the first and second special terminals are engaged with the engaging portion formed in the front terminal receiving portion.

46. A drive apparatus comprising:
an electric motor that includes:
 a motor case that is configured into a tubular form;
 a stator that is placed radially inward of the motor case and has a plurality of winding wires wound at the stator to form a plurality of phases;
 a rotor that is placed radially inward of the stator; and
 a shaft that is rotatable integrally with the rotor; and
at least one semiconductor module, each of which includes:
 a semiconductor chip that is adapted to switch an electric current, which flows through each corresponding one of the plurality of winding wires;
 an encapsulation body that covers the semiconductor chip; and
 at least one special terminal that is embedded in the encapsulation body, wherein:
the motor case includes at least one engaging portion that corresponds to the at least one special terminal;
the at least one special terminal projects from the encapsulation body and is engaged with the at least one engaging portion to limit a positional deviation of the semiconductor module relative to the motor case;
the motor case includes a heat releasing portion, which projects from a wall surface of the motor case;
the at least one semiconductor module contacts the heat releasing portion;
the encapsulation body of each semiconductor module is configured into a generally parallelepiped form;
six surfaces of the encapsulation body includes:
 back and front surfaces, which are opposed to each other and generally parallel to a chip surface of the semiconductor chip;
 bottom and top surfaces, which are opposed to each other and are generally perpendicular to the back and front surfaces;
 right and left lateral surfaces, which are opposed to each other and are generally perpendicular to the back and front surfaces and the bottom and top surfaces;
the semiconductor module is positioned such that the back surface of the encapsulation body contacts the heat releasing portion;
the at least one engaging portion includes:
 an engaging portion, which is formed in a first front terminal receiving portion that projects from the wall surface of the motor case; and
 an engaging portion, which is formed in a second front terminal receiving portion that projects from the wall surface of the motor case;
the at least one special terminal includes first and second special terminals, which project from the front surface of the encapsulation body; and
the first and second special terminals are placed between the first front terminal receiving portion and the second front terminal receiving portion, so that the first and second special terminals are respectively engaged with the engaging portion, which is formed in the first front terminal receiving portion, and the engaging portion, which is formed in the second front terminal receiving portion.

47. A drive apparatus comprising:
an electric motor that is rotated upon supplying an electric current to the electric motor and includes:
 a motor case, which has a tubular body and a partition wall, wherein the partition wall radially inwardly extends from one end part of the tubular body;
 a stator that is placed radially inward of the tubular body and has a plurality of winding wires wound at the stator to form a plurality of phases;
 a rotor that is placed radially inward of the stator;
 a shaft that is rotatable integrally with the rotor; and
 at least one case side engaging portion, which is formed in the motor case; and
an electronic circuit that includes at least one semiconductor module, which controls the electric current supplied to the electric motor, wherein:
each semiconductor module includes:
 a semiconductor chip that is adapted to switch the electric current, which flows through each corresponding one of the plurality of winding wires;
 an encapsulation body that covers the semiconductor chip; and
 at least one module side engaging portion that is formed in the encapsulation body and is engaged with the at least one case side engaging portion to position the semiconductor module relative to the motor case;
the encapsulation body of each semiconductor module is configured into a generally parallelepiped form and includes:
 a front surface that is generally parallel to the chip surface of the semiconductor chip and is opposed to the heat releasing surface;

top and bottom surfaces that are generally perpendicular to the heat releasing surface and the front surface and are opposed to each other; and right and left lateral surfaces that are generally perpendicular to the heat releasing surface, the front surface, the top surface and the bottom surface and are opposed to each other;

the at least one module side engaging portion includes at least one grooved recess, which is recessed in the bottom surface of the encapsulation body and extends from the front surface toward the heat releasing surface of the encapsulation body.

48. A drive apparatus comprising:

an electric motor that is rotated upon supplying an electric current to the electric motor and includes:
- a motor case, which has a tubular body and a partition wall, wherein the partition wall radially inwardly extends from one end part of the tubular body;
- a stator that is placed radially inward of the tubular body and has a plurality of winding wires wound at the stator to form a plurality of phases;
- a rotor that is placed radially inward of the stator;
- a shaft that is rotatable integrally with the rotor; and
- at least one case side engaging portion, which is formed in the motor case; and an electronic circuit that includes at least one semiconductor module, which controls the electric current supplied to the electric motor, wherein:

each semiconductor module includes:
- a semiconductor chip that is adapted to switch the electric current, which flows through each corresponding one of the plurality of winding wires;
- an encapsulation body that covers the semiconductor chip; and
- at least one module side engaging portion that is formed in the encapsulation body and is engaged with the at least one case side engaging portion to position the semiconductor module relative to the motor case;

the encapsulation body of each semiconductor module is configured into a generally parallelepiped form and includes:
- a front surface that is generally parallel to the chip surface of the semiconductor chip and is opposed to the heat releasing surface;
- top and bottom surfaces that are generally perpendicular to the heat releasing surface and the front surface and are opposed to each other; and
- right and left lateral surfaces that are generally perpendicular to the heat releasing surface, the front surface, the top surface and the bottom surface and are opposed to each other;

the at least one module side engaging portion includes at least one grooved recess, which is recessed in the front surface of the encapsulation body and extends from the bottom surface toward the top surface of the encapsulation body.

49. A drive apparatus comprising:

an electric motor that is rotated upon supplying an electric current to the electric motor and includes:
- a motor case, which has a tubular body and a partition wall, wherein the partition wall radially inwardly extends from one end part of the tubular body;
- a stator that is placed radially inward of the tubular body and has a plurality of winding wires wound at the stator to form a plurality of phases;
- a rotor that is placed radially inward of the stator;
- a shaft that is rotatable integrally with the rotor; and
- at least one case side engaging portion, which is formed in the motor case; and an electronic circuit that includes at least one semiconductor module, which controls the electric current supplied to the electric motor, wherein:

each semiconductor module includes:
- a semiconductor chip that is adapted to switch the electric current, which flows through each corresponding one of the plurality of winding wires;
- an encapsulation body that covers the semiconductor chip; and
- at least one module side engaging portion that is formed in the encapsulation body and is engaged with the at least one case side engaging portion to position the semiconductor module relative to the motor case;

the encapsulation body of each semiconductor module is configured into a generally parallelepiped form and includes:
- a front surface that is generally parallel to the chip surface of the semiconductor chip and is opposed to the heat releasing surface;
- top and bottom surfaces that are generally perpendicular to the heat releasing surface and the front surface and are opposed to each other; and
- right and left lateral surfaces that are generally perpendicular to the heat releasing surface, the front surface, the top surface and the bottom surface and are opposed to each other; and the at least one module side engaging portion includes a grooved recess, which is recessed in the front surface of the encapsulation body and extends from the left lateral surface to the right lateral surface of the encapsulation body.

50. A semiconductor module adapted to be installed to an electronic circuit for driving an electric motor that includes a motor case, which has a tubular body and a partition wall radially inwardly extending from one end part of the tubular body, a stator, which is placed radially inward of the tubular body and has a plurality of winding wires wound at the stator to form a plurality of phases, a rotor, which is placed radially inward of the stator, a shaft, which is rotatable integrally with the rotor, and at least one case side engaging portion, which is formed in the motor case, the semiconductor module controlling the electric current supplied to the electric motor and comprising:

- a semiconductor chip that is adapted to switch the electric current, which flows through each corresponding one of the plurality of winding wires;
- an encapsulation body that covers the semiconductor chip; and
- at least one module side engaging portion that is formed in the encapsulation body and is adapted to be engaged with the at least one case side engaging portion to position the semiconductor module relative to the motor case, wherein:

the encapsulation body is configured into a generally parallelepiped form and includes:
- a front surface that is generally parallel to the chip surface of the semiconductor chip and is opposed to the heat releasing surface;
- top and bottom surfaces that are generally perpendicular to the heat releasing surface and the front surface and are opposed to each other; and
- right and left lateral surfaces that are generally perpendicular to the heat releasing surface, the front surface, the top surface and the bottom surface and are opposed to each other; and the at least one module side engaging portion includes at least one grooved recess, which is recessed in the front surface of the encapsulation body and extends from the bottom surface toward the top surface of the encapsulation body.

51. A semiconductor module adapted to be installed to an electronic circuit for driving an electric motor that includes a motor case, which has a tubular body and a partition wall radially inwardly extending from one end part of the tubular body, a stator, which is placed radially inward of the tubular body and has a plurality of winding wires wound at the stator to form a plurality of phases, a rotor, which is placed radially inward of the stator, a shaft, which is rotatable integrally with the rotor, and at least one case side engaging portion, which is formed in the motor case, the semiconductor module controlling the electric current supplied to the electric motor and comprising:

a semiconductor chip that is adapted to switch the electric current, which flows through each corresponding one of the plurality of winding wires;

an encapsulation body that covers the semiconductor chip; and at least one module side engaging portion that is formed in the encapsulation body and is adapted to be engaged with the at least one case side engaging portion to position the semiconductor module relative to the motor case, wherein:

the encapsulation body is configured into a generally parallelepiped form and includes:

a front surface that is generally parallel to the chip surface of the semiconductor chip and is opposed to the heat releasing surface;

top and bottom surfaces that are generally perpendicular to the heat releasing surface and the front surface and are opposed to each other; and right and left lateral surfaces that are generally perpendicular to the heat releasing surface, the front surface, the top surface and the bottom surface and are opposed to each other; and the at least one module side engaging portion includes a grooved recess, which is recessed in the front surface of the encapsulation body and extends from the left lateral surface to the right lateral surface of the encapsulation body.

\* \* \* \* \*